US012610671B2

(12) United States Patent
Yang et al.

(10) Patent No.: US 12,610,671 B2
(45) Date of Patent: Apr. 21, 2026

(54) PIXEL OPTICAL STRUCTURES FOR DISPLAY OPTICAL EFFICIENCY

(71) Applicant: Apple Inc., Cupertino, CA (US)

(72) Inventors: Young Cheol Yang, Sunnyvale, CA (US); Young Seok Kim, San Jose, CA (US); Aaron L Holsteen, Centennial, CO (US); Cheng Cheng, Cupertino, CA (US); Chin Wei Hsu, Hsinchu (TW); Hsin I Lu, Cupertino, CA (US); Ileana G. Rau, Cupertino, CA (US); Jaein Choi, Sunnyvale, CA (US); James M Perkins, Mountain View, CA (US); James P Ibbetson, Goleta, CA (US); Joy M Johnson, San Francisco, CA (US); Jui-Chih Liao, Hsinchu (TW); Steven E Molesa, San Jose, CA (US); Sunggu Kang, San Jose, CA (US); Yang Deng, San Jose, CA (US); Zhibing Ge, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 535 days.

(21) Appl. No.: 18/161,764

(22) Filed: Jan. 30, 2023

(65) Prior Publication Data

US 2023/0307590 A1     Sep. 28, 2023

Related U.S. Application Data

(60) Provisional application No. 63/322,306, filed on Mar. 22, 2022, provisional application No. 63/322,309, filed on Mar. 22, 2022.

(51) Int. Cl.
*H10H 20/855* (2025.01)
*H10H 20/814* (2025.01)
(Continued)

(52) U.S. Cl.
CPC ........ *H10H 20/855* (2025.01); *H10H 20/814* (2025.01); *H10H 20/8514* (2025.01); *H10W 90/00* (2026.01)

(58) Field of Classification Search
CPC . H10H 20/855; H10H 20/882; H01L 25/0753
(Continued)

(56) References Cited

U.S. PATENT DOCUMENTS

| 8,576,486 B2 | 11/2013 | Hayashibe et al. |
| 10,356,858 B2 | 7/2019 | Wu et al. |
| | (Continued) | |

FOREIGN PATENT DOCUMENTS

| CN | 111051974 A | 4/2020 |
| CN | 111164780 A | 5/2020 |
| | (Continued) | |

OTHER PUBLICATIONS

Tolga Aytug et al., Graded-Refractive-Index Glass-based Antireflective Coatings: Broadband/Omnidirectional Light Harvesting and Self-Cleaning Characteristics, Journal of Materials Chemistry C, Apr. 23, 2015, pp. 1-37, Issue 21.
(Continued)

*Primary Examiner* — Eliseo Ramos Feliciano
*Assistant Examiner* — Mikka Liu
(74) *Attorney, Agent, or Firm* — Treyz Law Group, P.C.; Joseph F. Guihan; Jinie M. Guihan

(57) ABSTRACT

An electronic device may have a display with an array of inorganic light-emitting diodes. The array of inorganic light-emitting diodes may be overlapped by a polarizer layer such as a circular polarizer. Alternatively, the display may be a polarizer-free display without any polarizer layer over the array of inorganic light-emitting diodes. Each inorganic light-emitting diode may be surrounded by a diffuser that redirects edge-emissions towards a viewer. A top diffuser, a
(Continued)

color filter layer, a microlens, and/or a microlens with color filtering and/or diffusive properties may also optionally overlap each inorganic light-emitting diode. The inorganic light-emitting diodes may have reflective sidewalls to mitigate edge-emissions. In this type of arrangement, the array of inorganic light-emitting diodes may be coplanar with one or more opaque masking layers. To mitigate reflections, the display may include two opaque masking layers having differing properties or a single phase separated opaque masking layer.

20 Claims, 52 Drawing Sheets

(51) Int. Cl.
  *H10H 20/851* (2025.01)
  *H10W 90/00* (2026.01)
(58) Field of Classification Search
  USPC ........................................................ 257/79
  See application file for complete search history.

(56) References Cited

U.S. PATENT DOCUMENTS

| | | | |
|---|---|---|---|
| 10,664,676 | B2 | 5/2020 | Mackey et al. |
| 11,137,641 | B2 | 10/2021 | Cok et al. |
| 2005/0276566 | A1 | 12/2005 | Iimura |
| 2016/0322427 | A1 | 11/2016 | Cheon et al. |
| 2016/0379557 | A1 | 12/2016 | de Jong et al. |
| 2017/0133818 | A1 | 5/2017 | Cok |
| 2017/0309798 | A1 | 10/2017 | Bonar et al. |
| 2018/0036997 | A1* | 2/2018 | Shimizu .................... F21S 2/00 |
| 2019/0081281 | A1 | 3/2019 | Chesterman et al. |
| 2019/0265548 | A1 | 8/2019 | Liu et al. |
| 2020/0119236 | A1* | 4/2020 | Yang .................... H10H 20/855 |
| 2021/0364880 | A1 | 11/2021 | Tan et al. |
| 2021/0391513 | A1 | 12/2021 | Choi et al. |
| 2023/0099140 | A1* | 3/2023 | Zhong ............... G02F 1/133514 |
| | | | 349/56 |
| 2023/0148430 | A1* | 5/2023 | Kim ...................... H10H 29/142 |
| | | | 257/89 |
| 2023/0178583 | A1* | 6/2023 | Lee ......................... H10H 20/84 |
| | | | 257/89 |

FOREIGN PATENT DOCUMENTS

| | | | |
|---|---|---|---|
| KR | 20180035491 | A | 4/2018 |
| KR | 20210047103 | A | 4/2021 |
| WO | 2008025909 | A1 | 3/2008 |

OTHER PUBLICATIONS

The MicroLED Handbook, MicroLED display technology in 2021 and beyond, https://www.midwich.com/news-and-events/blogs/microled/, Mar. 31, 2021, pp. 1-5, Midwich Limited, United Kingdom.

Michael Jay Minot, Single-layer, gradient refractive index antireflection films effective from 0.35 to 2.5μ, Jun. 1, 1976, pp. 515-519, vol. 66, No. 6, Optical Society of America.

\* cited by examiner

14

60

22

68

Y

Z          X

PIXEL OPTICAL STRUCTURES FOR DISPLAY OPTICAL EFFICIENCY

This application claims the benefit of provisional patent application No. 63/322,306, filed Mar. 22, 2022, and provisional patent application No. 63/322,309, filed Mar. 22, 2022, which are hereby incorporated by reference herein in their entireties.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels or a liquid crystal display (LCD) based on liquid crystal display pixels. If care is not taken, a display may have a lower than desired resolution, contrast, or efficiency, or may suffer from other artifacts.

SUMMARY

An electronic device may have a display such as a light-emitting diode display. The display may have an array of inorganic light-emitting diodes. The array of inorganic light-emitting diodes may be overlapped by a polarizer layer such as a circular polarizer. Alternatively, the display may be a polarizer-free display without any polarizer layer over the array of inorganic light-emitting diodes.

Each inorganic light-emitting diode may be surrounded by a diffuser that redirects edge-emissions towards a viewer. The diffuser may be patterned out except the area around the inorganic light-emitting diode for higher transmission for optical sensors under display or may be formed as a blanket layer. Top diffusers may also be patterned over the inorganic light-emitting diodes or a top diffuser may be formed as a blanket layer over the array of inorganic light-emitting diodes. A color filter layer, a microlens, and/or a microlens with color filtering and/or diffusive properties may also optionally overlap each inorganic light-emitting diode.

The inorganic light-emitting diodes may have reflective sidewalls to mitigate edge-emissions. In this type of arrangement, the array of inorganic light-emitting diodes may be coplanar with one or more opaque masking layers.

To mitigate reflections, two opaque masking layers having differing properties (e.g., a different transmission and a different refractive index) may be included in the display. Alternatively, a single phase separated opaque masking layer may be used. The phase separated opaque masking layer may have a refractive index gradient along its depth, with a minimum refractive index at an upper surface.

The light-emitting diode display may overlap an optical sensor. An opaque masking layer in the display may include openings that do not overlap any light-emitting diodes to allow additional ambient light to pass through the display to the optical sensor.

DETAILED DESCRIPTION

Figure 1:
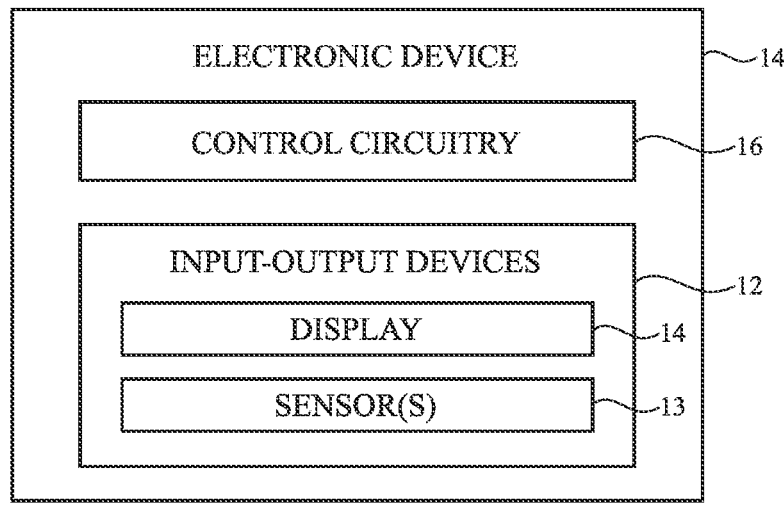
FIG. 1 is a schematic diagram of an illustrative electronic device having a display in accordance with various embodiments.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors (cameras), fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be an organic light-emitting diode display, a display formed from an array of discrete light-emitting diodes (microLEDs) each formed from a crystalline semiconductor die, a liquid crystal display, or any other suitable type of display. Device configurations in which display 14 includes microLEDs are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
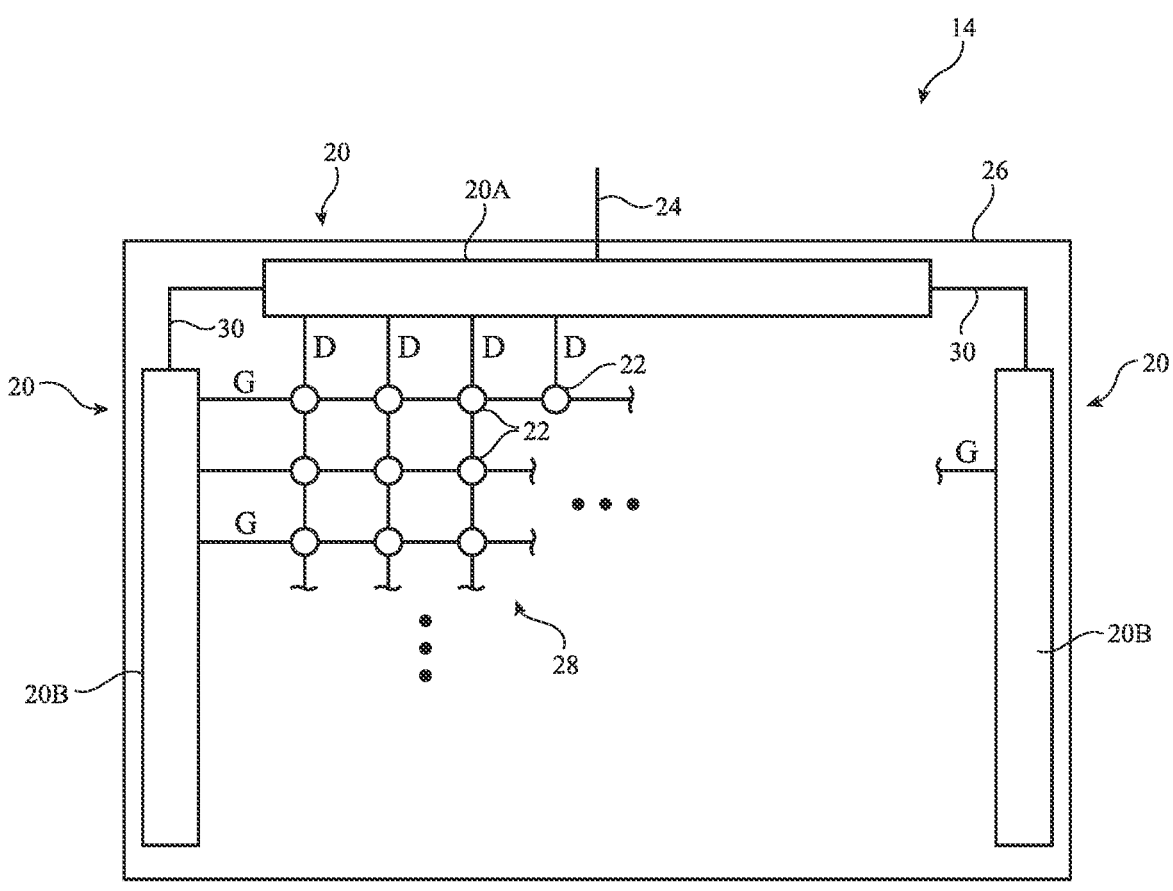
FIG. 2 is a schematic diagram of an illustrative display in accordance with various embodiments.

FIG. 2 is a diagram of an illustrative display. The display of FIG. 2 is an active matrix display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 (e.g., microLEDs) in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels.

Display driver circuitry 20 may be used to control the operation of pixels 22. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
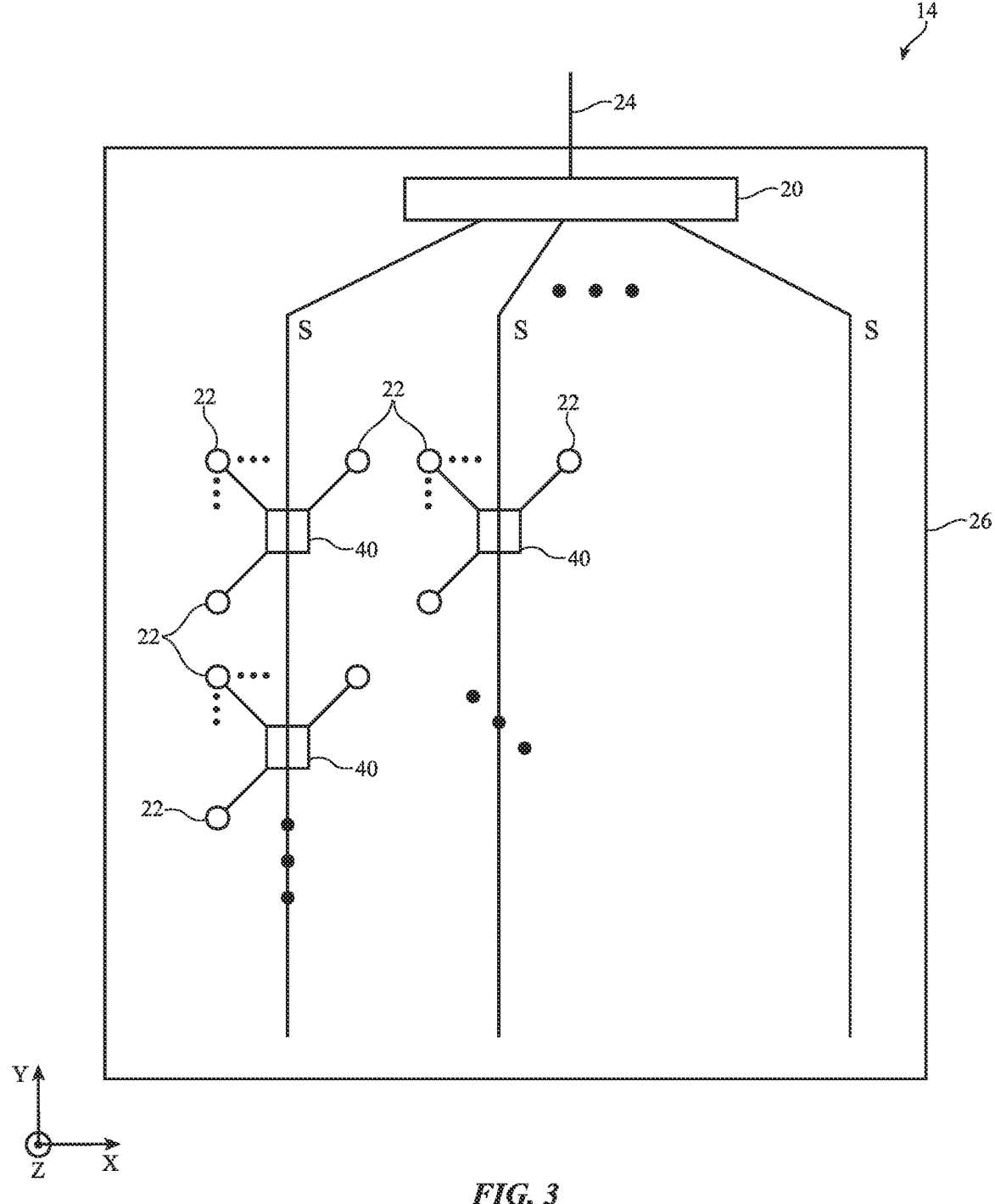
FIG. 3 is a schematic diagram of an illustrative display with pixel control circuits in accordance with various embodiments.

The active matrix addressing scheme of FIG. 2 is merely illustrative. If desired, display 14 may instead use pixel control circuits that address local passive matrices of pixels. An example of this type is shown in FIG. 3. As shown in FIG. 3, display 14 again may include layers such as substrate layer 26. Layers such as substrate 26 may be formed from layers of material such as glass layers, polymer layers, composite films that include polymer and inorganic materials, metallic foils, semiconductors such as silicon or other semiconductor materials, layers of material such as sapphire (e.g., crystalline transparent layers, ceramics, etc.), or other material. Substrate 26 may optionally be transparent (e.g., having a transparency greater than 80%, greater than 85%, greater than 90%, greater than 95%, greater than 98%, greater than 99%, etc.). Substrate 26 may be planar or may have other shapes (e.g., concave shapes, convex shapes, shapes with planar and curved surface regions, etc.). The outline of substrate 26 (e.g., when viewed from above along the Z-direction) may be circular, oval, rectangular, square, may have a combination of straight and curved edges, or may have other suitable shapes. As shown in the rectangular substrate example of FIG. 3, substrate 26 may have left and right vertical edges and upper and lower horizontal edges.

Display 14 may have an array of pixels 22 for displaying images for a user. Sets of one or more pixels 22 in FIG. 3 may be controlled using respective pixel control circuits 40 (sometimes referred to as driving circuits 40 or microdrivers 40). Pixel control circuits 40 may be formed using integrated circuits (e.g., silicon integrated circuits) and/or thin-film transistor circuitry on substrate 26. The thin-film transistor circuitry may include thin-film transistors formed from silicon (e.g., polysilicon thin-film transistors or amorphous silicon transistors) and/or may include thin-film transistors based on semiconducting oxides (e.g., indium gallium zinc oxide transistors or other semiconducting oxide thin-film transistors). Semiconducting oxide transistors such as indium gallium zinc oxide transistors may exhibit low leakage currents and may therefore be advantageous in configurations for display 14 where it is desirable to lower power consumption (e.g., by lowering the refresh rate for the pixels of the display). Configurations for display 14 in which pixel control circuits 40 are each formed from a silicon integrated circuit and a set of thin-film semiconducting oxide transistors may be used if desired.

Pixels 22 may be organized in an array (e.g., an array having rows and columns). Pixel control circuits 40 may be organized in an associated array (e.g., an array having rows and columns). As shown in FIG. 3, pixel control circuits 40 may be interspersed among the array of pixels 22. Pixels 22 and pixel control circuits 40 may be organized in arrays with rectangular outlines or may have outlines of other suitable shapes. There may be any suitable number of rows and columns in each array (e.g., ten or more, one hundred or more, or one thousand or more).

Each pixel 22 may be formed from a light-emitting component such as a light-emitting diode. If desired, each pixel may contain a pair of light-emitting diodes or other suitable number of light-emitting diodes for redundancy. In this type of configuration, the pair of light-emitting diodes in each pixel can be driven in parallel (as an example). In the event that one of the light-emitting diodes fails, the other light-emitting diode will still produce light. Alternatively or in addition, multiple pixel control circuits may be configured to control each pixel. In the event that one of the pixel control circuit fails, the other pixel control circuit will still control the pixel.

Display driver circuitry such as display driver circuitry 20 may be coupled to conductive paths such as metal traces on substrate 26 using solder or conductive adhesive. Display driver circuitry 20 may contain communications circuitry for communicating with system control circuitry over path 24. Path 24 may be formed from traces on a flexible printed circuit or other cable or may be formed using other signal path structures in device 10. The control circuitry may be located on a main logic board in an electronic device in which display 14 is being used. During operation, the control circuitry on the logic board (e.g., control circuitry 16 of FIG. 1) may supply circuitry such as display driver circuitry 20 with information on images to be displayed on display 14. To display the images on display pixels 22, display driver circuitry 20 may supply corresponding image data, control signals, and/or power supply signals to signal lines S. The signal lines provide corresponding image data, control signals, and power to the pixel control circuits 40. Based on the received power, image data, and control signals, the pixel control circuits 40 direct a respective subset of pixels 22 to generate light at desired intensity levels.

Signal lines S may carry analog and/or digital control signals (e.g., scan signals, emission transistor control signals, clock signals, digital control data, power supply signals, etc.). In some cases, a signal line may be coupled to a respective column of pixel control circuits 40. In some cases, a signal line may be coupled to a respective row of pixel control circuits 40. Each pixel control circuit 40 may be coupled to one or more signal lines. Circuitry 20 may be formed on the upper edge of display 14 (as in FIG. 3), on the lower edge of display 14, on the upper and left edges of display 14, on the upper, left, and right edges of display, or any other desired location(s) within display 14.

Display control circuitry such as circuitry 20 may be implemented using one or more integrated circuits (e.g., display driver integrated circuits such as timing controller integrated circuits and associated source driver circuits and/or gate driver circuits) or may be implemented using thin-film transistor circuitry implemented on substrate 26.

Pixels 22 may be organic light-emitting diode pixels or liquid crystal display pixels. Alternatively, pixels 22 in FIG. 3 may be formed from discrete inorganic light-emitting diodes (sometimes referred to as microLEDs). Pixels 22 may include light-emitting diodes of different colors (e.g., red, green, blue). Corresponding signal lines may be used to carry red, green, and blue data. Pixel arrangements of other colors may be used, if desired (e.g., four color arrangements, arrangements that include white pixels, three-pixel configurations with pixels other than red, green, and blue pixels, etc.). To produce different colors, the light-emitting diodes of pixels 22 may be constructed from different materials systems (e.g., AlGaAs for red diodes, GaN multiple quantum well diodes with different quantum well configurations for green and blue diodes, respectively), may be formed using different phosphorescent materials or different quantum dot materials to produce red, blue, and/or green luminescence, or may be formed using other techniques or combinations of these techniques. The light-emitting diodes of pixels 22 may radiate upwards (i.e., pixels 22 may use a top emission design) or may radiate downwards through substrate 26 (i.e., pixels 22 may use a bottom emission design). The light-emitting diodes may have thicknesses between 0.5 and 10 microns and may have lateral dimensions between 2 microns and 100 microns (as examples). Light-emitting diodes with other thicknesses (e.g., below 2 microns, above 2 microns, etc.) and that have other lateral dimensions (e.g., below 10 microns, below 20 microns, above 3 microns, above 15 microns, etc.) may also be used, if desired.

If desired, digital control signals can be provided to circuits 40 (over signal lines S), which may then produce corresponding analog light-emitting drive signals based on the digital control signals. During operation of display 14, each pixel control circuit 40 may supply output signals to a corresponding set of pixels 22 based on the control signals received by that pixel control circuit from display driver circuitry 20.

Figure 4:
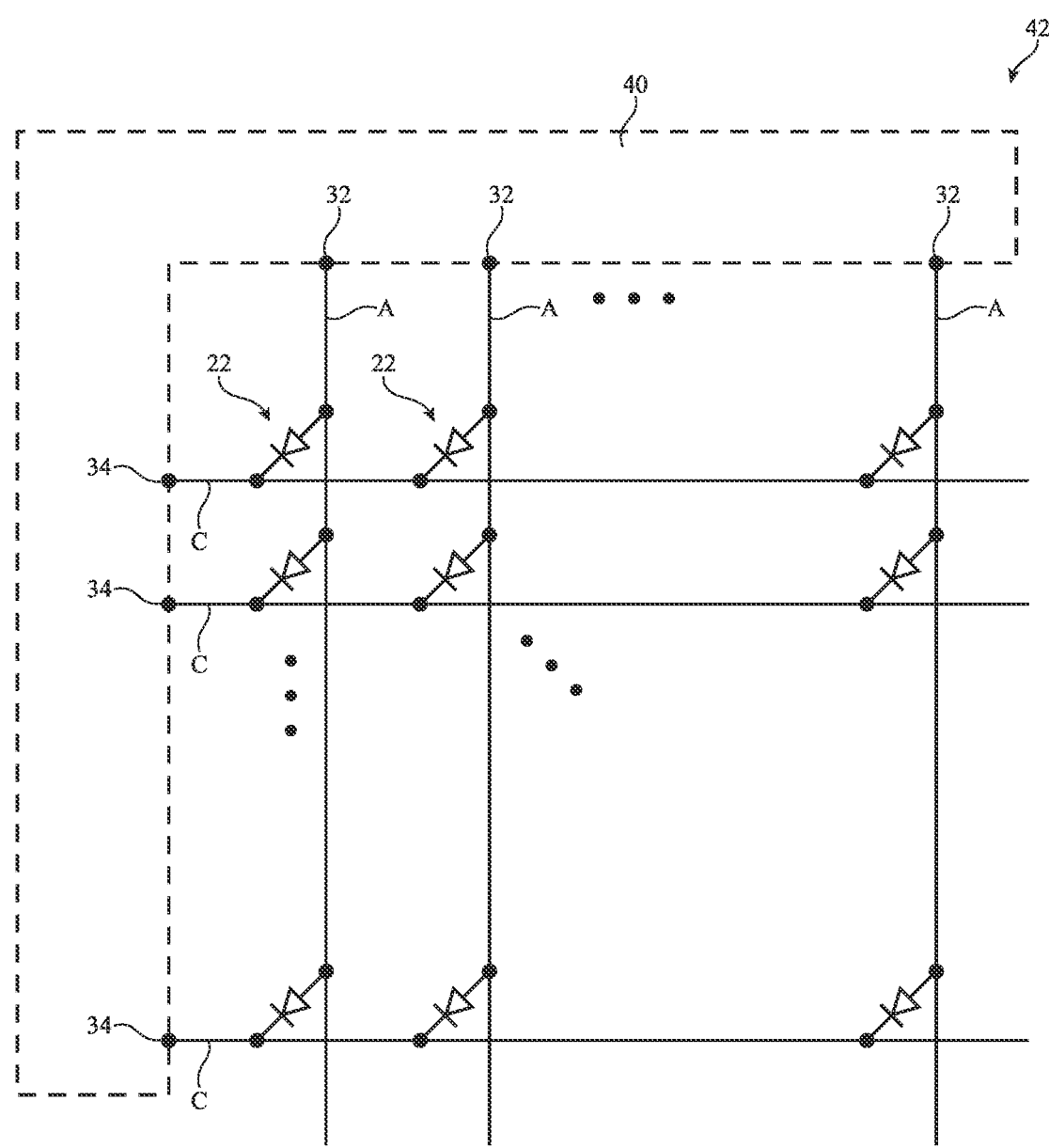
FIG. 4 is a schematic diagram of an illustrative passive matrix of light-emitting diodes that is controlled by a pixel control circuit in accordance with various embodiments.

As one example, each pixel control circuit 40 may control a respective local passive matrix 42 of LED pixels 22. FIG. 4 is a schematic diagram of a local passive matrix 42 of LED pixels 22. As shown in FIG. 4, the anode of each LED 22 is coupled to a respective anode contact line A (sometimes referred to as anode contact A or anode line A). The LEDs 22 of each column in the passive matrix are connected to a common anode contact A. The cathode of each LED 22 is coupled to a respective cathode contact line C (sometimes referred to as cathode contact C or cathode line C). The LEDs 22 of each row in the passive matrix are connected to a common cathode contact C.

Pixel control circuit 40 may control the current and voltage provided to each anode line A. The pixel control circuit 40 may also control the voltage provided to each cathode contact line C. In this way, pixel control circuit 40 controls the current through each light-emitting diode 22, which controls the intensity of light emitted by each light-emitting diode. During operation of the passive matrix, pixel control circuit 40 may scan the pixels 22 row-by-row at high speeds to cause each LED 22 to emit light at a desired brightness level. In other words, each pixel in the first row is updated to a desired brightness level, then each pixel in the second row is updated to a desired brightness level, etc.

Pixel control circuit 40 may have first output terminals 32 that are coupled to the anode contact lines A and second output terminals 34 that are coupled to the cathode contact lines C. Pixel control circuit 40 may have one output terminal 32 per anode contact line and one output terminal 34 per cathode contact line, as one example. Using the passive matrix as in FIG. 4 therefore allows pixel control circuit 40 to control 64 light-emitting diodes (e.g., in an 8×8 grid) using only 16 outputs (8 anode output terminals and 8 cathode output terminals).

Figure 5:
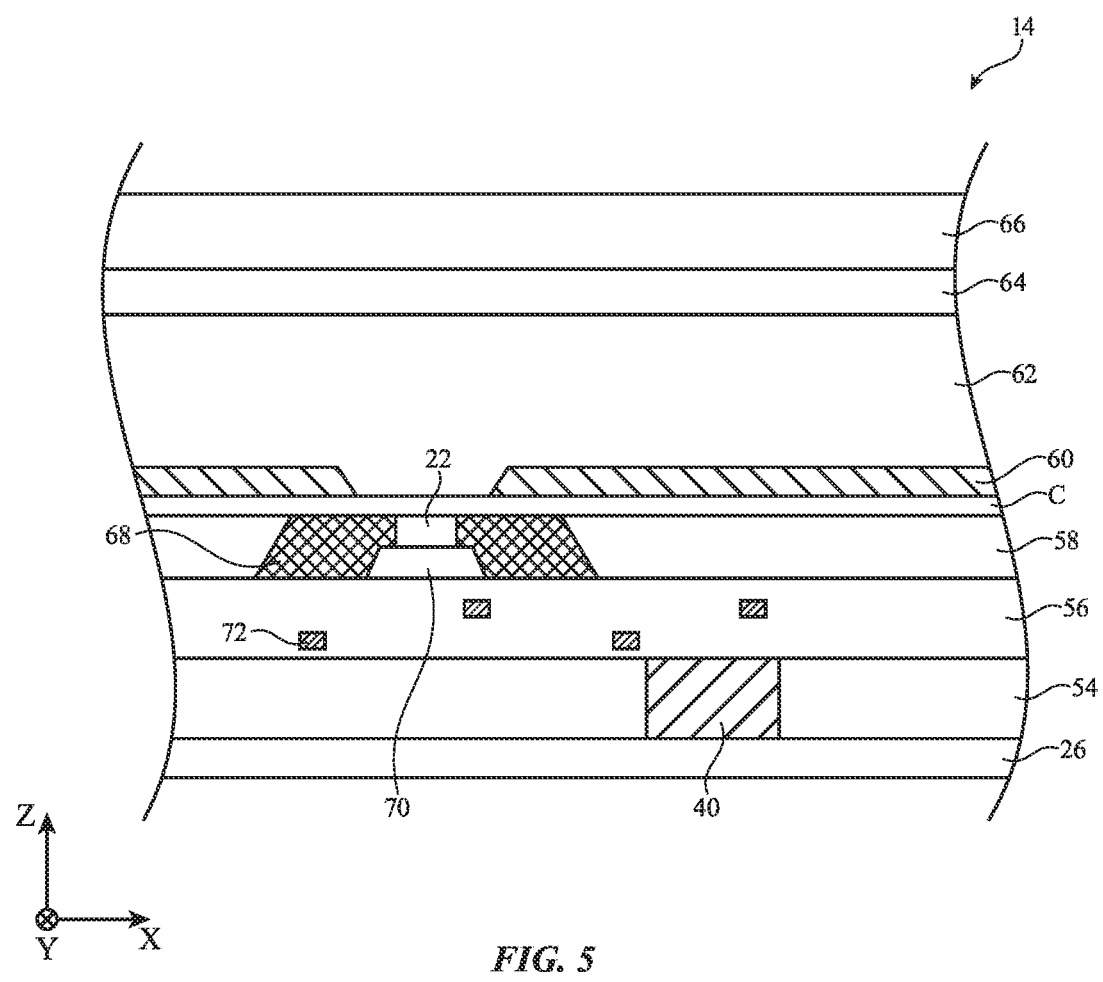
FIG. 5 is a cross-sectional side view of an illustrative display with a polarizer and light-emitting diodes in accordance with various embodiments.

FIG. 5 is a cross-sectional side view of an illustrative display with an LED 22 and a pixel control circuit 40 (e.g., a display with the arrangement of FIGS. 3 and 4). As shown in FIG. 5, display 14 may include a substrate 26. As previously mentioned substrate 26 may be formed from layers of material such as glass layers, polymer layers (e.g., polyimide), composite films that include polymer and inorganic materials, metallic foils, semiconductors such as silicon or other semiconductor materials, layers of material such as sapphire, etc. In the example of FIG. 5, substrate 26 may be formed from polyimide.

Pixel control circuit 40 (sometimes referred to as microdriver 40) is formed on substrate 26). Pixel control circuit 40 is laterally surrounded by planarization layer 54. Planarization layer 54 may be an optically clear organic resin, as one example. Planarization layer 54 may be formed from any other desired material.

One or more insulation layers 56 is formed on an upper surface of planarization layer 54. Each insulation layer 56 may be formed from the same material or different insulation layers may be formed from different materials. Layers 56 may be formed from the same material as layer 54 or a different material than layer 54. Layers 56 may be formed from an optically clear organic resin, as one example. In general, layers 56 may be formed from any desired material. Layers 56 serve as insulating layers for backplane metal layers 72. The backplane metal layers 72 may include various signal lines and conductive vias that are used to electrically route signals within display 14. The backplane metal layers may electrically connect microdriver 40 to LEDs 22, as one example.

A spacer layer 70 and LED are formed on the upper surface of layer(s) 56. Spacer 70 may be formed from the same material as layer 56 or a different material than layer 56. Spacer 70 may be formed from the same material as layer 54 or a different material than layer 54. Spacer 70 may be formed from an optically clear organic resin, as one example. In general, spacer 70 may be formed from any desired material. The spacer serves to position LED 22 at a desired location (height) within the display. LED 22 may be attached to an upper surface of spacer 70 with adhesive or with a conductive structure (e.g., a conductive adhesive).

LED 22 and spacer 70 may be laterally surrounded by planarization layer 58. Planarization layer 58 may be formed from the same material as layer 54 or a different material than layer 54. Planarization layer 58 may be formed from the same material as layer 56 or a different material than layer 56. Planarization layer 58 may be formed from the same material as layer 70 or a different material than layer 70. Planarization layer 58 may be formed from an optically clear organic resin, as one example.

A conductive layer such as cathode line C may be formed on the upper surface of planarization layer 58. Cathode line C may be formed from a transparent conductive material such as indium tin oxide (ITO). Cathode line C may have a high transparency (e.g., greater than 75%, greater than 80%, greater than 85%, greater than 90%, greater than 95%, greater than 99%, etc.). Cathode line C may be electrically connected to one or more LEDs 22 on the display (as shown and discussed in connection with FIG. 4).

An opaque masking layer 60 may be formed over the LEDs on display 14. As shown in FIG. 5, opaque masking layer 60 is formed on an upper surface of cathode line C. The opaque masking layer has an opening that is aligned with LED 22 (to allow light from LED 22 to pass through the opaque masking layer). The opaque masking layer 60 may have an opacity that is greater than 50%, greater than 70%, greater than 80%, greater than 85%, greater than 90%, greater than 95%, greater than 99%, etc. The opaque masking layer 60 may be formed from carbon black particles embedded in an organic resin (as one example). Covering the backplane metals (72) with opaque masking layer 60 prevents ambient light from reflecting off the backplane metals towards a viewer (which would reduce display contrast).

A planarization layer 62 is formed over opaque masking layer 60. Planarization layer 62 may be formed from the same material as layer 54 or a different material than layer 54. Planarization layer 62 may be formed from the same material as layer 58 or a different material than layer 58. Planarization layer 62 may be formed from the same material as layer 56 or a different material than layer 56. Planarization layer 62 may be formed from the same material as layer 70 or a different material than layer 70. Planarization layer 62 may be formed from an optically clear organic resin, as one example.

A polarizer layer 64 may be formed over planarization layer 62. Polarizer layer 64 may be a circular polarizer layer 64 that includes a linear polarizer and a quarter wave plate. The circular polarizer may mitigate reflections of ambient light off of display 14.

A cover layer 66 may be formed over polarizer layer 64. Cover layer 66 may be formed from glass, polymer, a crystalline transparent layer such as sapphire, etc. Cover layer 66 may have a high transparency (e.g., greater than 75%, greater than 80%, greater than 85%, greater than 90%, greater than 95%, greater than 99%, etc.).

Layers 54, 56, 58, and 62 may each have a high transparency (e.g., greater than 75%, greater than 80%, greater than 85%, greater than 90%, greater than 95%, greater than 99%, etc.).

LED 22 may emit light vertically in the positive Z-direction (e.g., through an opening in opaque masking layer 60). LED 22 additionally may emit edge light that is parallel to the XY-plane (or closer in angle to the XY-plane than vertical). To increase the efficiency of display 14, it is desirable for the edge-emission light to be redirected towards a viewer of the display. Therefore, as shown in FIG. 5, a diffuser 68 may be formed around each LED 22. Diffuser 68 may be formed by nanoparticles (sometimes referred to as diffusive nanoparticles or light scattering nanoparticles) embedded in a clear organic resin (sometimes referred to as a host material). The host material for the diffuser may be the same material as layer 58 (in other words, the diffuser is formed by nanoparticles embedded in layer 58). Alternatively, a separate host material that is different than the material of layer 58 may be included for diffuser 68.

Figure 6:
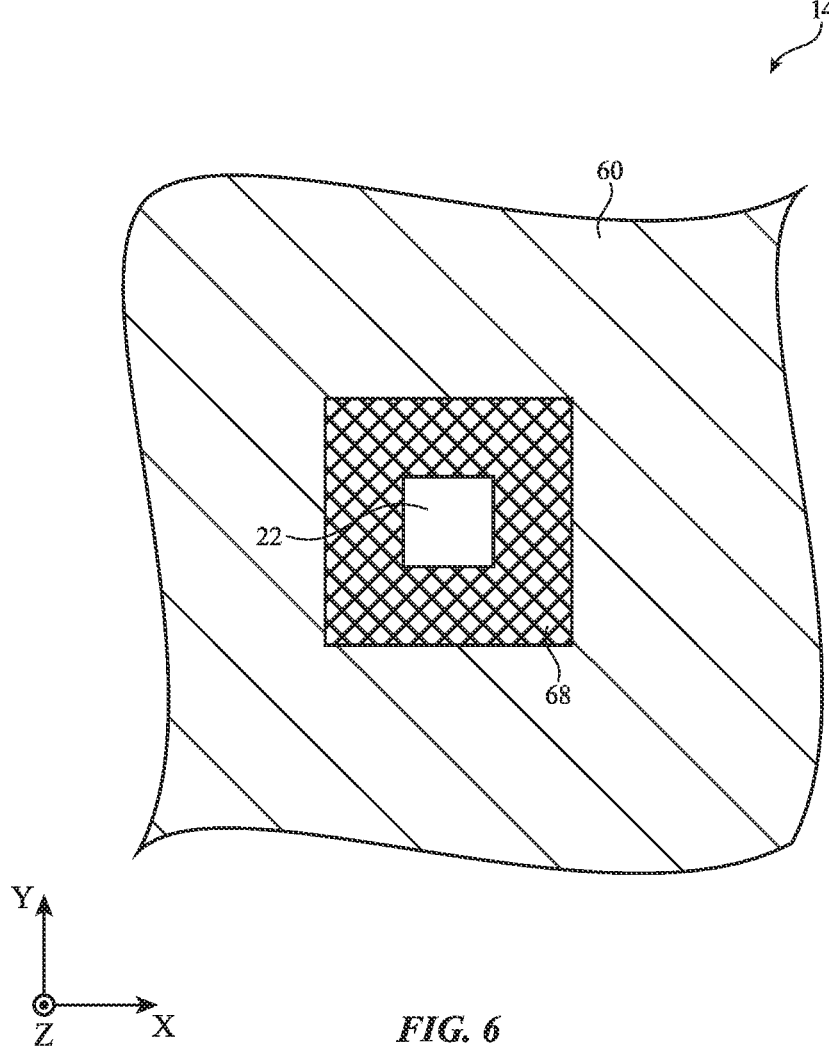
FIG. 6 is a top view of the illustrative display of FIG. 5 in accordance with various embodiments.

As shown in the top view of FIG. 6, diffuser 68 may be formed in a ring that laterally surrounds LED 22. This enables side-emission light from all sides of LED 22 to be redirected towards a viewer of the display to increase the efficiency of the display.

In FIGS. 5 and 6, diffuser 68 is patterned out except for the area around the inorganic light-emitting diode. This may allow for higher transmission through the display to optical sensors under display, as one example. This example is merely illustrative. In another possible arrangement, diffuser 68 may be a blanket layer that extends across the display throughout planarization layer 58. In other words, all of planarization layer 58 may include embedded nanoparticles such that all of planarization 58 serves as a diffuser layer. In all of the embodiments herein with a side-diffuser 68, the side-diffuser may be patterned to only be included in the area around the inorganic light-emitting diodes (as in FIG. 5) or the side-diffuser may be a blanket layer that completely covers the display (e.g., all of planarization layer 58 serves as a diffuser layer).

Figure 7:
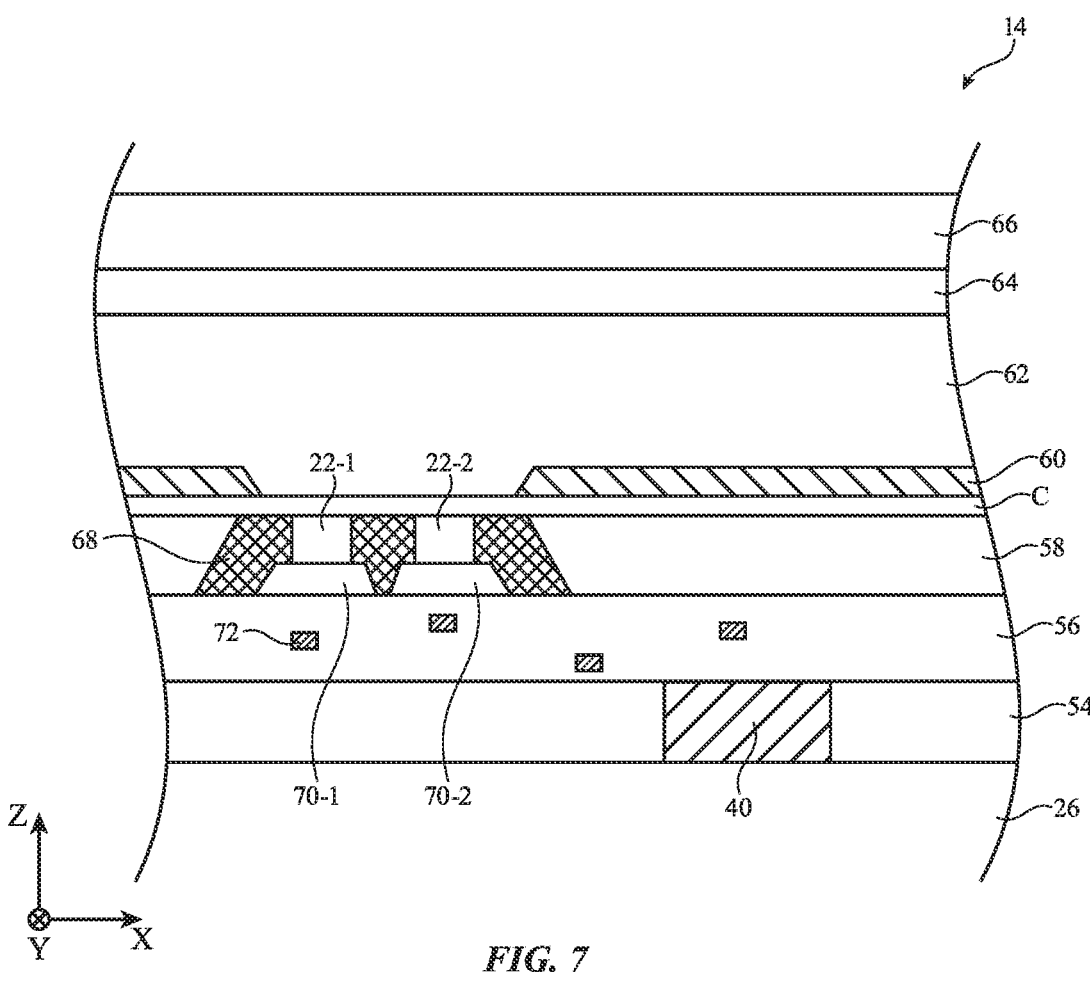
FIG. 7 is a cross-sectional side view of an illustrative display with a polarizer and redundant light-emitting diodes in accordance with various embodiments.

The arrangement of FIGS. 5 and 6 is merely illustrative. In another possible arrangement, a redundant LED may be included for each LED in the display. FIG. 7 is a cross-sectional side view of an illustrative display with a redundant LED. As shown, first and second spacers 70-1 and 70-2 are formed on the upper surface of insulating layer(s) 56. A first LED 22-1 is formed on the upper surface of spacer 70-1 and a second LED 22-2 is formed on the upper surface of spacer 70-2. Each one of LEDs 22-1 and 22-2 may be electrically connected to cathode line C.

Including the redundant LED may allow for the possibility of manufacturing error in LEDs 22. In other words, the manufacturing process of LEDs 22 may result in a small percentage of LEDs 22 being inoperable. If one of the LEDs is inoperable, the redundant LED may be used for display 14 instead (in the likely event that the redundant LED is operable). LEDs 22-1 and 22-2 may therefore be LEDs of the same color (e.g., both configured to emit red light, both configured to emit green light, both configured to emit blue light, etc.).

Figure 8:
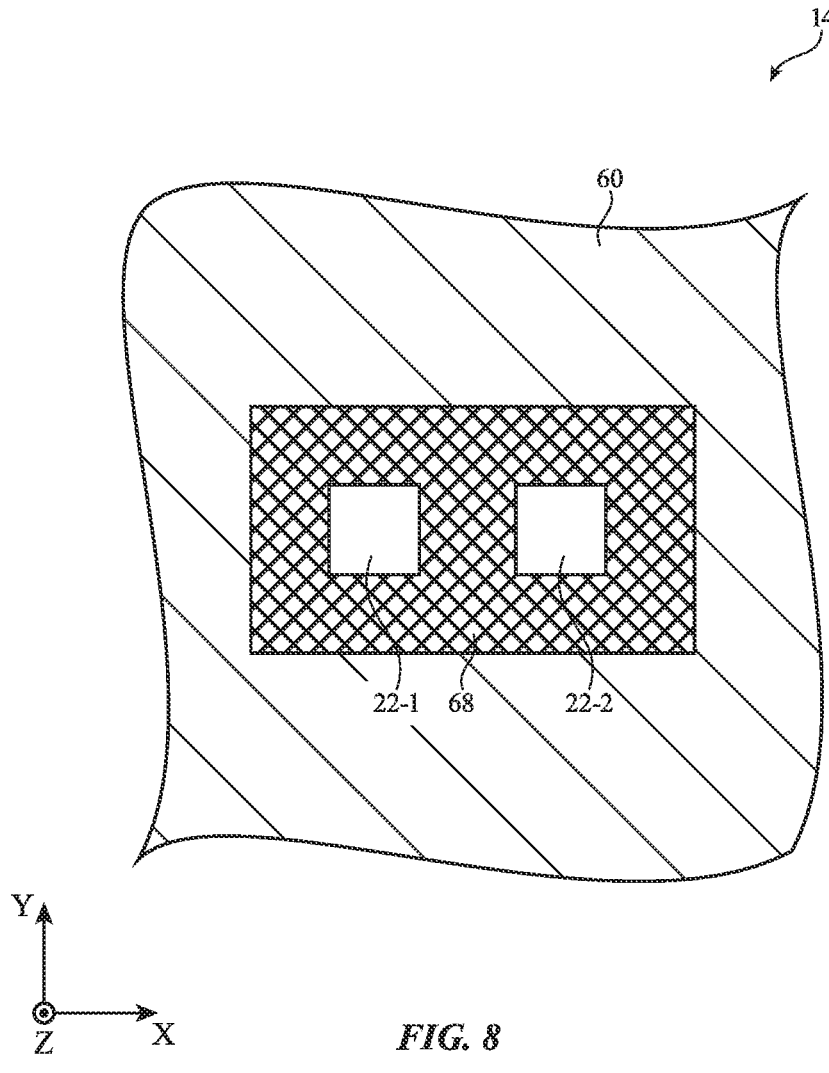
FIG. 8 is a top view of the illustrative display of FIG. 7 in accordance with various embodiments.

As shown in FIG. 7, diffuser 68 may be interposed between LEDs 22-1 and 22-2 as well as formed around the periphery of LEDs 22-1 and 22-2. FIG. 8 is a top view of display 14 in FIG. 7 showing how diffuser 68 has a portion that is interposed between (within the XY-plane) LEDs 22-1 and 22-2. Diffuser 68 also has a portion that extends around the periphery of LEDs 22-1 and 22-2.

In FIGS. 7 and 8, opaque masking layer 60 has an opening that overlaps (in the Z-direction) both LEDs 22-1 and 22-2. This example is merely illustrative. In another possible arrangement, shown in FIG. 9, a dynamic lithography process may be used to cover the unused redundant LED. In other words, the LEDs 22 may be tested to verify which LEDs are functional. Once it is confirmed that one of the LEDs is functional (e.g., LED 22-2 in FIG. 9), the opaque masking layer 60 may be patterned to cover the unused LED (e.g., LED 22-1 in FIG. 9).

Each pixel in display 14 may have a pair of LEDs. The opaque masking layer may cover one of the pair of LEDs (e.g., the unused LED) and define an opening over the other LED (e.g., the LED used to display light). This selective patterning of the opaque masking layer based on which LED(s) are functional may be referred to as dynamic lithography (since the pattern for the opaque masking layer is updated for each display during manufacturing).

Figure 9:
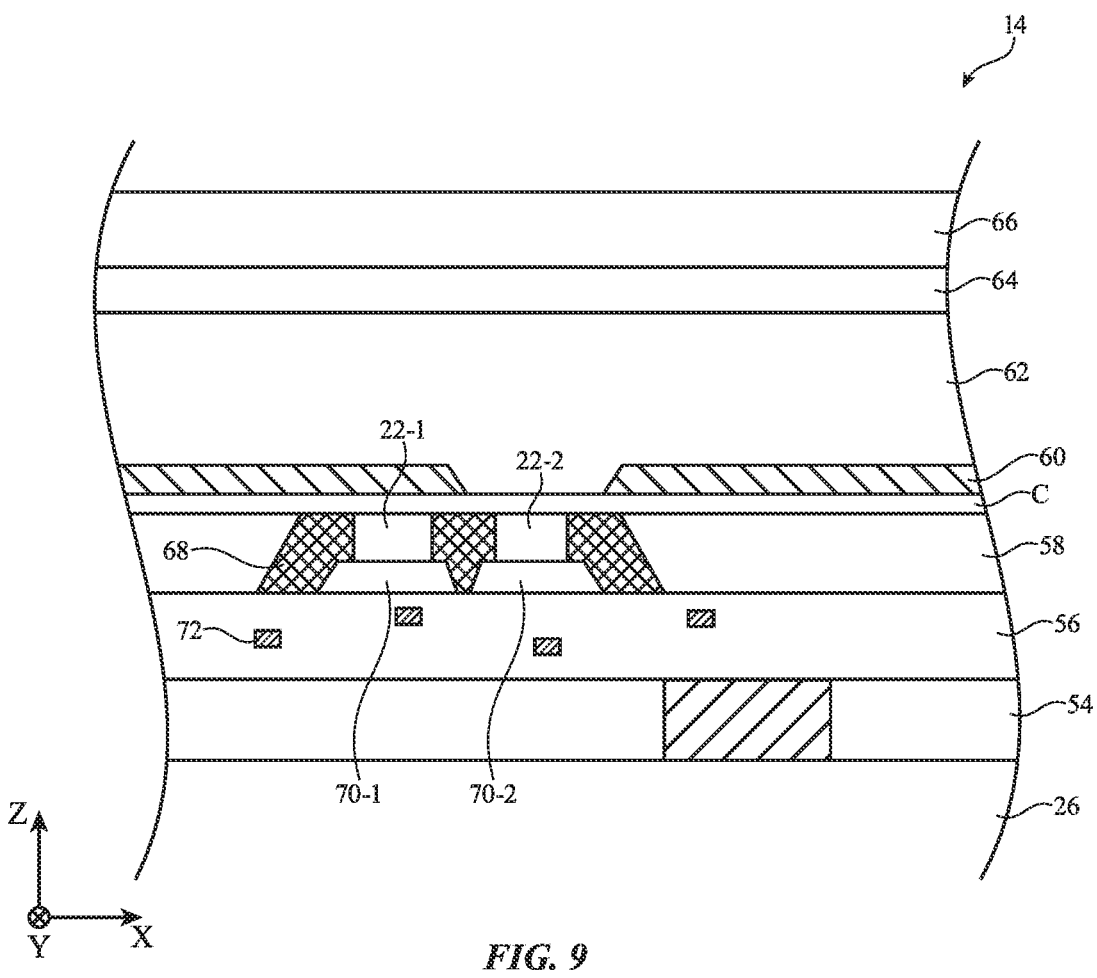
FIG. 9 is a cross-sectional side view of an illustrative display with a polarizer, redundant light-emitting diodes, and an opaque masking layer formed using dynamic lithography in accordance with various embodiments.

The diffuser 68 in FIG. 9 has the same arrangement as in FIG. 7. However, the top view of the display of FIG. 9 is the same as shown in FIG. 6 (with a single LED that emits light through each opening in the opaque masking layer).

To increase the efficiency of display 14, planarization layer 62 (e.g., in FIG. 5, 7, or 9) may have a low index of refraction. For example, planarization layer 62 may have an index of refraction that is less than 1.5, less than 1.45, less than 1.4, less than 1.35, less than 1.3, etc. The low index of refraction for planarization layer 62 may cause off-axis light to be reflected by total internal reflection at an interface between the LED 22 and planarization layer 62, causing the light to ultimately reflect off a LED sidewall towards a display viewer.

Figure 10:
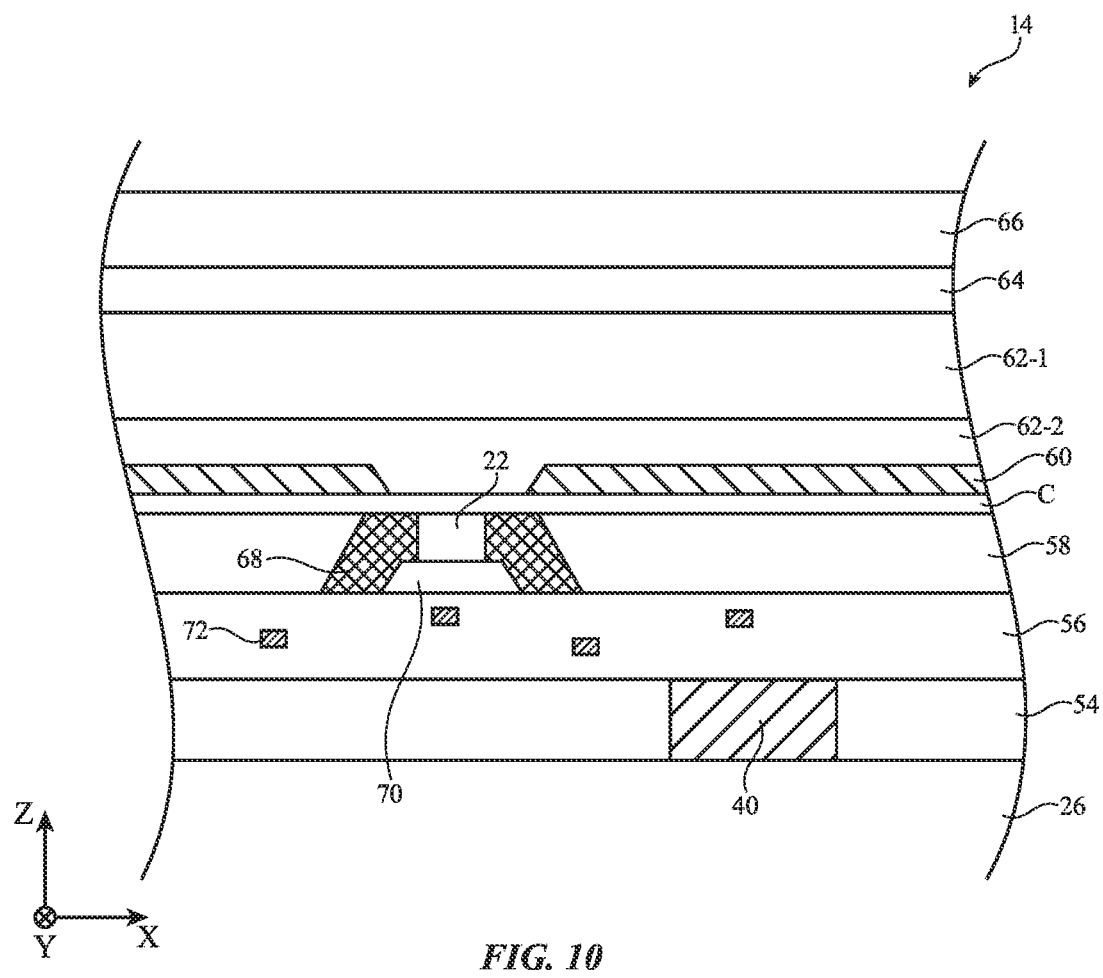
FIG. 10 is a cross-sectional side view of an illustrative display with a polarizer and light-emitting diodes that are overlapped by two planarization layers in accordance with various embodiments.

The example of forming planarization layer 62 with a low-index material is merely illustrative. In another desired arrangement, shown in FIG. 10, planarization layer 62 may be formed using multiple layers. A first layer 62-2 may be positioned between LED 22 and a second layer 62-1. Planarization layer 62-2 may have an index of refraction that is less than 1.5, less than 1.45, less than 1.4, less than 1.35, less than 1.3, etc. Planarization layer 62-1 may have an index of refraction that is greater than the index of refraction of layer 62-2 (e.g., by at least 0.05, by at least 0.1, by at least 0.15, by at least 0.2, by at least 0.3, etc.). Planarization layer 62-1 may have an index of refraction that is greater than 1.4, greater than 1.5, greater than 1.6, greater than 1.7, etc.

Figure 11:
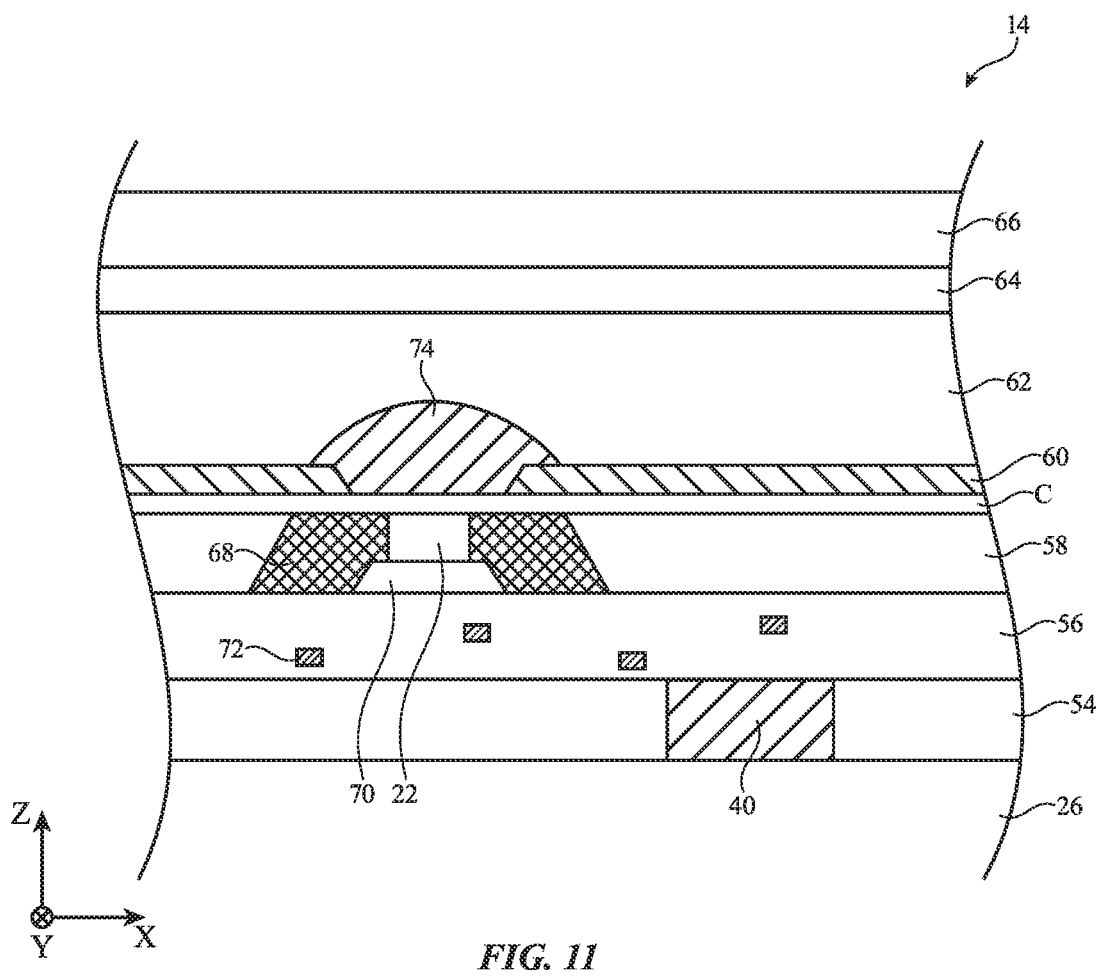
FIG. 11 is a cross-sectional side view of an illustrative display with a polarizer and light-emitting diodes that are overlapped by microlenses in accordance with various embodiments.

To extract light from the light-emitting diode (and thereby improve efficiency of the display), one or more microlenses may be formed over the light-emitting diode. FIG. 11 is a cross-sectional side view of an illustrative display showing an illustrative microlens 74. Microlens 74 is formed over the opening in opaque masking layer 60 (and corresponding LED 22) on an upper surface of cathode electrode line C. Microlens 74 may be formed from an inorganic material or an organic material. Microlens 74 may have an index of refraction that is greater than 1.4, greater than 1.5, greater than 1.7, greater than 1.9, greater than 2.0, less than 2.2, less than 2.0 less than 1.8, less than 1.6, etc.).

Figure 12:
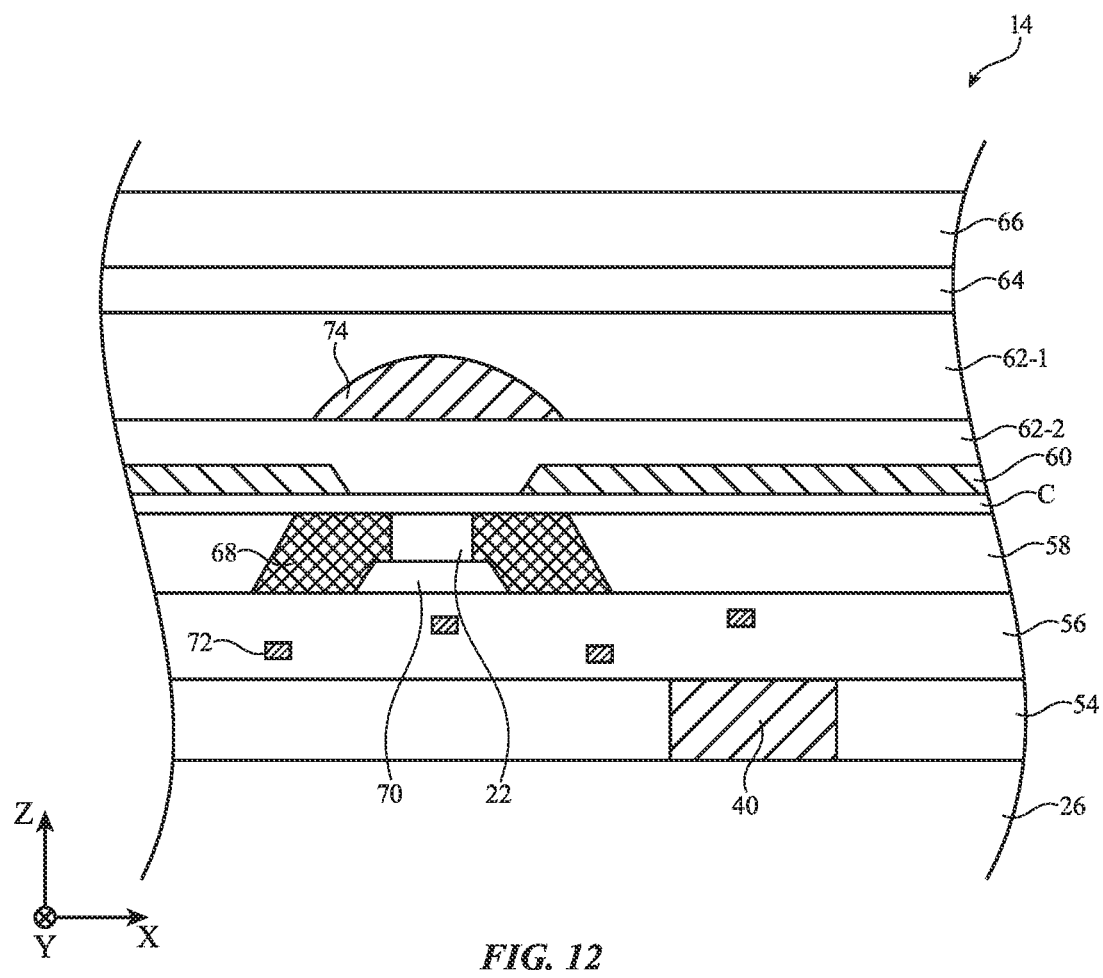
FIG. 12 is a cross-sectional side view of an illustrative display with a polarizer and light-emitting diodes that are overlapped by two planarization layers and microlenses in accordance with various embodiments.

The example in FIG. 11 of microlens 74 being formed on an upper surface of cathode line C is merely illustrative. In another possible arrangement, shown in FIG. 12, planarization layer 62 is split into first and second planarization layers 62-1 and 62-2 (as in FIG. 10) and microlens 74 is formed on an upper surface of planarization layer 62-2.

Misalignment between the LEDs and the corresponding openings in the opaque masking layer may result in visible artifacts on display 14. To mitigate these issues, larger openings may be provided in the opaque masking layer for the LEDs. However, making the opaque masking layer openings too large may increase diffuse reflection off the display past target levels. To balance these factors, the openings for LEDs of certain colors may be differently sized than the openings for LEDs of other colors.

In general, the human eye is more sensitive to green light than red light and blue light. The human eye may be less sensitive to blue light than red light and green light. Therefore, the opaque masking layer openings for the green pixels may be larger than the openings for the red and blue pixels. Since the human eye is most sensitive to green light, large openings for the green pixels provides the largest tolerance for LED-opening misalignment. The opaque masking layer openings for the blue pixels may be smaller than the openings for the red and blue pixels. Since the human eye is least sensitive to blue light, small openings for the blue pixels reduce the diffuse reflection in the display without causing artifacts from LED-opening misalignment.

Figure 13:
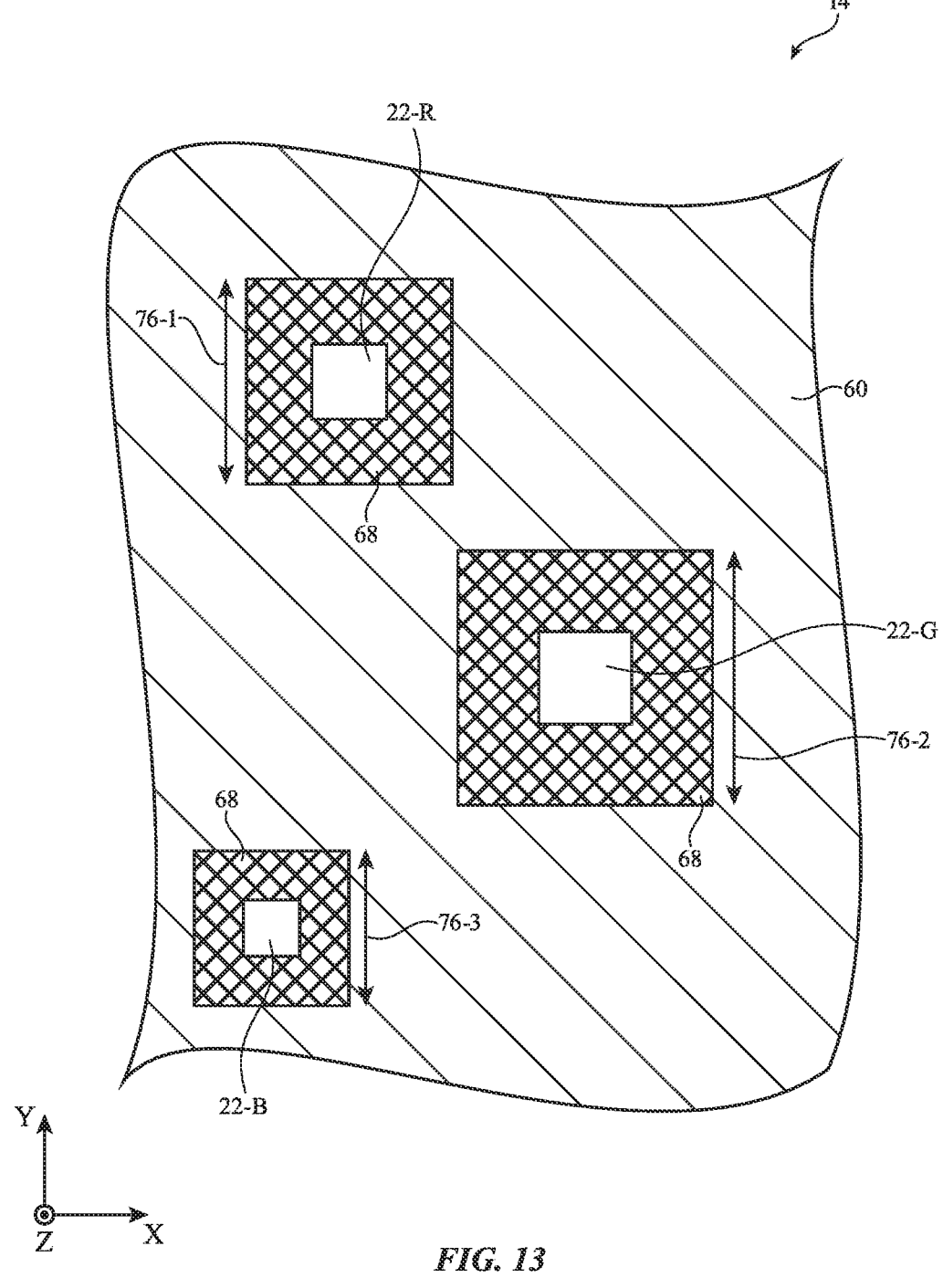
FIG. 13 is a top view of an illustrative display with opaque masking layer openings of different sizes for different color light-emitting diodes in accordance with various embodiments.

As shown in FIG. 13, display 14 may include green LEDs such as LED 22-G, blue LEDs such as LED 22-B, and red LEDs such as LED 22-R. Each opening may be defined by an opening having first and second lateral dimensions (e.g., within the XY-plane). The openings may be square (such that the first and second lateral dimensions are the same, as in FIG. 13) or may be non-square rectangular (such that the first and second lateral dimensions are different). Each red LED 22-R may be overlapped by an opening in the opaque masking layer having a maximum dimension 76-1. Each green LED 22-G may be overlapped by an opening in the opaque masking layer having a maximum dimension 76-2. Each blue LED 22-B may be overlapped by an opening in the opaque masking layer having a maximum dimension 76-3. Maximum dimension 76-2 is greater than maximum dimension 76-1 (e.g., by more than 5%, by more than 10%, by more than 15%, by more than 25%, by more than 50%, etc.). Maximum dimension 76-1 is greater than maximum dimension 76-3 (e.g., by more than 5%, by more than 10%, by more than 15%, by more than 25%, by more than 50%, etc.). The area of each opening for a green pixel may be greater than the area of each opening for a red pixel (e.g., by more than 5%, by more than 10%, by more than 15%, by more than 25%, by more than 50%, etc.). The area of each opening for a red pixel may be greater than the area of each opening for a blue pixel (e.g., by more than 5%, by more than 10%, by more than 15%, by more than 25%, by more than 50%, etc.). Tailoring the opaque masking layer opening size as in FIG. 13 mitigates both reflections and artifacts caused by LED-opening misalignment.

Figure 14:
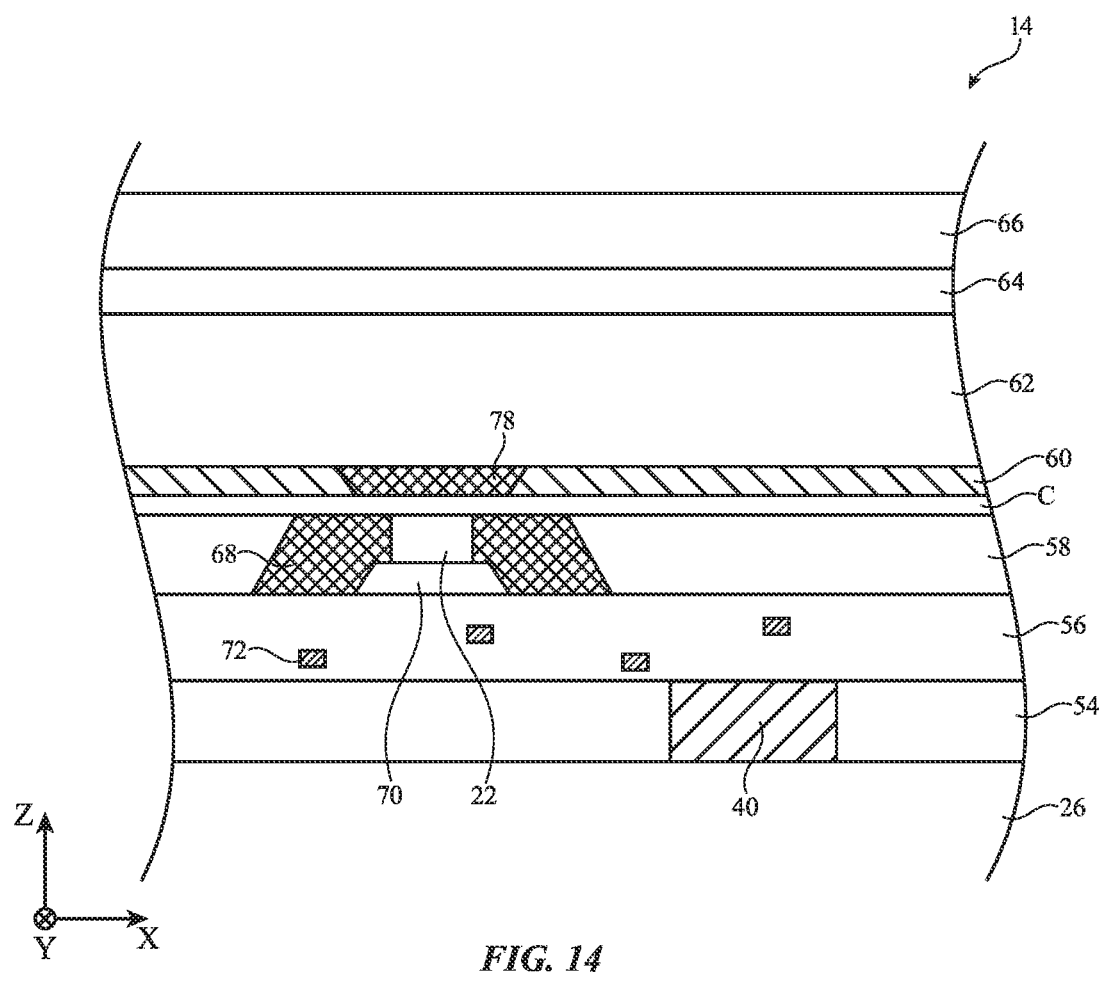
FIG. 14 is a cross-sectional side view of an illustrative display with a polarizer and light-emitting diodes that are overlapped by patterned top diffusers in accordance with various embodiments.

FIG. 14 shows another way to mitigate visible artifacts in display 14. One potential cause of visible artifacts in the display is different LEDs having different emission profiles. To mitigate this type of variation, each LED may be covered by a top diffuser 78. Diffuser 78 may be formed by nanoparticles (sometimes referred to as diffusive nanoparticles or light scattering nanoparticles) embedded in a clear organic resin (sometimes referred to as a host material). The host material for the diffuser may be the same material as layer 62 (in other words, the diffuser is formed by nanoparticles embedded in layer 62). Alternatively, a separate host material that is different than the material of layer 62 may be included for diffuser 78. As shown in FIG. 14, diffuser 78 may be formed over LED 22 on the upper surface of cathode line C. The nanoparticles used for diffuser 78 may be the same as the nanoparticles used for diffuser 68 or may be different than the nanoparticles used for diffuser 68. The host material used for diffuser 78 may be the same as the host material used for diffuser 68 or may be different than the host material used for diffuser 68.

Figure 15:
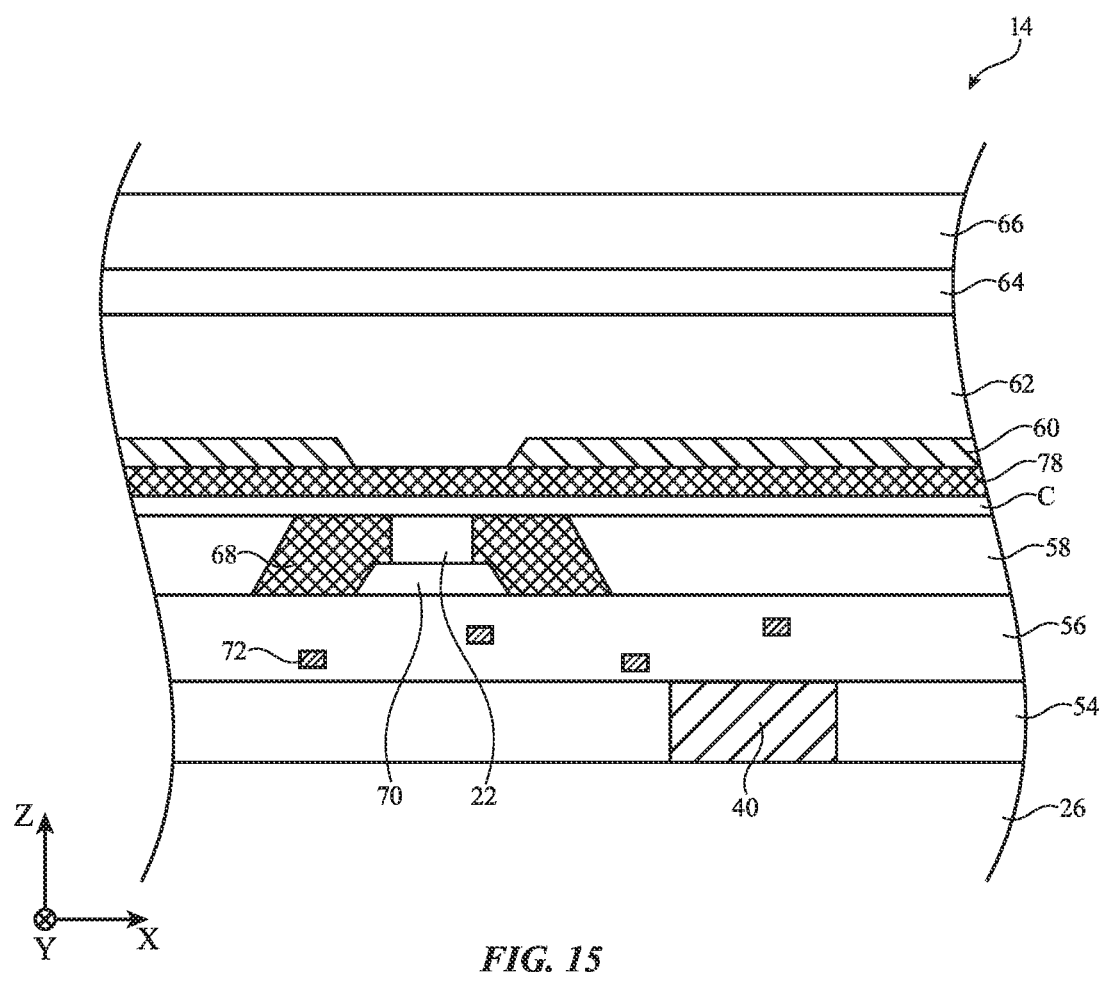
FIG. 15 is a cross-sectional side view of an illustrative display with a polarizer and light-emitting diodes that are overlapped by a blanket top diffuser in accordance with various embodiments.

In FIG. 14, a diffuser 78 may be patterned over each LED in display 14. This example is merely illustrative. In another possible arrangement, shown in FIG. 15, a blanket diffuser may be formed over the display that overlaps all of the LEDs in the display. As shown in FIG. 15, diffuser 78 is formed across the width of the display (and overlaps multiple LEDs in the display). In this type of arrangement, the host material for diffuser 78 may be the same material as layer 62, the host material for diffuser 78 may be the same material as layer 58, the host material for diffuser 78 may be the same material as layer 56, the host material for diffuser 78 may be the same material as layer 54, the host material for diffuser 78 may be the same material as layer 70, or the host material for diffuser 78 may be a different material than is used for layers 54, 56, 58, 70, and 62. The nanoparticles used for diffuser 78 may be the same as the nanoparticles used for diffuser 68 or may be different than the nanoparticles used for diffuser 68.

Figure 16:
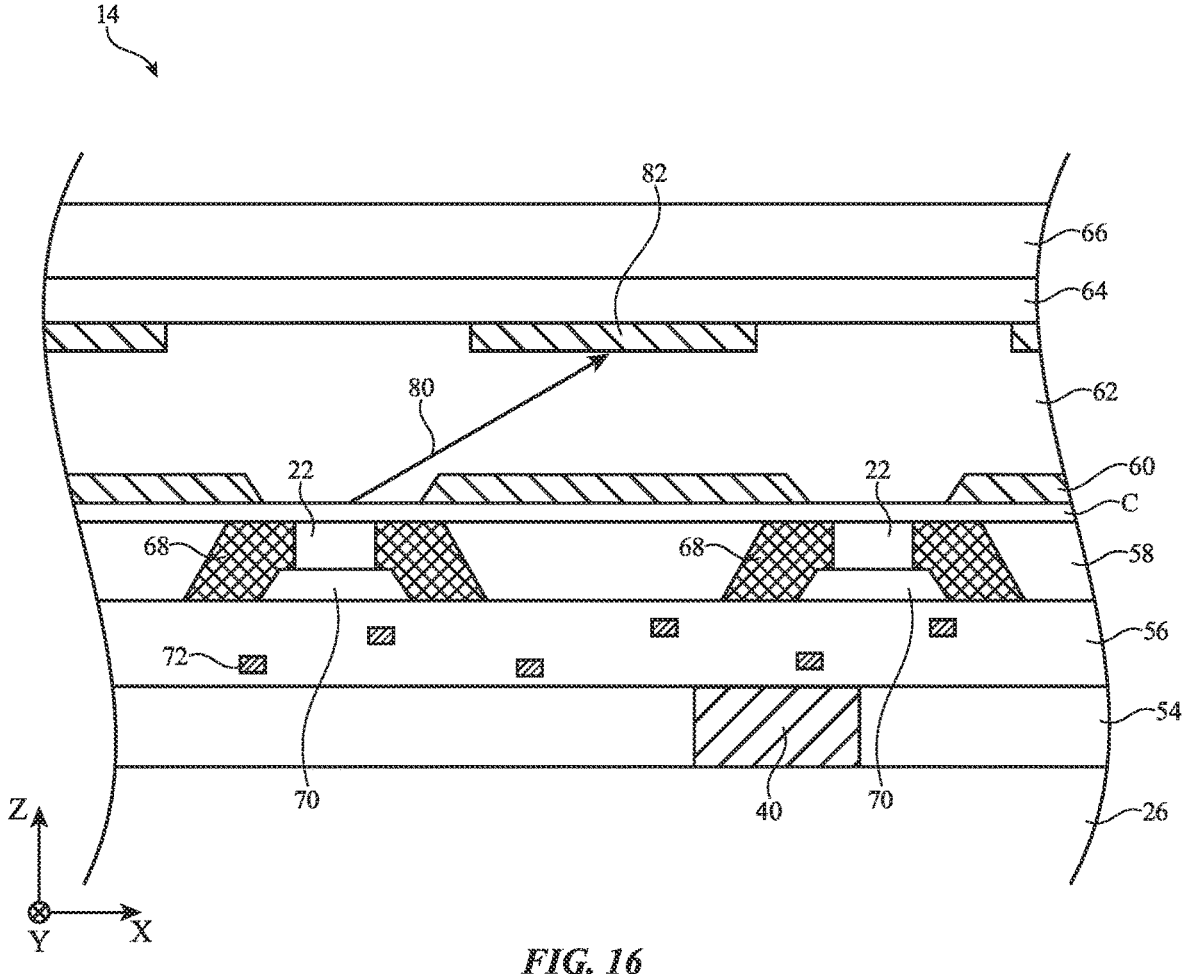
FIG. 16 is a cross-sectional side view of an illustrative display with a polarizer, light-emitting diodes, and horizontal opaque masking layer portions between light-emitting diodes in accordance with various embodiments.

One potential cause of visible artifacts in the display is reflections of high-angled light off the interface between the cover layer and the exterior of the device (e.g., a glass-air interface). These reflections may reflect off of neighboring pixels, resulting in light being viewable in nominally off areas of the display. Consider light 80 in FIG. 16. If care is not taken, this light may reflect off the interface between the outer surface of display cover layer 66 and air, off a neighboring LED 22, and towards a viewer of the display. To prevent these reflections, an additional opaque masking layer 82 may be included between pixels in the display. As shown in FIG. 16, opaque masking layer 82 is formed between planarization layer 62 and polarizer 64. This example is merely illustrative. The opaque masking layer 82 may instead be embedded in planarization layer 62, formed between polarizer 64 and cover layer 66, or formed at another desired location within the display stack. The opaque masking layer 82 overlaps a region between adjacent LEDs 22 in the display.

The material(s) used for opaque masking layer 82 may be the same as the material(s) used for opaque masking layer 60 or may be different than the material(s) used for opaque masking layer 60.

In FIG. 16, opaque masking layer 82 is formed as a horizontal layer (e.g., parallel to layer 60 and the XY-plane) at an upper portion of planarization layer 62. This example is merely illustrative. In another possible arrangement, shown in FIG. 17, opaque masking layer 82 may be formed by vertical strips of opaque masking layer that extend parallel to the Z-axis. The vertical portions of opaque masking layer may extend entirely through planarization layer 62 (e.g., from an upper surface of planarization layer 62 adjacent to polarizer 64 to a lower surface of planarization layer 62 adjacent to opaque masking layer 60). This example is merely illustrative. The vertical portions of opaque masking layer may instead only partially extend through planarization layer 62.

Figure 17:
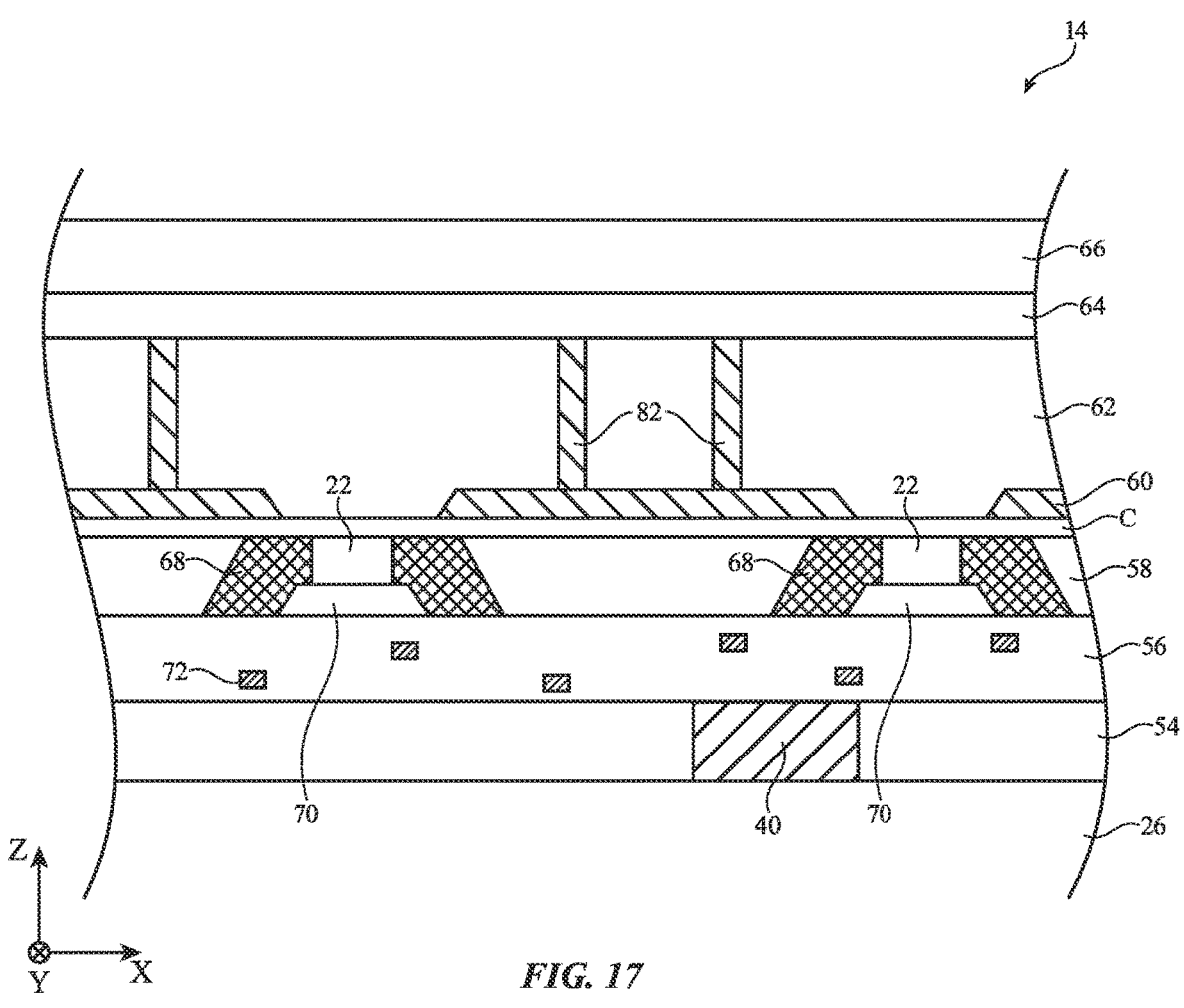
FIG. 17 is a cross-sectional side view of an illustrative display with a polarizer, light-emitting diodes, and vertical opaque masking layer portions between light-emitting diodes in accordance with various embodiments.

As shown in FIG. 17, multiple (e.g., two, three, more than three) vertical portions of opaque masking layer may be included between adjacent LEDs in display 14. The material(s) used for opaque masking layer 82 may be the same as the material(s) used for opaque masking layer 60 or may be different than the material(s) used for opaque masking layer 60.

Figure 18:
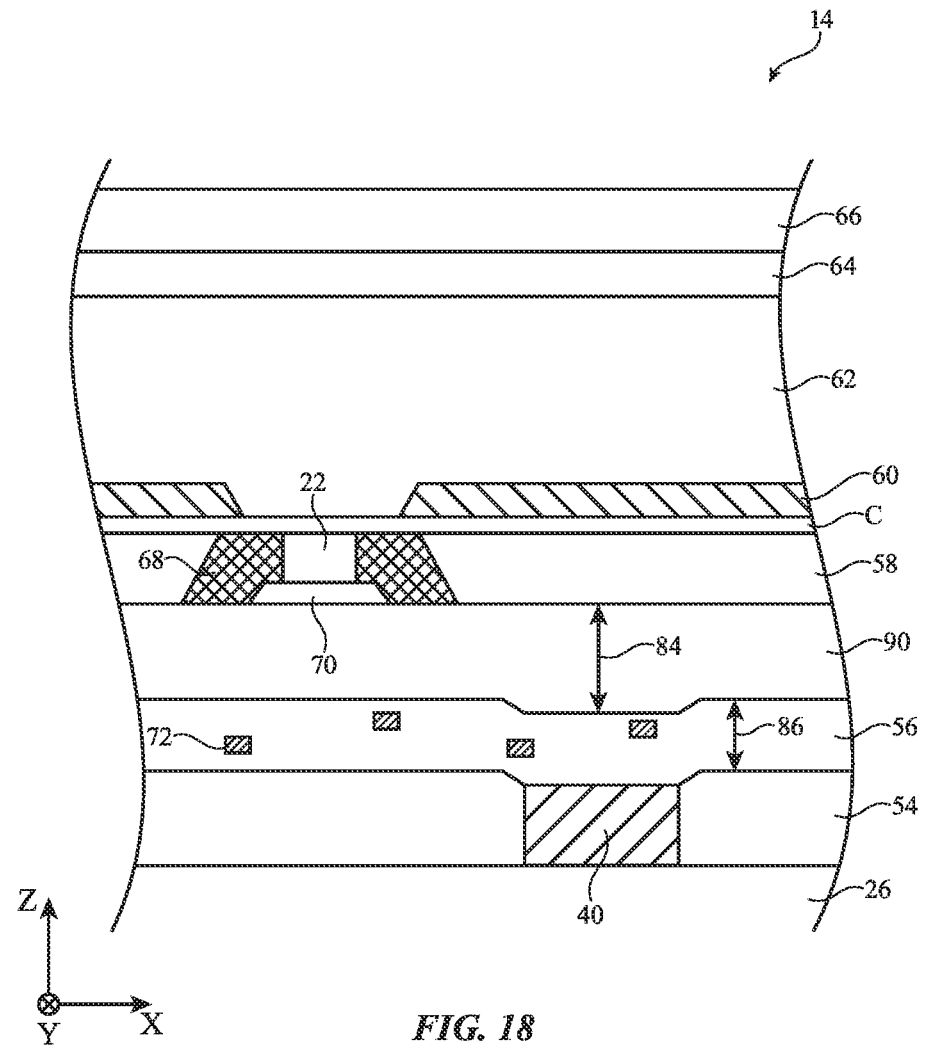
FIG. 18 is a cross-sectional side view of an illustrative display with a polarizer, light-emitting diodes, and an additional planarization layer in accordance with various embodiments.

As shown in FIG. 18, planarization layer 54 may have some non-planarity (e.g., adjacent to microdriver 40). This uneven topography may cause visible artifacts in display 14. To mitigate these types of visible artifacts, an additional planarization layer 90 may be included between insulating layers 56 and planarization layer 58 (as shown in FIG. 18). The additional planarization layer 90 may be formed from an optically clear organic resin, as one example. The material of layer 90 may be the same material that is used in layer 54, layers 56, layer 70, layer 58, and/or layer 62. Alternatively, the material for layer 90 may be a different material than in layers 54, 56, 58, 70, and 62.

Layer 90 may have a maximum thickness 84 that is greater than 3 microns, greater than 5 microns, greater than 8 microns, greater than 10 microns, less than 20 microns, less than 10 microns, between 5 microns and 10 microns, etc. The presence of layer 90 ensures a planar upper surface for overlying layers such as spacer 70, planarization layer 58, cathode line C, opaque masking layer 60, etc.

Figure 19:
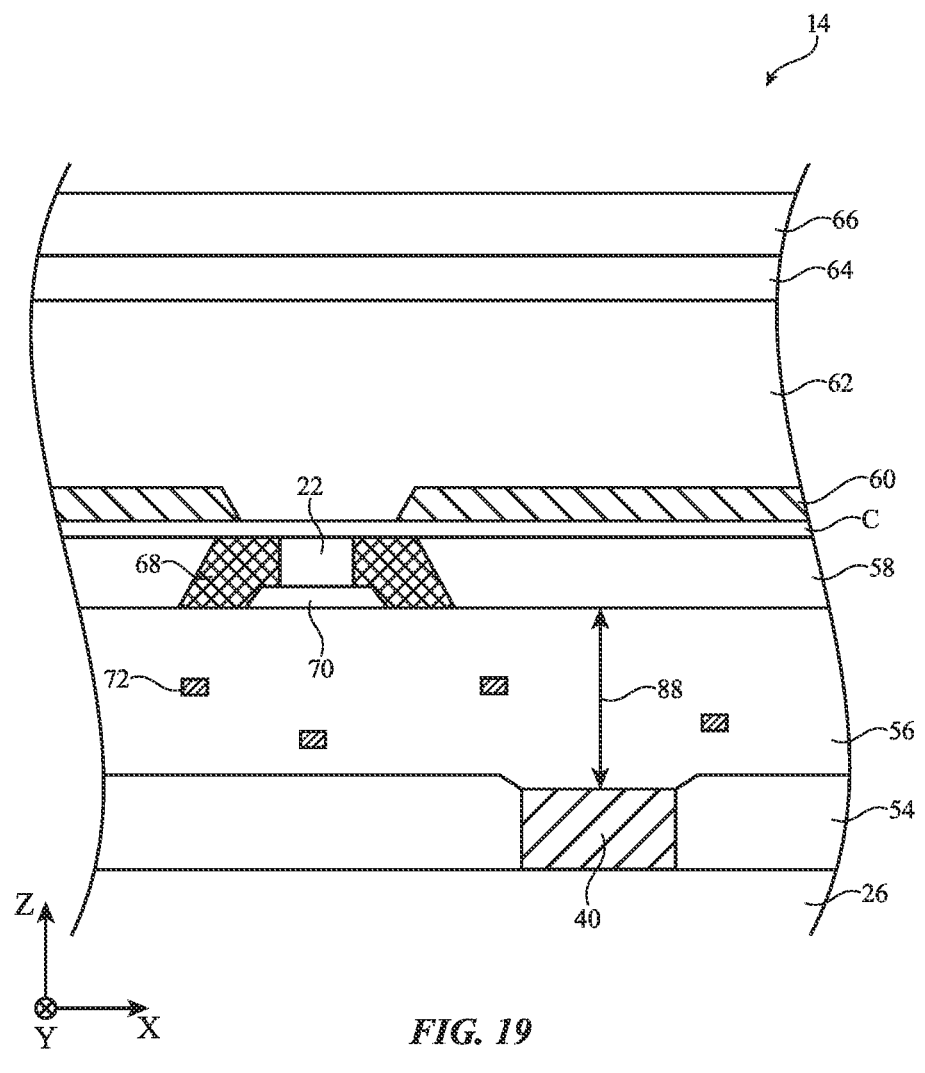
FIG. 19 is a cross-sectional side view of an illustrative display with a polarizer, light-emitting diodes, and thick insulating layers in accordance with various embodiments.

In FIG. 18, insulating layers 56 (that include backplane metal 72) have a total thickness 86. Thickness 86 may be less than 10 microns, less than 5 microns, less than 3 microns, greater than 1 micron, etc. Another option for providing display 14 with a planar surface above microdriver 40 is to increase the thickness of insulating layers 56. FIG. 19 is a cross-sectional side view of a display of this type. As shown in FIG. 19, insulating layers 56 have a thickness 88 (e.g., a maximum thickness) that is greater than thickness 86 from FIG. 18. Thickness 88 in FIG. 19 may be greater than 3 microns, greater than 5 microns, greater than 8 microns, greater than 10 microns, less than 20 microns, less than 10 microns, between 3 microns and 10 microns, etc.

One or more layers in display 14 may be designed to mitigate reflections of ambient light. Mitigating reflections of ambient light may mitigate undesired visible artifacts in the display. FIGS. 20-23 are cross-sectional side views of a portion of display 14 (e.g., a portion between LEDs). Specifically, FIGS. 20-23 show various arrangements for display layers that mitigate reflections. In FIGS. 20-23, cathode line C is omitted from the illustration for clarity. However, it should be understood that cathode lines C may still be included in the display.

Figure 20:
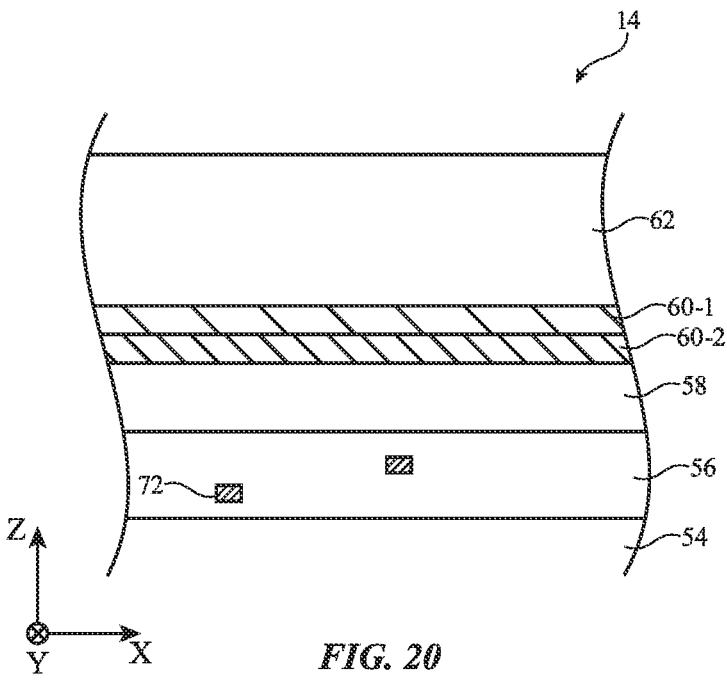
FIG. 20 is a cross-sectional side view of an illustrative display with first and second opaque masking layers having different properties in accordance with various embodiments.

In FIG. 20, two opaque masking layers are used instead of one opaque masking layer. As shown, a first opaque masking layer 60-1 is formed on a second opaque masking layer 60-2. The second opaque masking layer 60-2 is formed on planarization layer 58. Opaque masking layer 60-1 may have an index of refraction that is similar to the index of refraction of planarization layer 62. For example, the difference between the indices of refraction of layer 60-1 and layer 62 may be less than 0.3, less than 0.2, less than 0.1, less than 0.05, less than 0.03, less than 0.01, etc.

Opaque masking layer 60-2 may have an index of refraction that is similar to the index of refraction of planarization layer 58. For example, the difference between the indices of refraction of layer 60-2 and layer 58 may be less than 0.3, less than 0.2, less than 0.1, less than 0.05, less than 0.03, less than 0.01, etc.

The index of refraction of planarization layer 62 may be lower than the index of refraction of planarization layer 58. Accordingly, the index of refraction of opaque masking layer 60-1 may be lower than the index of refraction of opaque masking layer 60-2. The difference in the indices of refraction of layers 60-1 and 60-2 may be greater than 0.5, greater than 0.3, greater than 0.2, greater than 0.1, greater than 0.05, greater than 0.01, etc.

Both opaque masking layers 60-1 and 60-2 may be formed from carbon black particles embedded in an organic resin. The density of carbon black particles within the organic resin may be selected for each opaque masking layer to control the transmission of the opaque masking layer. A higher density of carbon black particles (sometimes referred to as optical density) results in a lower transmission and higher opacity whereas a lower density of carbon black particles results in a higher transmission and lower opacity. In one illustrative arrangement, the optical density of opaque masking layer 60-2 may be greater than the optical density of opaque masking layer 60-1 (e.g., by more than 10%, by more than 20%, by more than 50%, by more than 100%, by more than 200%, etc.). The total transmission of opaque masking layer 60-1 may be more than 5%, more than 15%, more than 25%, more than 40%, more than 50%, more than 70%, etc. The total transmission of opaque masking layer 60-2 may be less than 3%, less than 5%, less than 10%, less than 25%, etc. The difference in total transmission between opaque masking layers 60-1 and 60-2 may be more than 5%, more than 15%, more than 25%, more than 40%, more than 50%, more than 70%, etc.

As one specific example, layer 62 may have an index of refraction of 1.4. Layer 60-1 may have an index of refraction of 1.6. Layer 60-2 may have an index of refraction of 1.7. Layer 58 may have an index of refraction of 1.8. Reducing the optical density of opaque masking layer 60-1 allows for the index of refraction of layer 60-1 to be lowered relative to layer 60-2.

Figure 21:
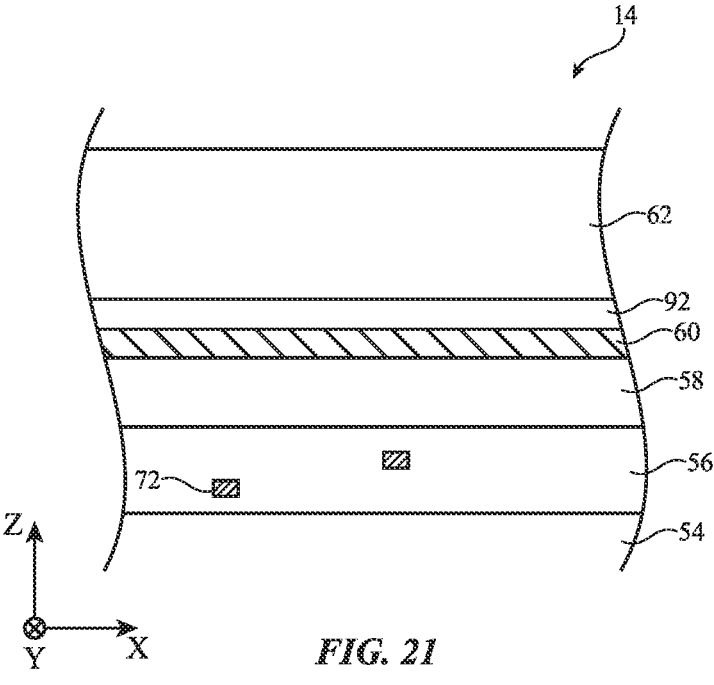
FIG. 21 is a cross-sectional side view of an illustrative display with a color filter layer formed over an opaque masking layer in accordance with various embodiments.

In FIG. 21, a color filter layer 92 is formed over opaque masking layer 60. Color filter layer 92 may have an index of refraction that is similar to the index of refraction of planarization layer 62. For example, the difference between the indices of refraction of color filter layer 92 and layer 62 may be less than 0.3, less than 0.2, less than 0.1, less than 0.05, less than 0.03, less than 0.01, etc.

Opaque masking layer 60 may have an index of refraction that is similar to the index of refraction of planarization layer 58. For example, the difference between the indices of refraction of layer 60 and layer 58 may be less than 0.3, less than 0.2, less than 0.1, less than 0.05, less than 0.03, less than 0.01, etc.

The index of refraction of planarization layer 62 may be lower than the index of refraction of planarization layer 58. Accordingly, the index of refraction of color filter layer 92 may be lower than the index of refraction of opaque masking layer 60. The difference in the indices of refraction of layers 60 and 92 may be greater than 0.5, greater than 0.3, greater than 0.2, greater than 0.1, greater than 0.05, greater than 0.01, etc.

The total transmission of opaque masking layer 60 may be less than 3%, less than 5%, less than 10%, less than 25%, etc. Color filter layer 92 may include composites of red, green, and blue pigment (as one example).

Figure 22:
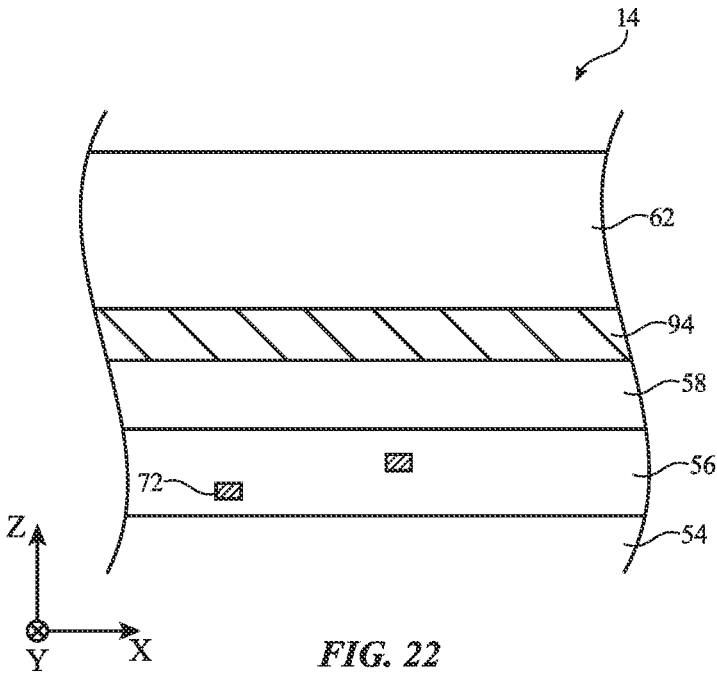
FIG. 22 is a cross-sectional side view of an illustrative display with a low-optical-density opaque masking layer in accordance with various embodiments.

In FIG. 22, a low-optical-density opaque masking layer 94 is formed between planarization layers 62 and 58. Opaque masking layer 94 may have an index of refraction that is similar to the index of refraction of planarization layer 62. For example, the difference between the indices of refraction of opaque masking layer 94 and layer 62 may be less than 0.3, less than 0.2, less than 0.1, less than 0.05, less than 0.03, less than 0.01, etc.

The total transmission of opaque masking layer 94 may be more than 5%, more than 15%, more than 25%, more than 40%, more than 50%, more than 70%, etc. Opaque masking layer 94 may have an optical density and thickness that are selected to sufficiently block ambient light reflections off of backplane metal 72. The total thickness of layer 94 may be greater than 1 micron, greater than 2 microns, greater than 3 microns, greater than 4 microns, etc.

Figure 23:
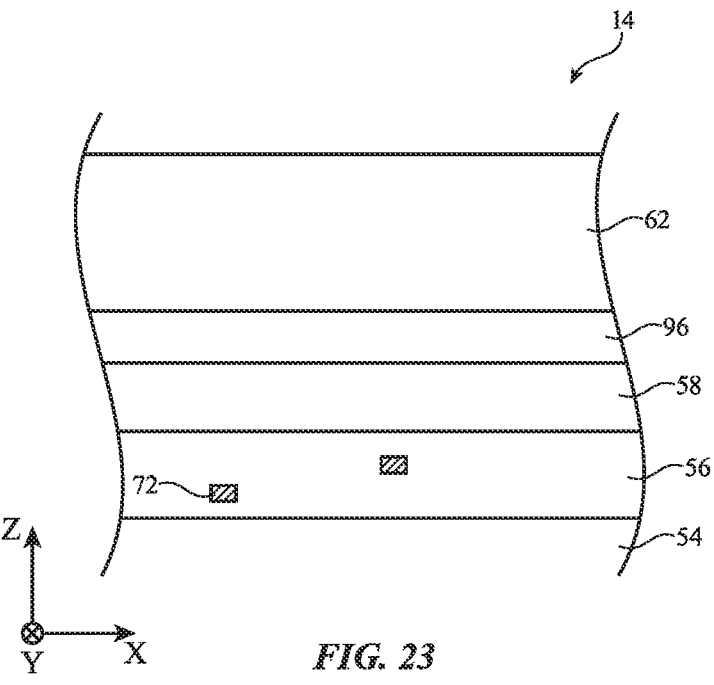
FIG. 23 is a cross-sectional side view of an illustrative display with a phase separated opaque masking layer in accordance with various embodiments.

In FIG. 23, a phase separated opaque masking layer 96 is formed between planarization layers 62 and 58. To form phase separated opaque masking layer 96, a solution may be formed on planarization layer 58. The solution may include a polymer binder, a black material (e.g., carbon black particles), and a low refractive index additive. The low refractive index additive may have a low surface free energy (SFE). After the solution is deposited, the solution may be heated in a vacuum chamber dry (VCD) step. The heat from the VCD step causes phase separation in the solution, with the low refractive index additive migrating to the surface of the phase separated opaque masking layer. The resulting phase separated opaque masking layer has a refractive index gradient at its upper surface. This refractive index gradient may mitigate reflections at the interface between the opaque masking layer and a subsequently deposited planarization layer (62).

Figure 24:
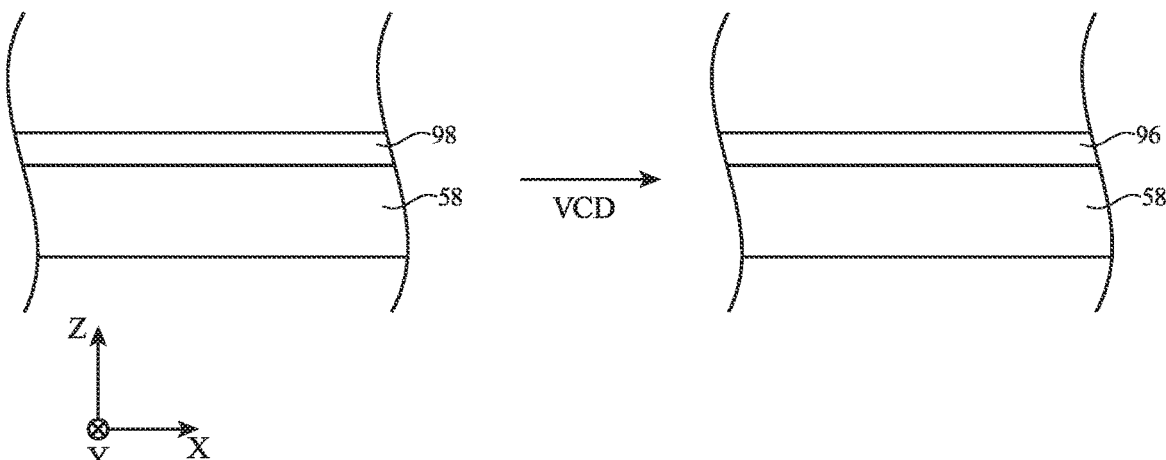
FIG. 24 is a diagram showing an illustrative method for forming a phase separated layer such as the phase separated opaque masking layer of FIG. 23 in accordance with various embodiments.

FIG. 24 is a diagram showing an illustrative method for forming the phase separated opaque masking layer 96. As shown in FIG. 24, a solution coating 98 is initially deposited on planarization layer 58. As previously mentioned, solution coating 98 may include a polymer binder, a black material (e.g., carbon black particles), and a low refractive index additive. The solution coating 98 may also include a solvent. The solution is then heated in a vacuum chamber (sometimes referred to as a vacuum chamber dry step) to cause phase separation and/or curing of solution 98 that forms phase separated opaque masking layer 96 (on the right in FIG. 24). During the heating step of FIG. 24, the solution may be heated at a temperature of greater than 100 degrees Celsius, greater than 125 degrees Celsius, greater than 150 degrees Celsius, greater than 200 degrees Celsius, less than 200 degrees Celsius, between 125 degrees Celsius and 175 degrees Celsius, etc. The solution may be heated for at least 5 minutes, at least 15 minutes, at least 25 minutes, at least 45 minutes, less than 45 minutes, between 15 minutes and 45 minutes, etc.

Figure 25:
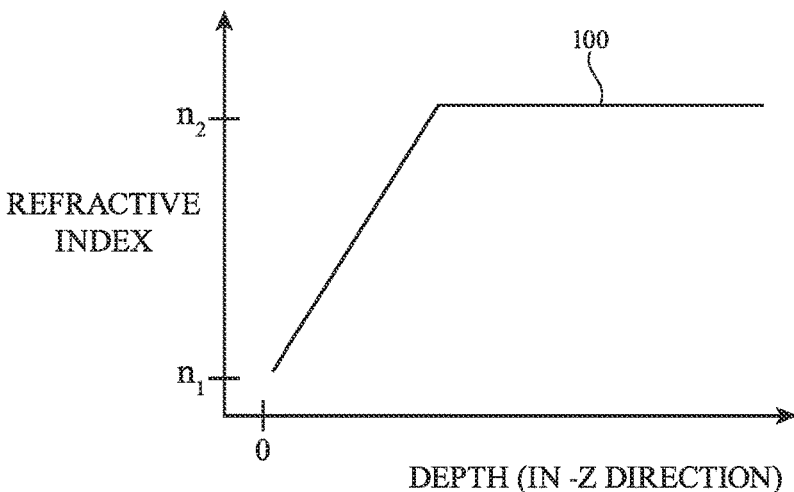
FIG. 25 is a graph of the refractive index of a phase separated layer such as the phase separated opaque masking layer of FIG. 23 as a function of depth in accordance with various embodiments.

FIG. 25 is a graph of the refractive index of phase separated opaque masking layer 96 as a function of depth (in the negative Z-direction). As shown by profile 100 in FIG. 25, the phase separated opaque masking layer 96 has a minimum refractive index $n_1$ at a depth of 0 (e.g., at the upper surface of the phase separated opaque masking layer 96). The refractive index then gradually increases in the negative Z-direction. As shown in FIG. 25, the refractive index may reach a maximum refractive index $n_2$ at a given depth in the phase separated opaque masking layer 96. The refractive index then remains approximately constant (at $n_2$) in the negative Z-direction to the lower surface of the phase separated opaque masking layer 96.

The low refractive index additive in the phase separated opaque masking layer 96 may have a surface free energy (in units of mN/m) of less than 50, less than 40, less than 30, less than 20, etc. This property may cause the low refractive index additive to migrate to the upper surface of phase separated opaque masking layer 96 during the vacuum chamber dry step of FIG. 24. The low refractive index additive in the phase separated opaque masking layer 96 may include polyhedral oligomeric silsesquioxane (POSS), pentane, hexane, octane, benzene, or any other desired base molecule. The low refractive index additive in the phase separated opaque masking layer 96 may be fluorinated (e.g., fluorine is added to the base molecule). Including fluorine in the additive may lower the surface free energy (SFE) of the additive, ensuring that the low refractive index additive migrates to the surface during phase separation.

The magnitude of $n_1$ in FIG. 25 (e.g., the refractive index at the upper surface of phase separated opaque masking layer 96 that is adjacent to planarization layer 62) may be less than 1.5, less than 1.45, between 1.35 and 1.45, greater than 1.3, etc. The difference between $n_1$ in FIG. 25 and the refractive index of planarization layer 62 may be less than 0.3, less than 0.2, less than 0.1, less than 0.05, less than 0.03, less than 0.01, etc.

The magnitude of $n_2$ in FIG. 25 (e.g., the refractive index at the lower surface of phase separated opaque masking layer 96 that is adjacent to planarization layer 58) may be greater than 1.5, greater than 1.6, greater than 1.65, less than 1.9, less than 1.8, between 1.65 and 1.75, etc. The difference between $n_2$ in FIG. 25 and the refractive index of planarization layer 58 may be less than 0.3, less than 0.2, less than 0.1, less than 0.05, less than 0.03, less than 0.01, etc.

The difference between $n_1$ and $n_2$ in phase separated opaque masking layer 96 may be greater than 0.5, greater than 0.3, greater than 0.2, greater than 0.1, greater than 0.05, greater than 0.01, etc.

The refractive index of phase separated opaque masking layer 96 may vary across a depth of at least 10 nanometers, at least 20 nanometers, at least 30 nanometers, less than 40 nanometers, less than 30 nanometers, between 10 nanometers and 30 nanometers, etc. The total thickness of phase separated opaque masking layer 96 may be greater than 1 micron, greater than 2 microns, greater than 3 microns, greater than 4 microns, etc. The refractive index of phase separated opaque masking layer 96 may vary across a depth that is less than 20% of the total thickness of the phase separated opaque masking layer, less than 15% of the total thickness of the phase separated opaque masking layer, less than 10% of the total thickness of the phase separated opaque masking layer, less than 5% of the total thickness of the phase separated opaque masking layer, greater than 5% of the total thickness of the phase separated opaque masking layer, greater than 10% of the total thickness of the phase separated opaque masking layer, between 5% and 15% of the total thickness of the phase separated opaque masking layer, etc.

In FIGS. 23-25, a phase separation layer is used for refractive index matching between planarization layers 58 and 62. This example is merely illustrative. If desired, the same concept of a phase separation layer with a refractive index gradient may be used for refractive index matching between any desired layers in display 14. For example, a phase separation layer may be included for refractive index matching between planarization layer 62 and polarizer 64, opaque masking layer 60, color filter layer 92 (in FIG. 21), and/or microlens 74 (in FIGS. 10 and 11), a phase separation layer may be included for refractive index matching between diffuser 68 and opaque masking layer 60 and/or a color filter layer, etc. In general, any two layers in display 14 may have an intervening phase separation layer with a refractive index gradient for refractive index matching.

In FIGS. 23-25, the phase separation layer has a varying refractive index for mitigating reflections using refractive index matching. This example is merely illustrative. If desired, a phase separation layer formed using a similar technique as FIG. 24 may be used for other purposes. The phase separation layer may selectively alter the hydrophobicity or roughness of a layer in the display, as examples. For example, a layer in display 14 such as planarization layer 62 may be formed using a phase separation technique. The planarization layer 62 may include an additive with a higher hydrophilicity than the bulk material for the planarization layer. During phase separation, the high-hydrophilicity additive migrates to the surface of the planarization layer. A surface of the planarization layer may therefore have a higher hydrophilicity due to the phase separation. This may improve compatibility between the planarization layer and an adjacent layer, as one example. An opaque masking layer or color filter layer in the display may also include a high-hydrophilicity additive in a similar manner (e.g., to promote adhesion to an adjacent layer). As another example, diffuser 68 (or another layer in the display) may include large molecules (e.g., metal oxide) that may result in an undesirably rough surface. A phase separation additive may be included in the layer that is formed from a small molecule. The small molecule may migrate to the surface during phase separation, improving the planarization of the layer (e.g., the diffuser).

As another example, diffuser 68, planarization layer 58, insulating layers 56 and/or another display layer may include a leaching blocking additive that migrates to the surface during a phase separation process. The leaching blocking additive may block potentially problematic materials (e.g., fluorine from planarization layer 62) from diffusing into the layer and damaging display components such as LEDs 22. The leaching blocking additive may form a cross-linked layer at the surface of the layer during phase separation, improving the blocking efficiency of the phase separation layer at that surface.

In general, a phase separation layer formed using the technique of FIG. 24 may ultimately (after phase separation) have an additive with a concentration at a maximum at one surface of the layer and a concentration gradient with increasing depth into the phase separation layer. Properties impacted by the additive (e.g., hydrophilicity, refractive index, planarity, blocking efficiency, etc.) may therefore follow this same profile (with a local maximum/minimum at the surface and a gradient with increasing depth into the phase separation layer).

Figure 26:
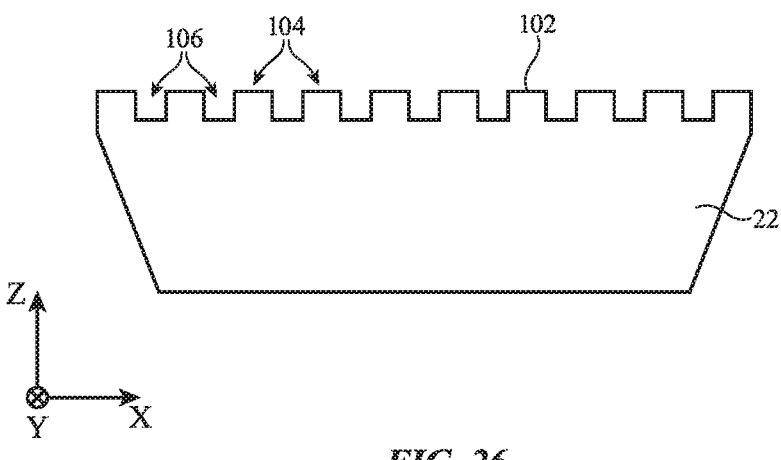
FIG. 26 is a cross-sectional side view of an illustrative light-emitting diode with a corrugated upper surface in accordance with various embodiments.

Another possible technique to mitigate visible artifacts in display 14 is using LEDs with a non-planar upper and/or lower surface. FIG. 26 is a cross-sectional side view of an illustrative LED with a corrugated upper surface. As shown in FIG. 26, the upper surface 102 of LED 22 may have alternating ridges 104 and troughs 106. The ridges and troughs may extend along longitudinal axes parallel to the Y-axis (into and out of the page in FIG. 26). The corrugated upper surface of FIG. 26 may prevent visible artifacts associated with reflections off of LEDs 22.

Figure 27:
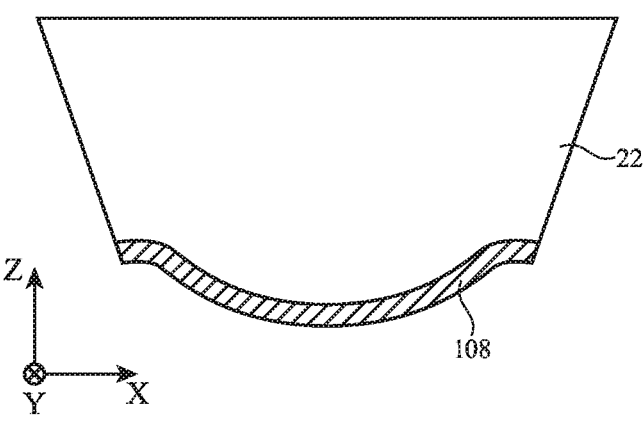
FIG. 27 is a cross-sectional side view of an illustrative light-emitting diode with a non-planar reflective lower surface in accordance with various embodiments.

In another possible arrangement, shown in FIG. 27, LED 22 may have a lower surface defined by metal layer 108. Metal layer 108 may sometimes be referred to as p-metal (because the metal serves as a contact for a p-type semiconductor in LED 22). Metal layer 108 may have a reflectance that is greater than 50%, greater than 70%, greater than 80%, greater than 90%, greater than 99%, etc. As shown in FIG. 27, metal layer 108 is non-planar. The metal layer may have curvature along one dimension (e.g., along the X-axis as shown in FIG. 27). The metal layer may optionally have curvature along two dimensions (e.g., along the X-axis and the Y-axis). In FIG. 27, metal layer 108 has convex curvature (e.g., extending in the negative Z-direction). This example is merely illustrative. Metal layer 108 may instead have concave curvature or irregular curvature. The non-planar lower surface of LED 22 defined by metal layer 108 may prevent visible artifacts associated with reflections off of LEDs 22.

In some electronic devices, it may be desirable for an optical sensor such as an ambient light sensor or camera to operate through display 14. In other words, the optical sensor is positioned within the active area of display 14. Ambient light may pass through the display stack (that includes LEDs 22) to reach the sensor.

Figure 28:
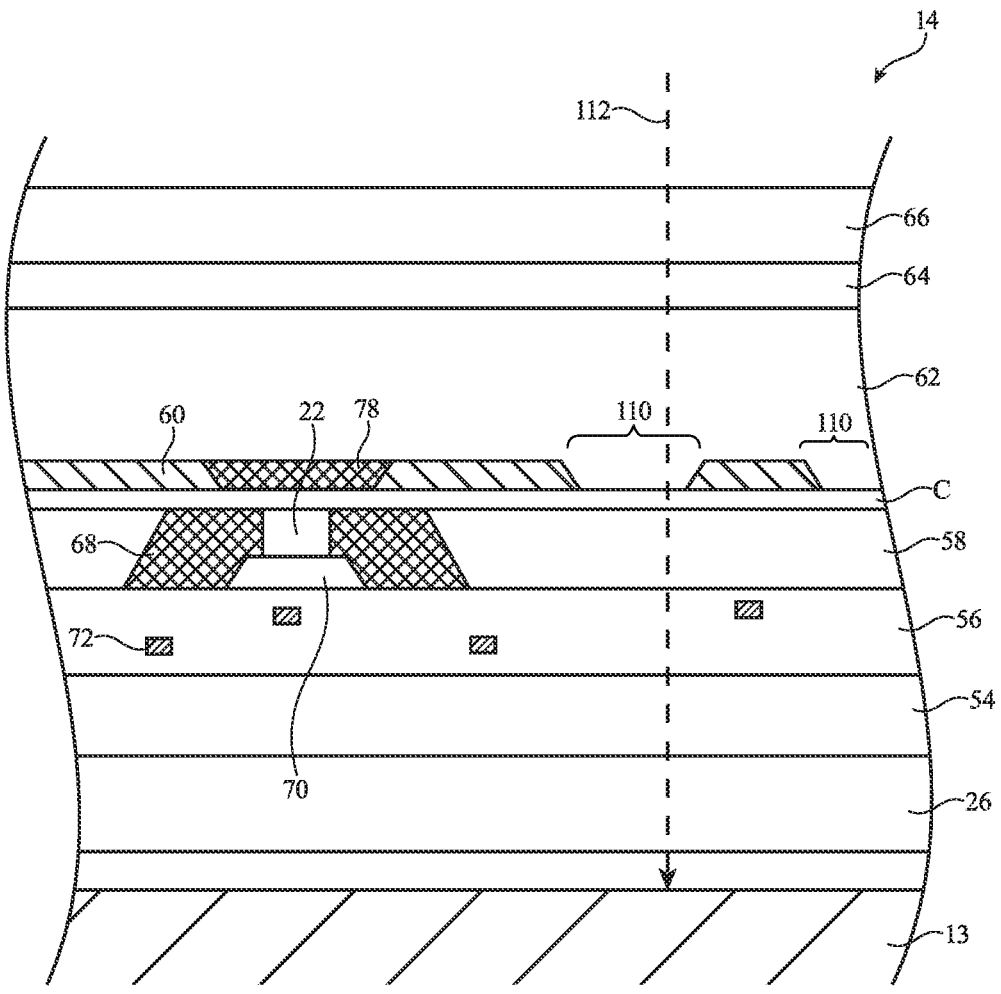
FIG. 28 is a cross-sectional side view of an illustrative display with a polarizer, light-emitting diodes, and an opaque masking layer with openings that overlap a sensor in accordance with various embodiments.

FIG. 28 is a cross-sectional side view of a display that overlaps an optical sensor 13. The display may have any of the display arrangements described herein (e.g., the arrangement of FIG. 14 with a diffuser 78 that overlaps LED 22). To allow more ambient light 112 to reach sensor 13, opaque masking layer 60 may have one or more additional openings 110 that do not overlap any LEDs. Openings 110 may allow additional ambient light to pass through the layers of display 14 and ultimately be sensed by sensor 13. Openings 110 may be positioned to overlap portions of the display stack with the highest transmission (e.g., portions with the least backplane metal 72). Openings 110 may be positioned over portions of insulating layers 56 with the lowest density of backplane metal 72. Without the opaque masking layer blocking the ambient light (e.g., in opening regions 110), the amount of ambient light that reaches sensor 13 is much greater.

In the example of FIG. 28, a diffuser 78 fills the openings in opaque masking layer 60 that overlaps LEDs 22. This example is merely illustrative. If desired, diffuser 78 may be omitted from the openings in opaque masking layer 60 over LEDs 22.

Figure 29:
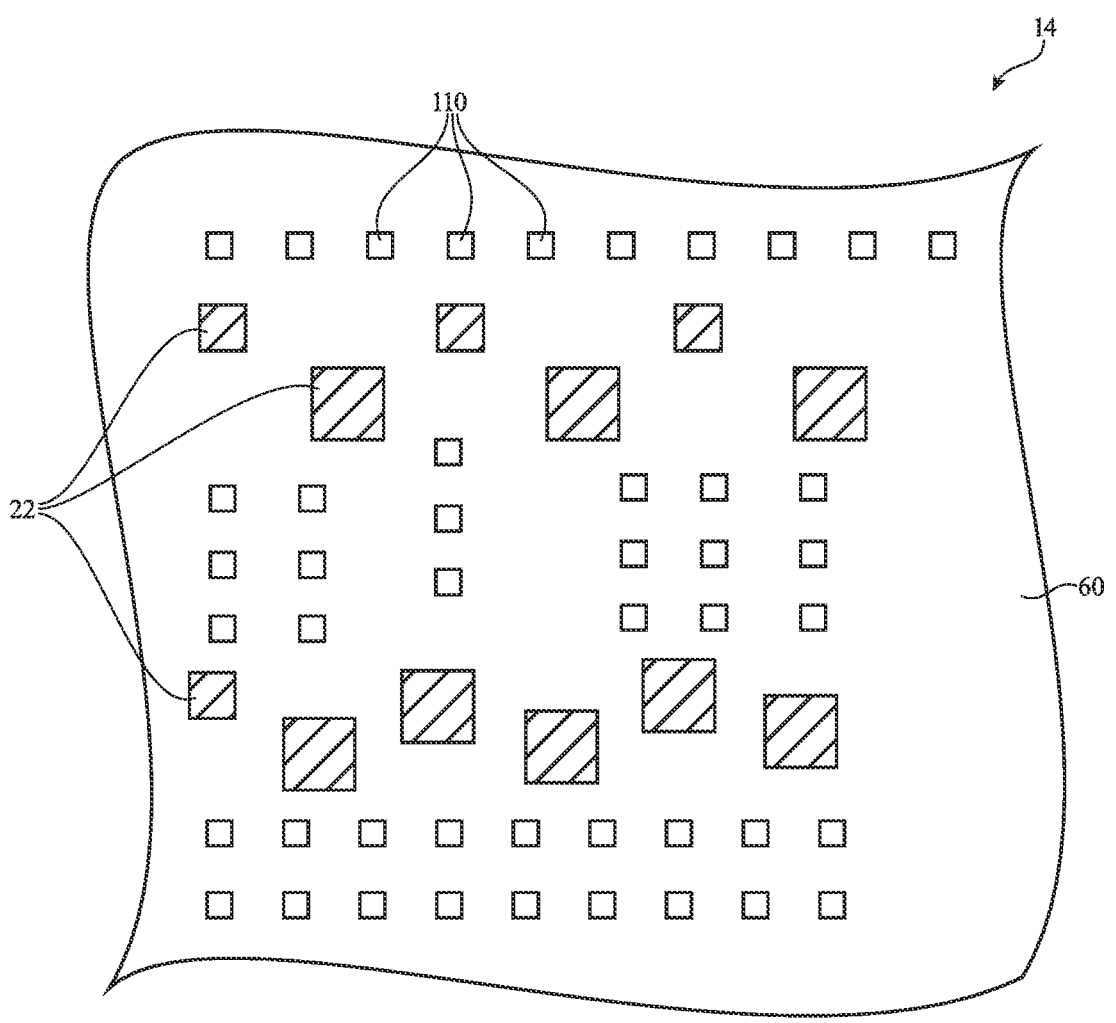
FIG. 29 is a top view of the illustrative display of FIG. 28 in accordance with various embodiments.

FIG. 29 is a top view of the illustrative display of FIG. 28. As shown in FIG. 29, LEDs 22 are distributed across the display. Opaque masking layer 60 has openings that accommodate LEDs 22. Opaque masking layer additionally has openings 110 that allow for ambient light to pass through the display to sensor 13. The size, shape, and arrangement of openings 110 may be selected based on the density of the underlying backplane metal and/or to mitigate diffraction artifacts in the images sensed by sensor 13. In general, openings 110 may have any desired arrangement.

In some cases, a sensor may operate through a display that includes a blanket top diffuser (e.g., of the type shown in FIG. 15). In this type of arrangement (shown in FIG. 30), diffuser 78 may be removed (omitted) under portions of opaque masking layer 60 with openings 110. The opaque masking layer therefore has some portions formed on the top diffuser (e.g., on the left of FIG. 30) and some portions formed on cathode line C and/or planarization layer 58 without an intervening top diffuser.

Figure 31:
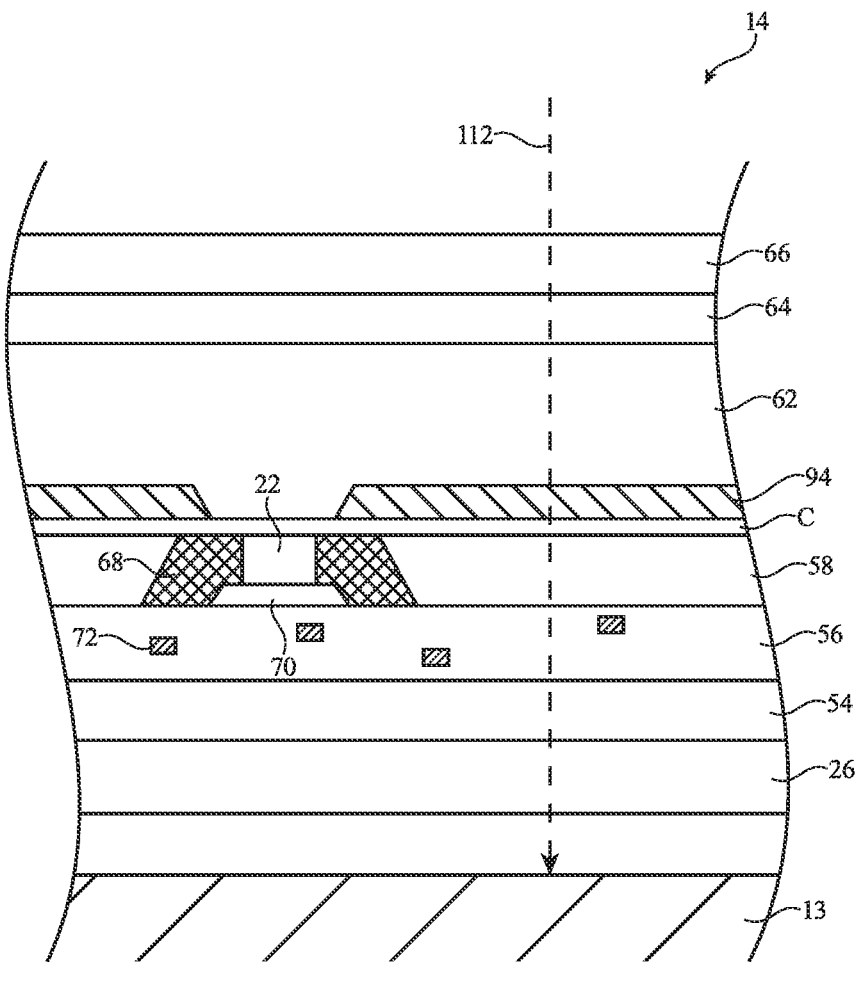
FIG. 31 is a cross-sectional side view of an illustrative display with a polarizer, light-emitting diodes, and a low-optical-density opaque masking layer that overlaps a sensor in accordance with various embodiments.

FIG. 31 is a cross-sectional side view of another arrangement for a display that overlaps a sensor. In this example, a low-optical-density opaque masking layer 94 (e.g., of the type shown and discussed in connection with FIG. 22) is formed between planarization layers 62 and 58. Opaque masking layer 94 may have an index of refraction that is similar to the index of refraction of planarization layer 62. For example, the difference between the indices of refraction of opaque masking layer 94 and layer 62 may be less than 0.3, less than 0.2, less than 0.1, less than 0.05, less than 0.03, less than 0.01, etc. The total transmission of opaque masking layer 94 may be more than 5%, more than 15%, more than 25%, more than 40%, more than 50%, more than 70%, etc. The total thickness of layer 94 may be greater than 1 micron, greater than 2 microns, greater than 3 microns, greater than 4 microns, etc.

The opacity of low-optical-density opaque masking layer 94 in FIG. 31 may be sufficiently low to allow ambient light 112 to pass through the display stack to sensor 13. Therefore, openings 110 (from FIGS. 28 and 30) are not required in low-optical-density opaque masking layer 94.

Figure 32:
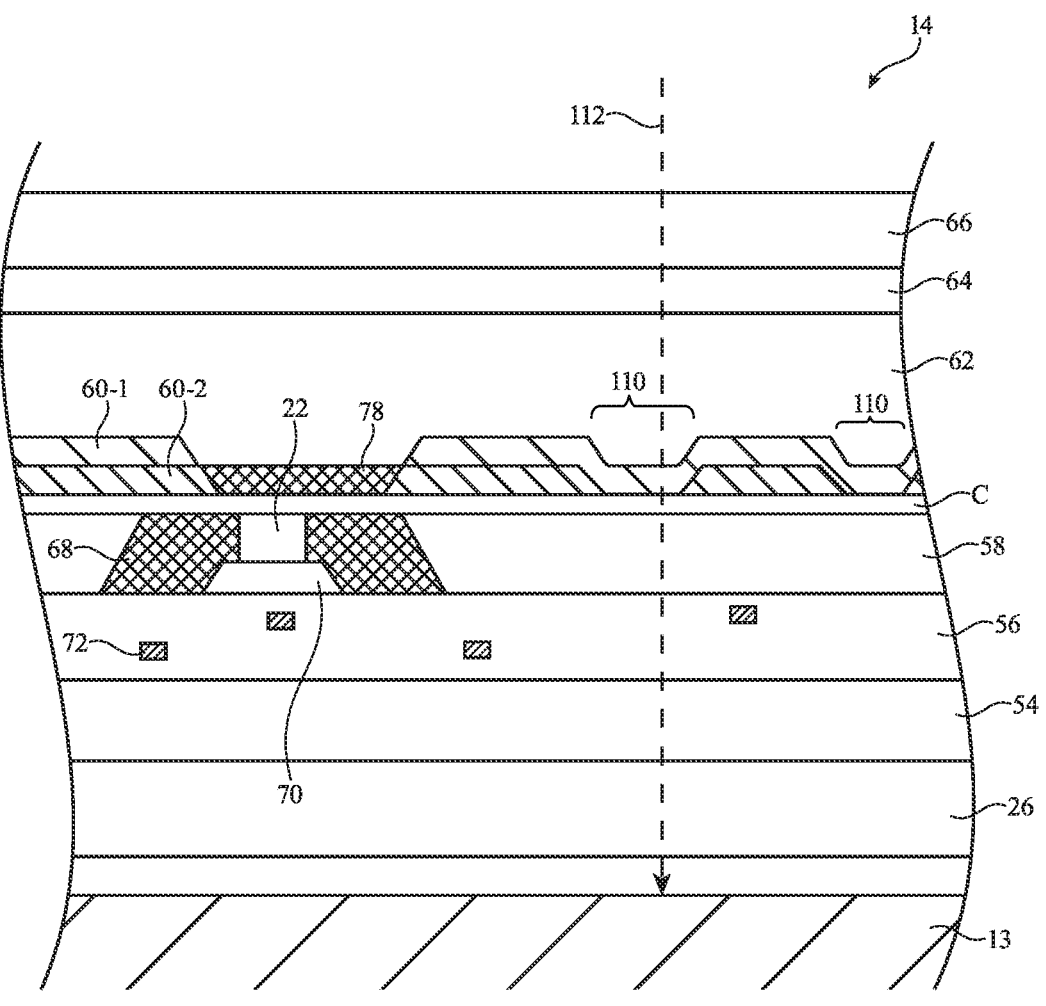
FIG. 32 is a cross-sectional side view of an illustrative display with a polarizer, light-emitting diodes, and first and second opaque masking layers having different properties that are formed over a sensor in accordance with various embodiments.

FIG. 32 is a cross-sectional side view of another arrangement for a display that overlaps a sensor. In this example, two opaque masking layers 60-1 and 60-2 are used (as discussed in detail in connection with FIG. 21). When this type of opaque masking layer is formed over sensor 13, openings 110 may be formed in opaque masking layer 60-2 (with the higher opacity) but not in opaque masking layer 60-1 (with the lower opacity). As shown in FIG. 32, opaque masking layer 60-1 is formed in the openings 110 in opaque masking layer 60-2. This example is merely illustrative and openings 110 may be formed in both layers 60-1 and 60-2 if desired. Selectively removing portions of opaque masking layer 60-2 in openings 110 allows for more ambient light 112 to reach sensor 13.

In the aforementioned embodiments, display 14 includes a polarizer 64 (e.g., a circular polarizer). Polarizer layer 64 may be a circular polarizer layer 64 that includes a linear polarizer and a quarter wave plate. The circular polarizer may mitigate reflections of ambient light off of display 14. As a consequence of mitigating the reflections of ambient light, polarizer 64 also mitigates the brightness of display light emitted by LEDs 22 in display 14. Therefore, to increase the efficiency of the display, polarizer 64 may sometimes be omitted. In this type of arrangement (e.g., shown in FIG. 33), there is no polarizer between LEDs 22 and display cover layer 66. These types of displays may be referred to as polarizer-free displays.

Figure 33:
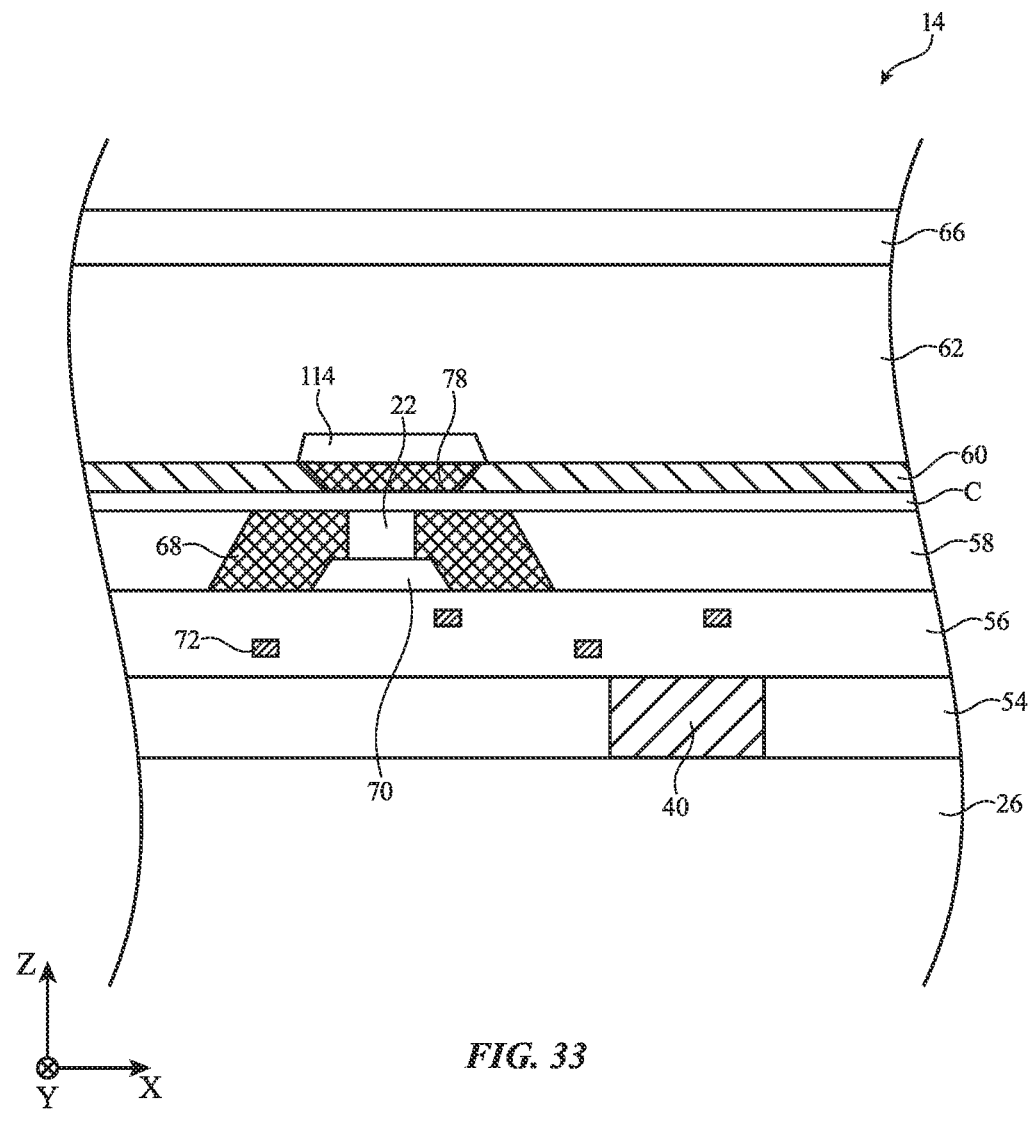
FIG. 33 is a cross-sectional side view of an illustrative polarizer-free display with light-emitting diodes that are overlapped by patterned top diffusers and color filter layers in accordance with various embodiments.

FIG. 33 is a cross-sectional side view of a polarizer-free display. As shown in FIG. 33, the arrangement of the display is similar to the previously described displays with polarizers. It should be noted that, herein, descriptions of components that are already described in connection with another figure may be omitted for brevity.

In FIG. 33, LED 22 is formed on a spacer 70 and may be laterally surrounded by diffuser 68. An opaque masking layer 60 is formed over planarization layer 58 and cathode line C. The opaque masking layer has openings to allow light from LED 22 to pass through to the viewer. An additional diffuser 78 (sometimes referred to as a top diffuser) is formed in the opening of opaque masking layer 60.

In addition to diffuser 78, each LED 22 may be covered by a color filter layer 114. Color filter layer 114 may mitigate undesired ambient light reflections off of diffuser 78 and/or LED 22 while still passing through light emitted by LED 22. For example, if LED 22 emits red light, then color filter layer 114 may be a red color filter layer that passes red light while blocking other colors of light. If LED 22 emits blue light, then color filter layer 114 may be a blue color filter layer that passes blue light while blocking other colors of light. If LED 22 emits green light, then color filter layer 114 may be a green color filter layer that passes green light while blocking other colors of light.

Figure 34:
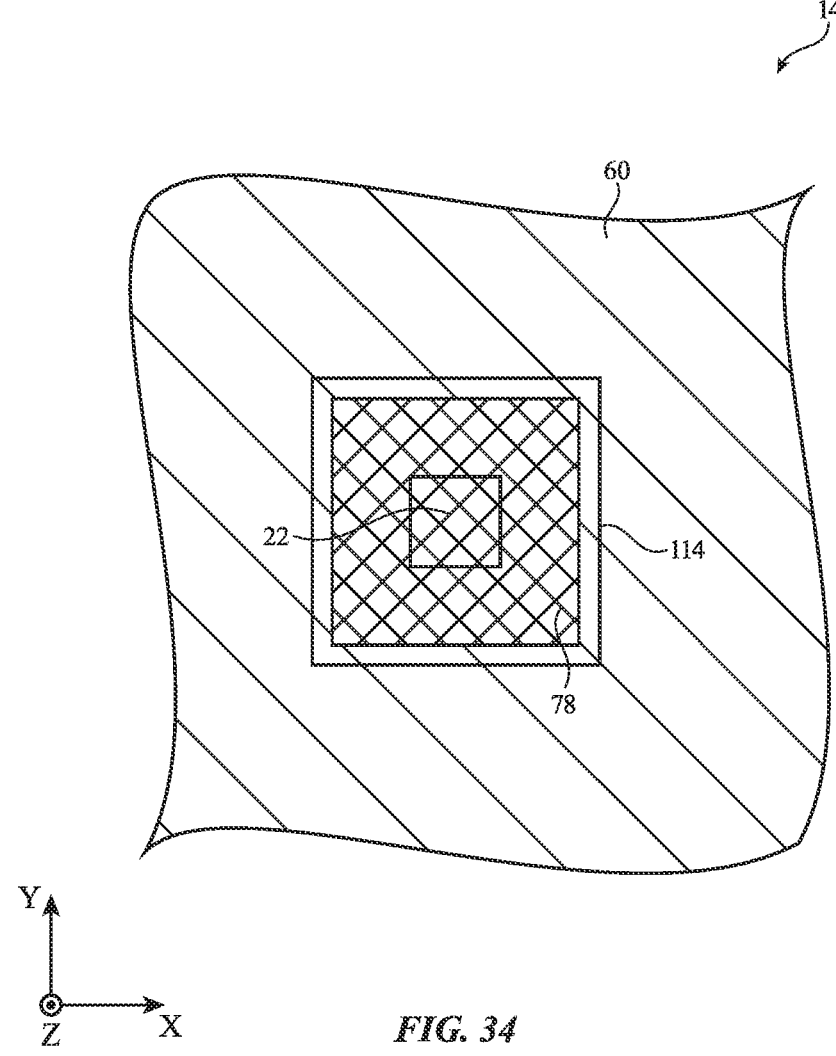
FIG. 34 is a top view of the illustrative polarizer-free display of FIG. 33 in accordance with various embodiments.

FIG. 34 is a top view of a pixel in the polarizer-free display of FIG. 33. As shown, diffuser 78 overlaps LED 22. Color filter layer 114 is then formed on top of both LED 22 and top diffuser 78.

In FIGS. 33 and 34, diffuser 68 is patterned out except for the area around the inorganic light-emitting diode. This may allow for higher transmission through the display to optical sensors under display, as one example. This example is merely illustrative. In another possible arrangement, diffuser 68 may be a blanket layer that extends across the display throughout planarization layer 58. In other words, all of planarization layer 58 may include embedded nanoparticles such that all of planarization 58 serves as a diffuser layer. In all of the polarizer-free displays herein with a side-diffuser 68, the side-diffuser may be patterned to only be included in the area around the inorganic light-emitting diodes (as in FIG. 33) or the side-diffuser may be a blanket layer that completely covers the display (e.g., all of planarization layer 58 serves as a diffuser layer).

Figure 35:
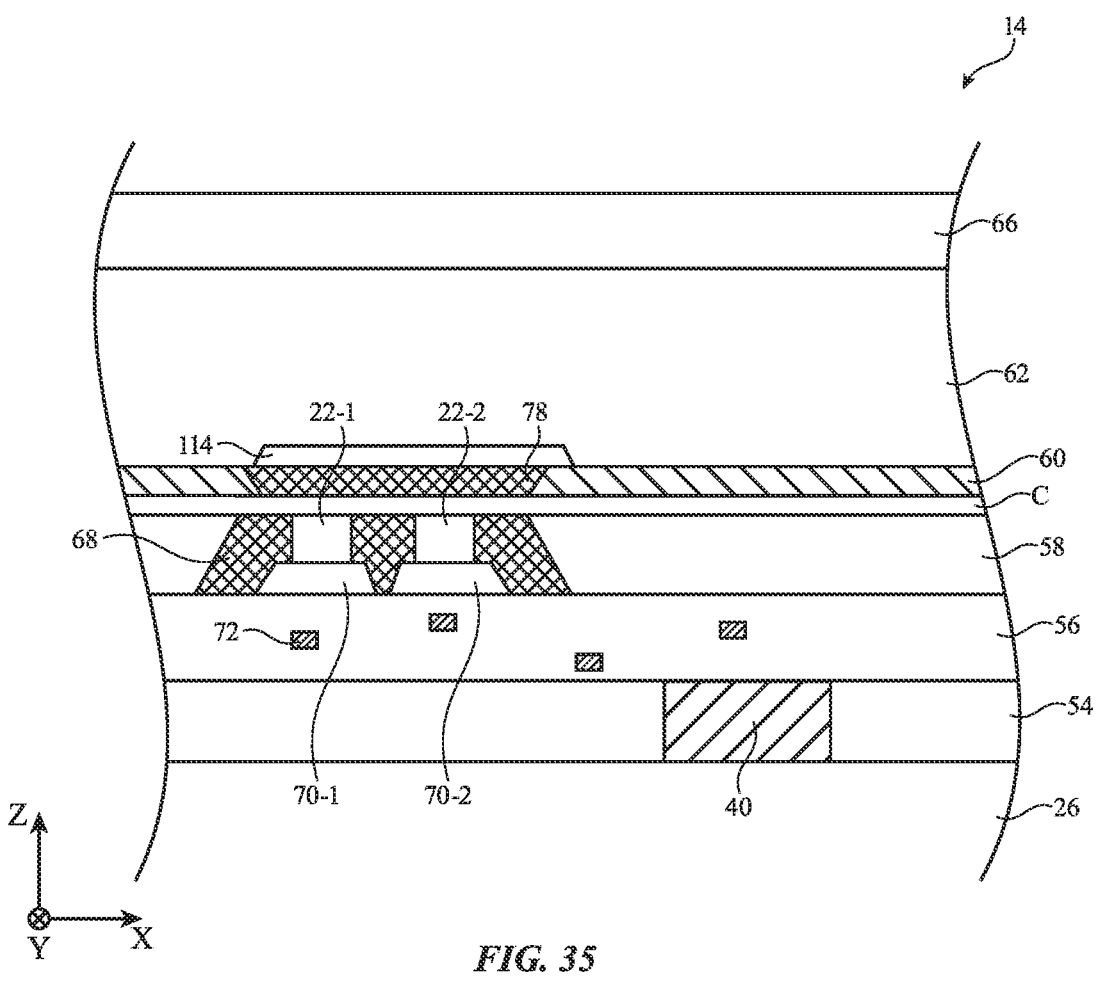
FIG. 35 is a cross-sectional side view of an illustrative polarizer-free display with redundant light-emitting diodes that are overlapped by patterned top diffusers and color filter layers in accordance with various embodiments.

In another possible arrangement, a redundant LED may be included for each LED in the polarizer-free display. FIG. 35 is a cross-sectional side view of an illustrative polarizer-free display with a redundant LED. As shown, first and second spacers 70-1 and 70-2 are formed on the upper surface of insulating layer(s) 56. A first LED 22-1 is formed on the upper surface of spacer 70-1 and a second LED 22-2 is formed on the upper surface of spacer 70-2. Each one of LEDs 22-1 and 22-2 may be electrically connected to cathode line C.

Including the redundant LED may allow for the possibility of manufacturing error in LED 22. In other words, the manufacturing process of LEDs 22 may result in a small percentage of LEDs 22 being inoperable. If one of the LEDs is inoperable, the redundant LED may be used for display 14 instead (in the likely event that the redundant LED is operable). LEDs 22-1 and 22-2 may therefore be LEDs of the same color (e.g., both configured to emit red light, both configured to emit green light, both configured to emit blue light, etc.).

As shown in FIG. 35, diffuser 68 may be interposed between LEDs 22-1 and 22-2 as well as formed around the periphery of LEDs 22-1 and 22-2. A single opening in opaque masking layer 60 is formed over LEDs 22-1 and 22-2. Top diffuser 78 is formed in the opening and overlaps both LEDs 22-1 and 22-2. Color filter layer 114 overlaps top diffuser 78. Color filter layer 114 may mitigate undesired ambient light reflections off of diffuser 78 and/or LEDs 22-1 and 22-2 while still passing through light emitted by the LEDs.

Figure 36:
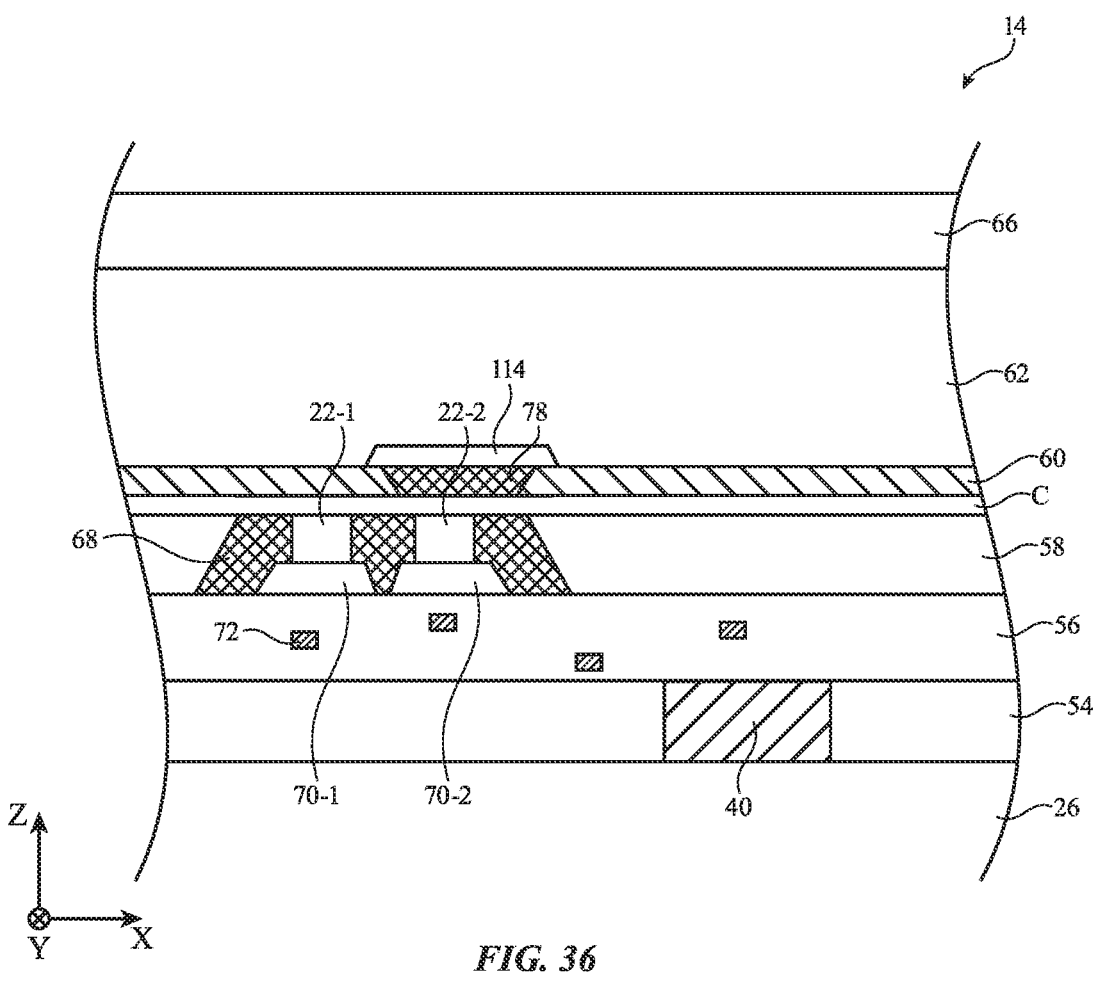
FIG. 36 is a cross-sectional side view of an illustrative polarizer-free display with redundant light-emitting diodes that are overlapped by patterned top diffusers and color filter layers that are both formed using dynamic lithography in accordance with various embodiments.

In FIG. 35, opaque masking layer 60 has an opening that overlaps (in the Z-direction) both LEDs 22-1 and 22-2. This example is merely illustrative. In another possible arrangement, shown in FIG. 36, a dynamic lithography process may be used to cover the unused redundant LED. In other words, the LEDs 22 may be tested to verify which LEDs are functional. Once it is confirmed that one of the LEDs is functional (e.g., LED 22-2 in FIG. 36), the opaque masking layer 60 may be patterned to cover the unused LED (e.g., LED 22-1 in FIG. 36).

Top diffuser 78 and color filter layer 114 may also be formed using dynamic lithography processes. Accordingly, diffuser 78 is formed in the opening in opaque masking layer 60 (overlapping LED 22-2 but not LED 22-1). Similarly, color filter layer 114 is patterned to overlap LED 22-2 and not LED 22-1.

Figure 37:
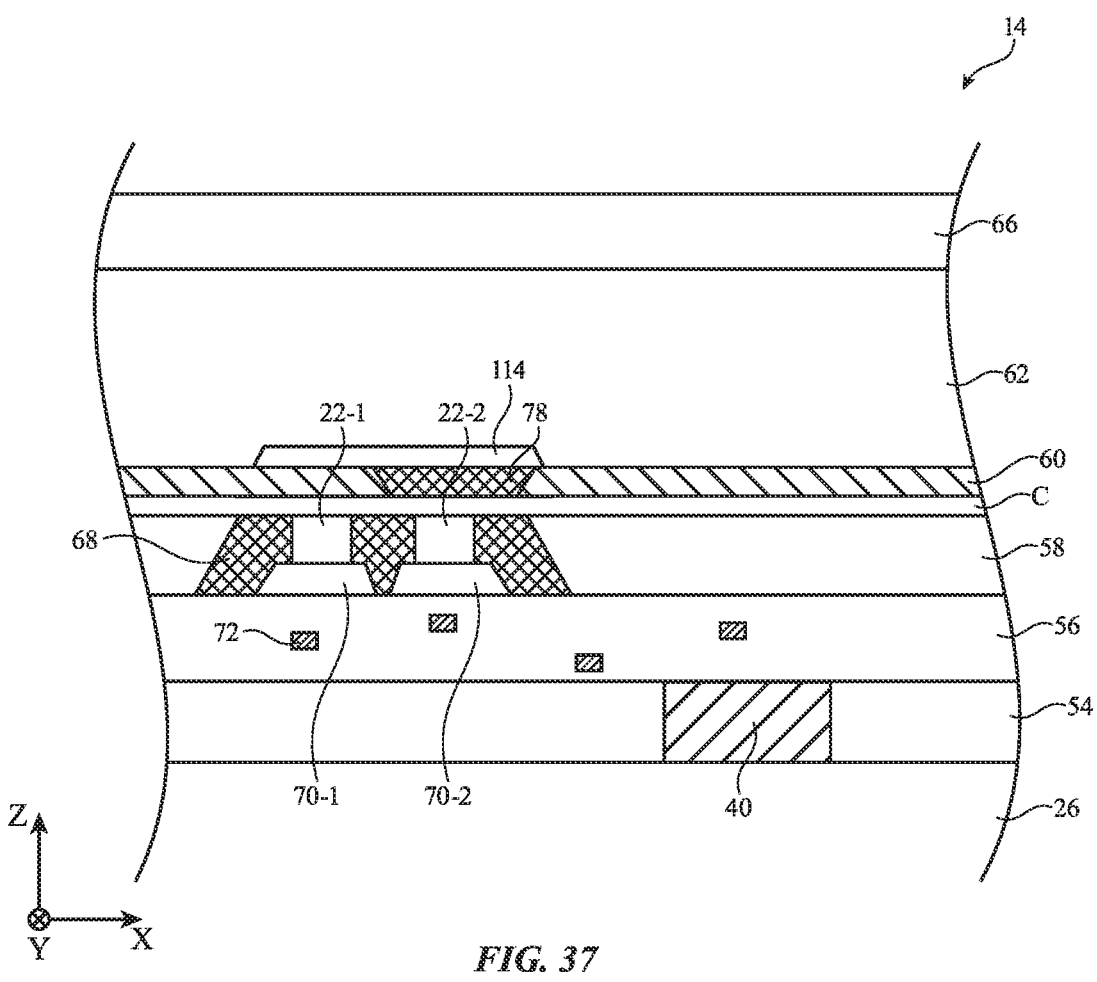
FIG. 37 is a cross-sectional side view of an illustrative polarizer-free display with redundant light-emitting diodes that are overlapped by patterned top diffusers formed using dynamic lithography and color filter layers in accordance with various embodiments.

If desired, to simplify the deposition process of the color filter layers, the color filter layer may overlap both LEDs 22-1 and 22-2 (even if only LED 22-2 emits light through the opaque masking layer opening). As shown in FIG. 37, top diffuser 78 is formed in the opening in opaque masking layer 60 (and overlaps LED 22-2 but not LED 22-1). However, color filter layer 114 is formed over opaque masking layer 60 and top diffuser 78 and overlaps both LEDs 22-1 and 22-2. In other words, opaque masking layer 60 and top diffuser 78 are formed using a dynamic lithography process whereas color filter layer 114 is not formed using a dynamic lithography process.

Figure 38:
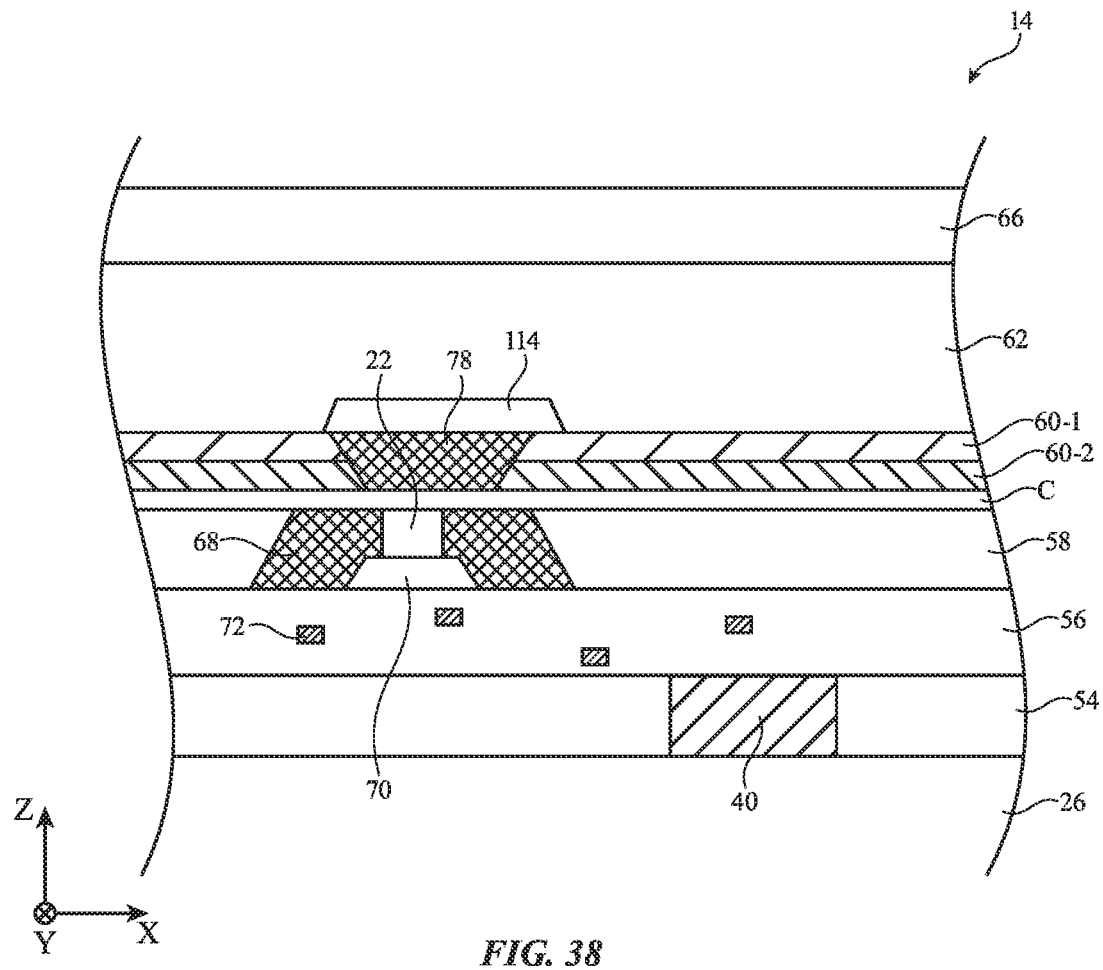
FIG. 38 is a cross-sectional side view of an illustrative polarizer-free display with light-emitting diodes and first and second opaque masking layers having different properties in accordance with various embodiments.

Another possible arrangement for a polarizer-free display is shown in FIG. 38. As shown, two opaque masking layers are used instead of one opaque masking layer in FIG. 38. Top diffuser 78 is formed in an opening formed in both opaque masking layers 60-1 and 60-2. Color filter layer 114 is formed over the upper surface of top diffuser 78 and opaque masking layer 60-1. As shown in FIG. 38, a first opaque masking layer 60-1 is formed on a second opaque masking layer 60-2. The second opaque masking layer 60-2 is formed on planarization layer 58 (with intervening cathode lines C). Opaque masking layer 60-1 may have an index of refraction that is similar to the index of refraction of planarization layer 62. For example, the difference between the indices of refraction of layer 60-1 and layer 62 may be less than 0.3, less than 0.2, less than 0.1, less than 0.05, less than 0.03, less than 0.01, etc. Opaque masking layer 60-2 may have an index of refraction that is similar to the index of refraction of planarization layer 58. For example, the difference between the indices of refraction of layer 60-2 and layer 58 may be less than 0.3, less than 0.2, less than 0.1, less than 0.05, less than 0.03, less than 0.01, etc. The index of refraction of planarization layer 62 may be lower than the index of refraction of planarization layer 58. Accordingly, the index of refraction of opaque masking layer 60-1 may be lower than the index of refraction of opaque masking layer 60-2. The difference in the indices of refraction of layers 60-1 and 60-2 may be greater than 0.5, greater than 0.3, greater than 0.2, greater than 0.1, greater than 0.05, greater than 0.01, etc.

Both opaque masking layers 60-1 and 60-2 in FIG. 38 may be formed from carbon black particles embedded in an organic resin. In one illustrative arrangement, the optical density of opaque masking layer 60-2 may be greater than the optical density of opaque masking layer 60-1 (e.g., by more than 10%, by more than 20%, by more than 50%, by more than 100%, by more than 200%, etc.). The total transmission of opaque masking layer 60-1 may be more than 5%, more than 15%, more than 25%, more than 40%, more than 50%, more than 70%, etc. The total transmission of opaque masking layer 60-2 may be less than 3%, less than 5%, less than 10%, less than 25%, etc. The difference in total transmission between opaque masking layers 60-1 and 60-2 may be more than 5%, more than 15%, more than 25%, more than 40%, more than 50%, more than 70%, etc. As one specific example, layer 62 may have an index of refraction of 1.4. Layer 60-1 may have an index of refraction of 1.6. Layer 60-2 may have an index of refraction of 1.7. Layer 62 may have an index of refraction of 1.8. Reducing the optical density of opaque masking layer 60-1 allows for the index of refraction of layer 60-1 to be lowered relative to layer 60-2.

Figure 39:
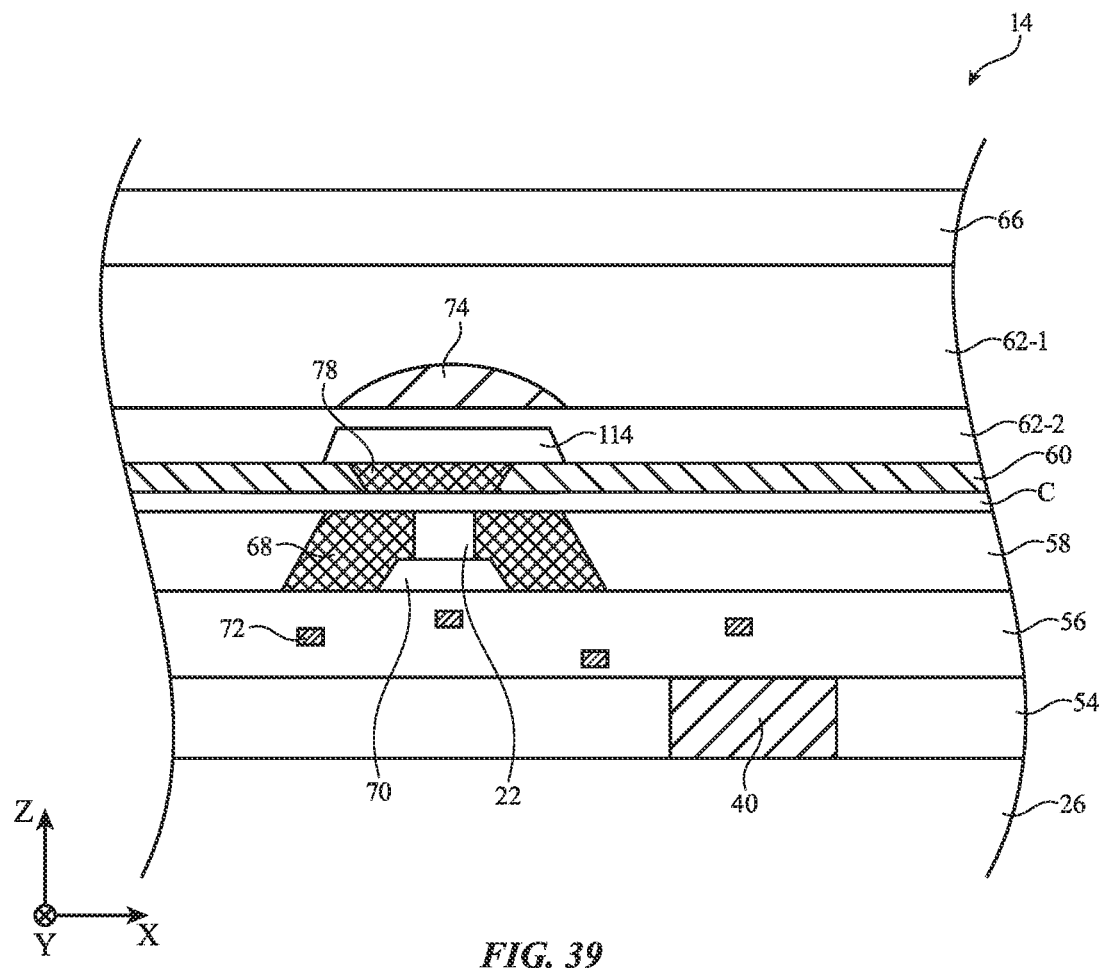
FIG. 39 is a cross-sectional side view of an illustrative polarizer-free display with light-emitting diodes that are overlapped by two planarization layers and microlenses in accordance with various embodiments.

In another possible arrangement, shown in FIG. 39, planarization layer 62 may be split into two layers in the polarizer-free display. A first layer 62-2 may be positioned between LED 22 and a second layer 62-1. Planarization layer 62-2 may have an index of refraction that is less than 1.5, less than 1.45, less than 1.4, less than 1.35, less than 1.3, etc. Planarization layer 62-1 may have an index of refraction that is greater than the index of refraction of layer 62-2 (e.g., by at least 0.05, by at least 0.1, by at least 0.15, by at least 0.2, by at least 0.3, etc.). Planarization layer 62-1 may have an index of refraction that is greater than 1.4, greater than 1.5, greater than 1.6, greater than 1.7, etc.

To extract light from the light-emitting diode (and thereby improve efficiency of the display), one or more microlenses may be formed over the light-emitting diode. In FIG. 39, microlens 74 is formed over the opening in opaque masking layer 60 (and corresponding LED 22) on an upper surface of planarization layer 62-2. Microlens 74 may be formed from an inorganic material or an organic material. Microlens 74 may have an index of refraction that is greater than 1.4, greater than 1.5, greater than 1.7, greater than 1.9, greater than 2.0, less than 2.2, less than 2.0 less than 1.8, less than 1.6, etc.). In FIG. 39, planarization layer 62-2 is interposed between color filter 114 and microlens 74. Planarization layer 62-2 conforms to the upper surface and edges of color filter 114.

Figure 40:
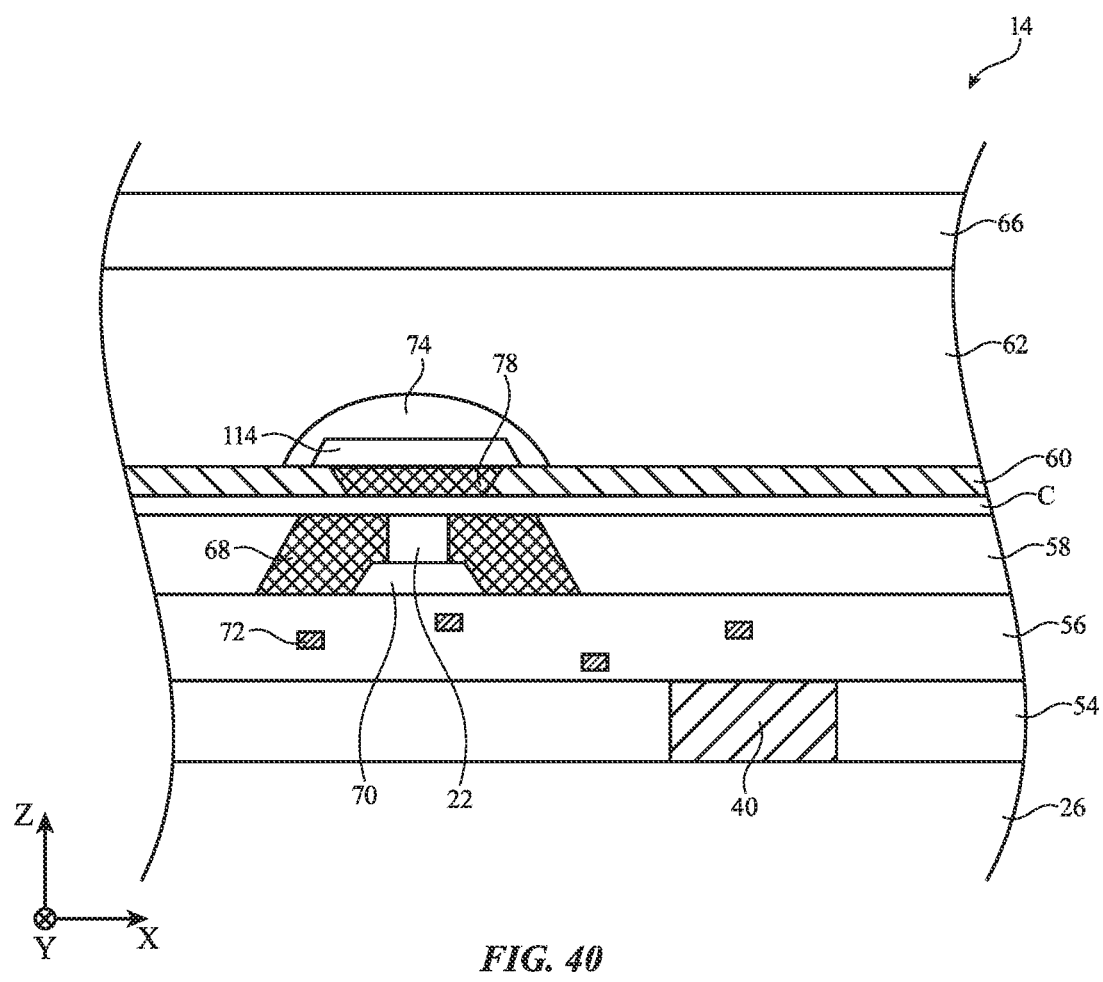
FIG. 40 is a cross-sectional side view of an illustrative polarizer-free display with light-emitting diodes that are overlapped by microlenses in accordance with various embodiments.

The example in FIG. 39 of microlens 74 being formed on planarization layer 62-2 is merely illustrative. In another possible arrangement, shown in FIG. 40, microlens 74 directly conforms to the upper surface and edges color filter layer 114 in a polarizer-free display.

Figure 41:
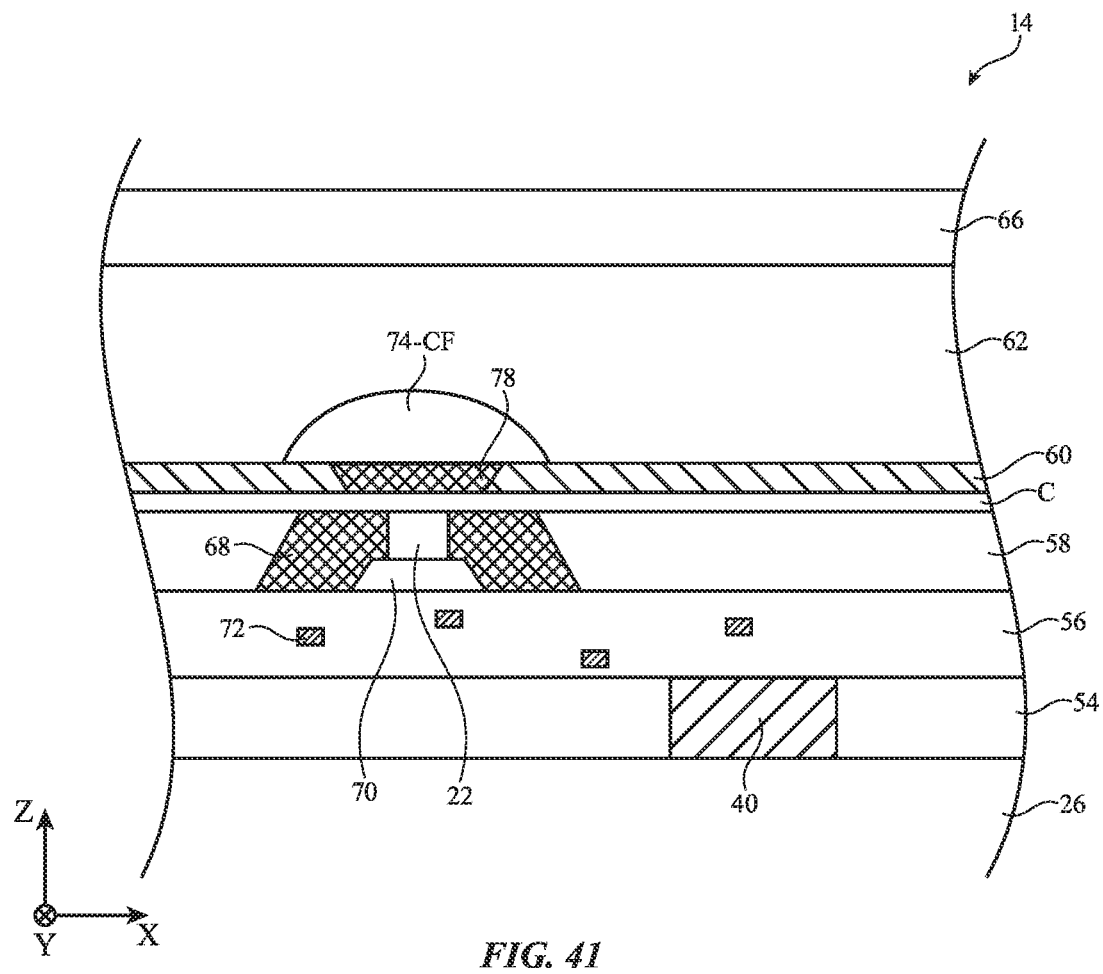
FIG. 41 is a cross-sectional side view of an illustrative polarizer-free display with light-emitting diodes that are overlapped by color-filtering microlenses in accordance with various embodiments.

In yet another possible arrangement for a polarizer-free display, shown in FIG. 41, a color filtering microlens 74-CF is formed over top diffuser 78. Color filtering microlens 74-CF may have a curved upper surface (similar to the previously discussed microlenses). Additionally, microlens 74-CF transmits light from the overlapped LED 22 while blocking other colors of light. If LED 22 emits red light then microlens 74-CF may be a red color filter layer that passes red light while blocking other colors of light. If LED 22 emits blue light then microlens 74-CF may be a blue color filter layer that passes blue light while blocking other colors of light. If LED 22 emits green light then microlens 74-CF may be a green color filter layer that passes green light while blocking other colors of light. When microlens 74-CF serves as a color filter, the dedicated color filter 114 (e.g., from FIG. 40) may be omitted. Microlens 74-CF may be formed from an inorganic material or an organic material. Microlens 74-CF may have an index of refraction that is greater than 1.4, greater than 1.5, greater than 1.7, greater than 1.9, greater than 2.0, less than 2.2, less than 2.0 less than 1.8, less than 1.6, etc.).

Figure 42:
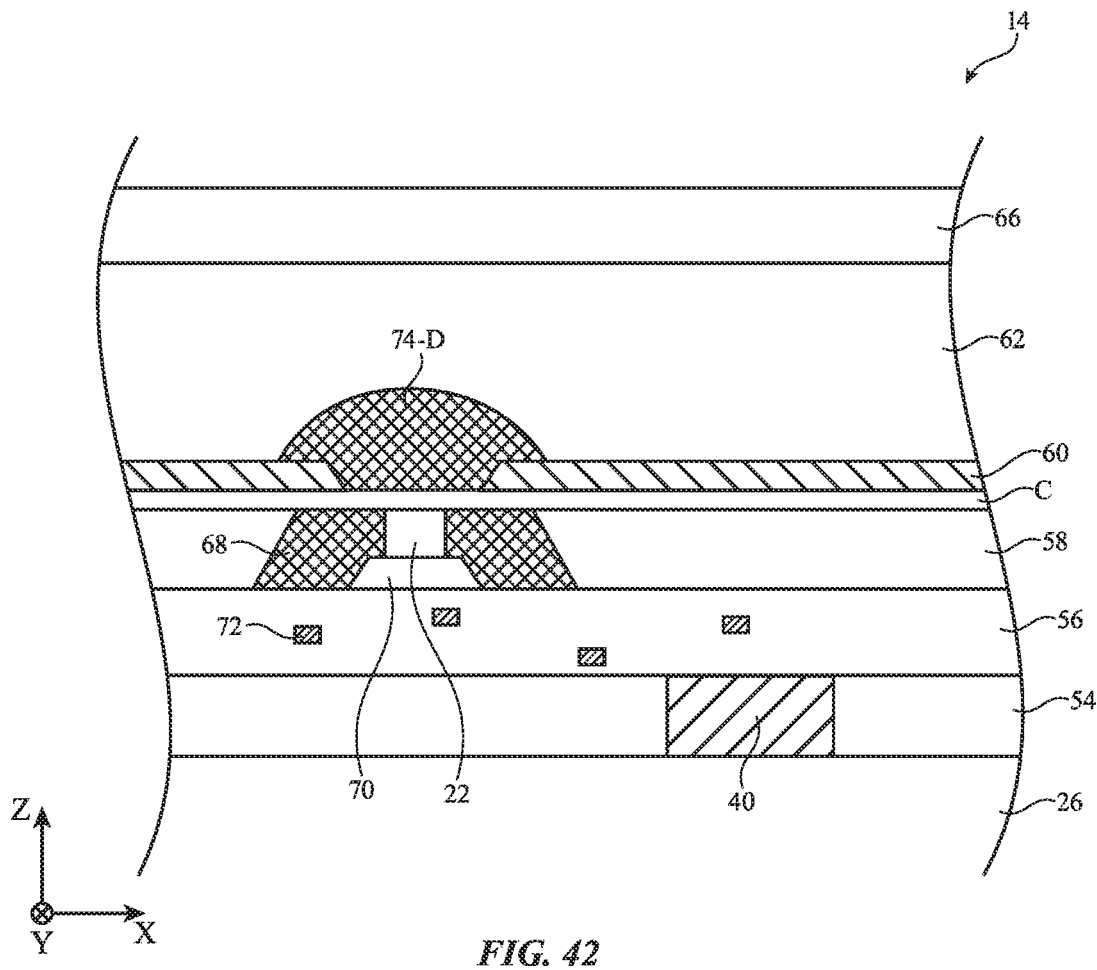
FIG. 42 is a cross-sectional side view of an illustrative polarizer-free display with light-emitting diodes that are overlapped by diffusive microlenses in accordance with various embodiments.

In another possible arrangement, shown in FIG. 42, the color filtering microlens also serves as a diffusing microlens. In other words, nanoparticles (sometimes referred to as diffusive nanoparticles or light scattering nanoparticles) may be distributed throughout diffusing microlens 74-D. Microlens 74-D may serve as a diffusing element when the microlens has color filtering functionality (as in FIG. 42), allowing both the dedicated color filter element 114 and top diffuser 78 to be omitted. In another possible arrangement, microlens 74-D may serve as a diffusing element when the microlens does not have color filtering functionality (e.g., as in FIG. 40), allowing the top diffuser 78 to be omitted (while color filter layer 114 remains present). Microlens 74-D may be formed from an inorganic material or an organic material. Microlens 74-D may have an index of refraction that is greater than 1.4, greater than 1.5, greater than 1.7, greater than 1.9, greater than 2.0, less than 2.2, less than 2.0 less than 1.8, less than 1.6, etc.).

Figure 43:
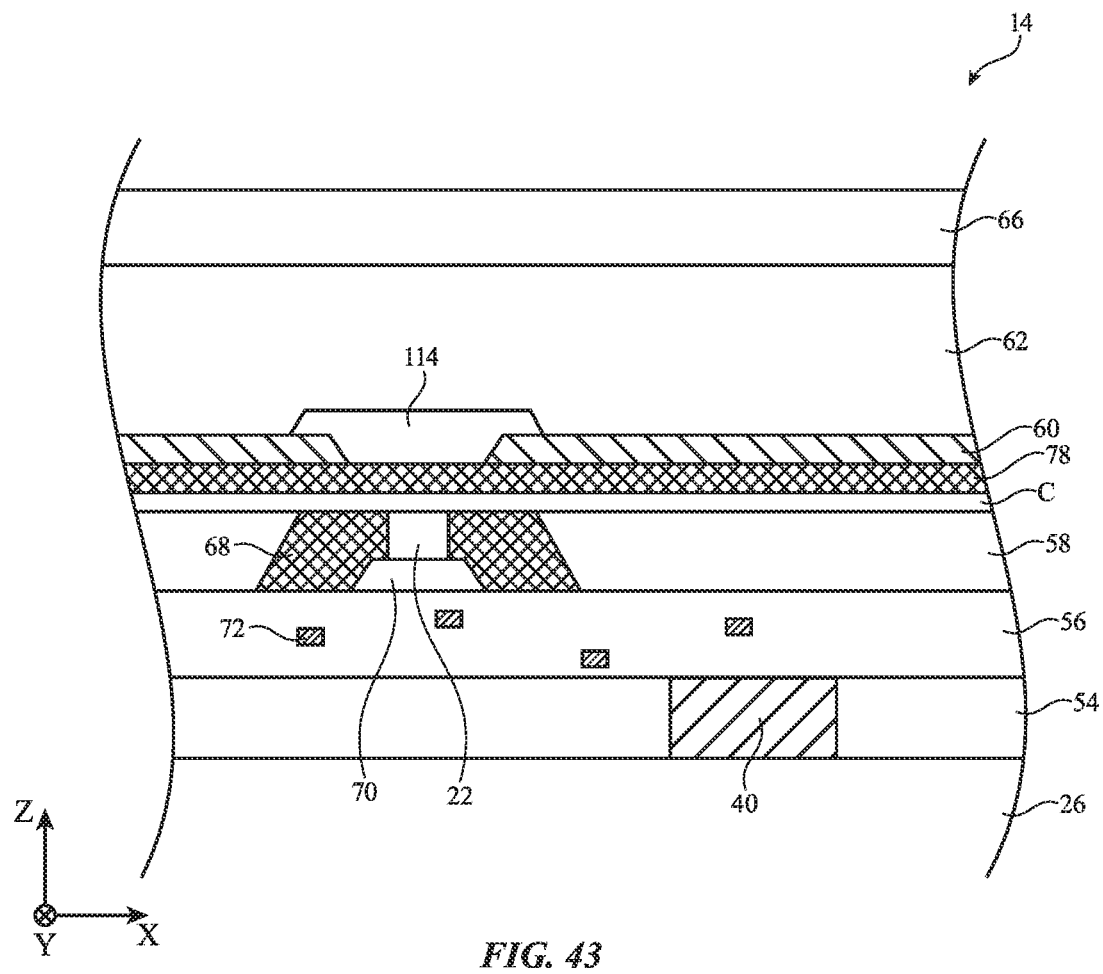
FIG. 43 is a cross-sectional side view of an illustrative polarizer-free display with light-emitting diodes that are overlapped by a blanket top diffuser in accordance with various embodiments.

In FIGS. 33-41, top diffuser 78 is patterned to form a discrete patch over each LED 22. This example is merely illustrative. In any of these arrangements, top diffuser 78 may instead be formed as a blanket layer that is formed across the entire display. FIG. 43 is a cross-sectional side view of an illustrative polarizer-free display with a top diffuser 78. As shown in FIG. 43, diffuser 78 is formed across the width of the display (and overlaps multiple LEDs in the display). Opaque masking layer 60 is formed over top diffuser 78 such that diffuser 78 is interposed between planarization layer 58 and opaque masking layer 60. Color filter layer 114 is formed in an opaque masking layer opening over LED 22 and top diffuser 78.

In FIGS. 33-43, LEDs 22 may emit some light through their sidewalls (e.g., parallel to the XY-plane). Accordingly, diffuser 68 is included to redirect these side-emissions through the opaque masking layer opening to a viewer. This LED arrangement is merely illustrative.

Figure 44:
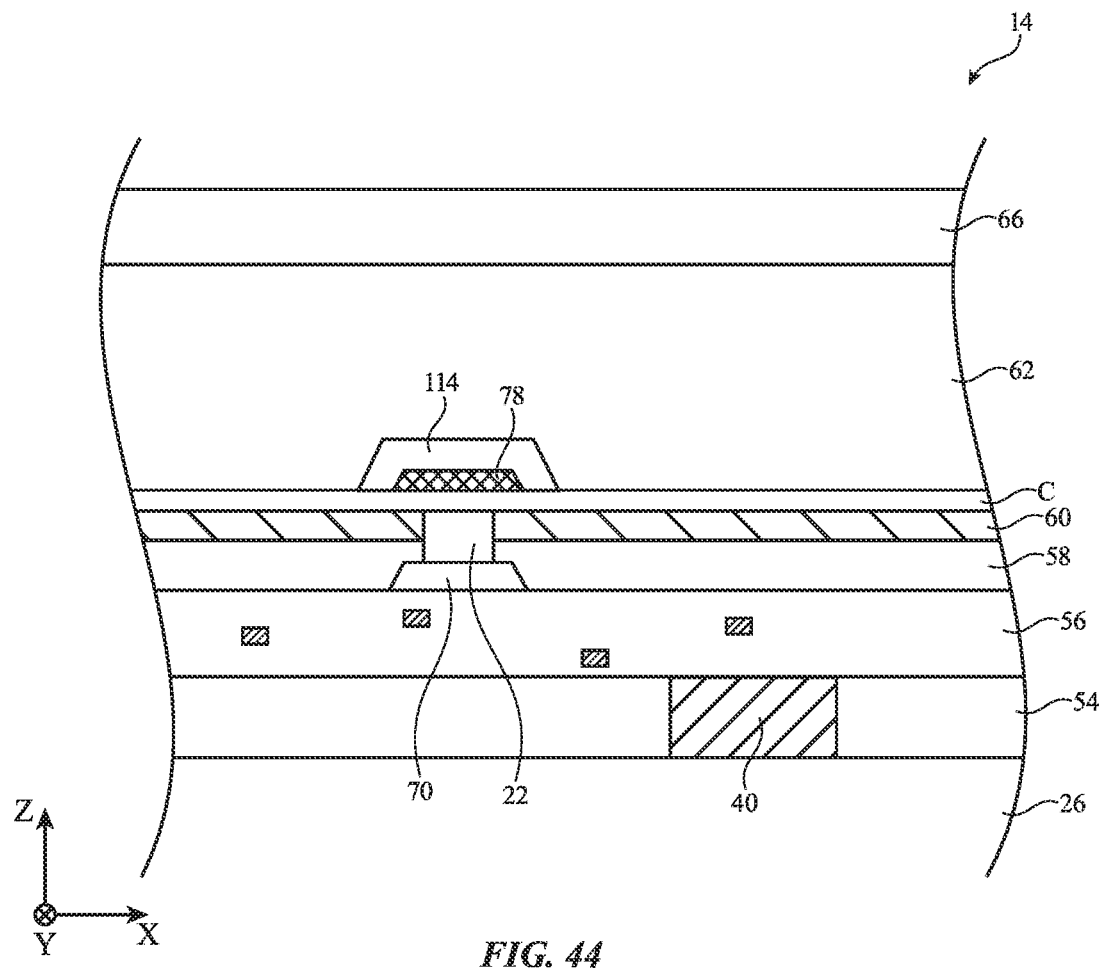
FIG. 44 is a cross-sectional side view of an illustrative polarizer-free display with light-emitting diodes having reflective sidewalls that are overlapped by patterned top diffusers and color filter layers in accordance with various embodiments.

In another possible arrangement, shown in FIG. 44, each LED 22 may have reflective sidewalls. The reflective sidewalls of the LED ensure that all of the LED light is emitted in the positive Z-direction towards a viewer. Accordingly, diffuser 68 from FIGS. 33-43 may be omitted and opaque masking layer 60 may be patterned to conform to the sides of LED 22. As shown in FIG. 44, planarization layer 58 may cover (and laterally surround) spacer layer 70 and optionally some of LED 22. Opaque masking layer 60 is formed on planarization layer 58. Opaque masking layer may directly contact the sidewalls of LED 22. Opaque masking layer 60 may completely laterally surround (e.g., within the XY-plane) LED 22.

With the type of arrangement of FIG. 44, misalignment between LED 22 and an opaque masking layer opening (which may be present in FIGS. 33-43) is mitigated. This may mitigate visible artifacts in the display and improve the ease of manufacturing. The display of FIG. 44 is a polarizer-free display. Accordingly, diffuser 78 and color filter element 114 are formed over LED 22.

The LED arrangement in FIG. 44 (where the LED has reflective sidewalls to prevent side-emissions) may be referred to as a cup on wafer (CoW) LED arrangement. In general, any of the aforementioned display arrangements (e.g., top diffuser arrangements, color filter element arrangements, opaque masking layer arrangements, microlens arrangements, etc.) may be used in a display (either with or without a polarizer) that has cup on wafer LEDs.

In FIG. 44, color filter element 114 may optionally be omitted (so that the LED is overlapped by diffuser 78 but no color filter element). In another possible arrangement, diffuser 78 may optionally be omitted from FIG. 44 (so that the LED is overlapped by color filter element 114 but no diffuser).

In the previous embodiments, the color filter element 114 is formed from a homogenous material that filters light. This example is merely illustrative. In another possible arrangement, shown in FIG. 45, display 14 may include a quantum dot layer 120 with quantum dots 122 over LED 22 (instead of or in addition to a color filter layer). The quantum dot layer 120 includes quantum dots 122 distributed in a host material (e.g., a transparent host material). The quantum dots may be red quantum dots (e.g., that convert blue light to red light) and/or green quantum dots (e.g., that convert blue light to green light). Including a quantum dot layer as in FIG. 45 may allow for LEDs 22 of a single color to be used throughout display 14. For example, blue LEDs may be used throughout display 14, with some of the LEDs selectively covered by red or green quantum dot layers to allow for full color emission.

Figure 45:
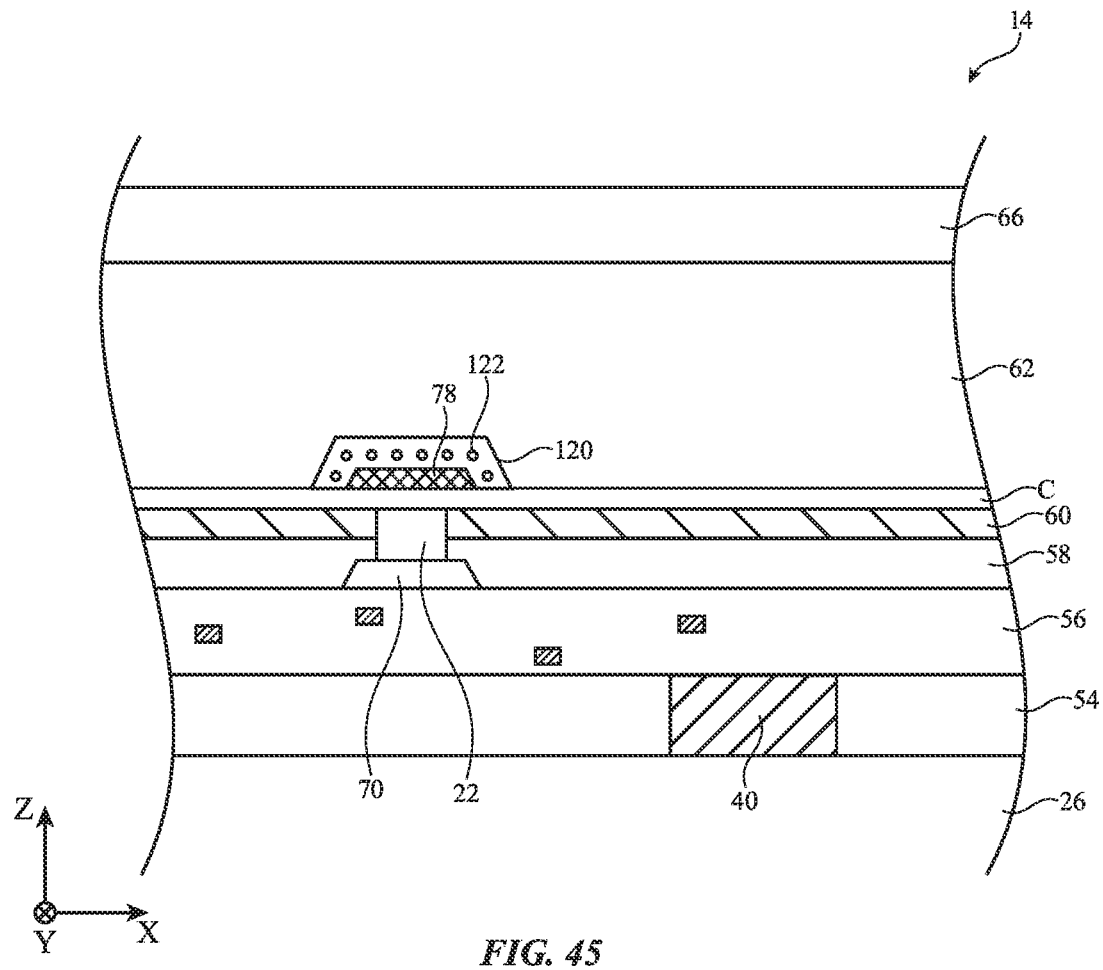
FIG. 45 is a cross-sectional side view of an illustrative polarizer-free display with light-emitting diodes having reflective sidewalls that are overlapped by patterned top diffusers and quantum dot layers in accordance with various embodiments.

In FIG. 45, quantum dot layer 120 conforms to diffuser 78 in a polarizer-free display. This example is merely illustrative. Quantum dot layers may be used in any of the displays herein (with or without a polarizer). Displays with quantum dot layers may also include additional structures (e.g., one or more reflective layers to ensure light generated by the quantum dot layers is directed in the Z-direction towards a viewer).

Figure 46:
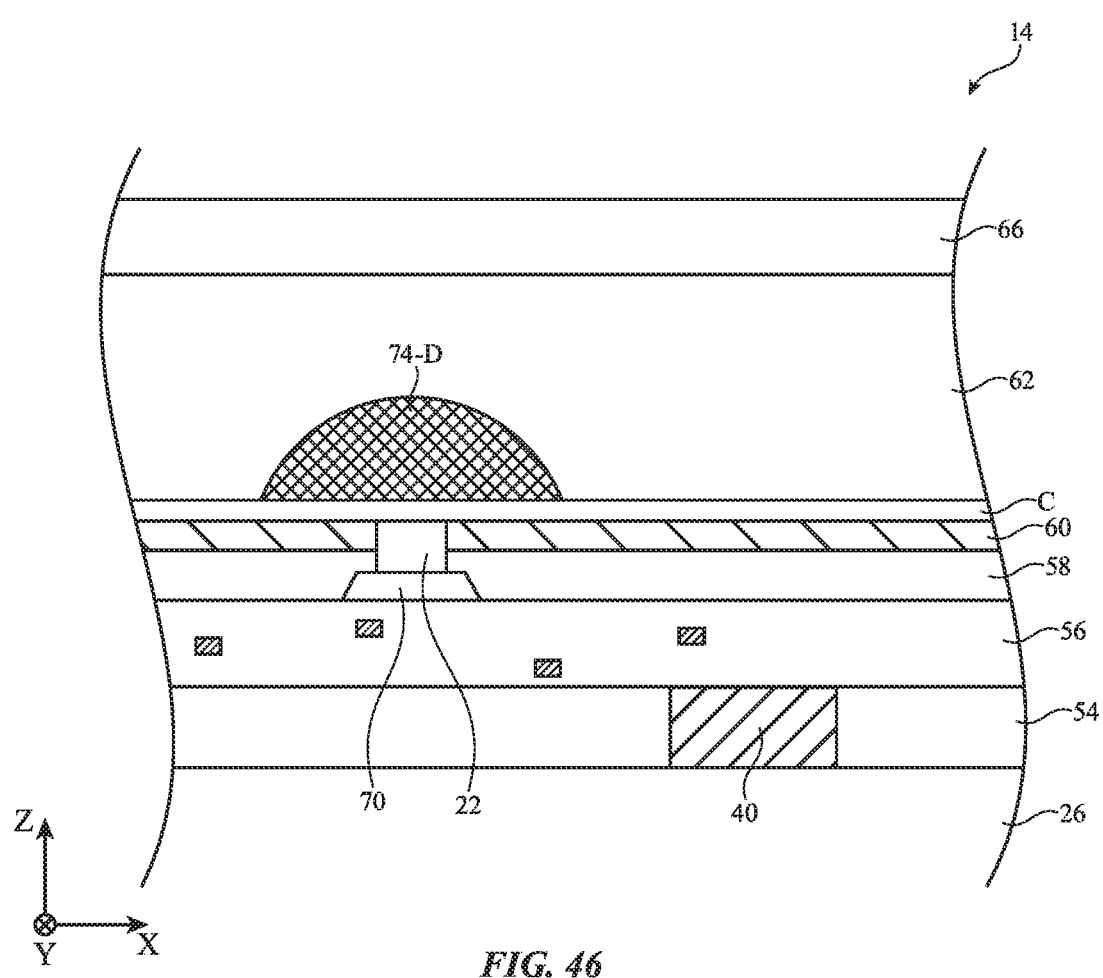
FIG. 46 is a cross-sectional side view of an illustrative polarizer-free display with light-emitting diodes having reflective sidewalls that are overlapped by diffusive microlenses in accordance with various embodiments.

FIG. 46 is a cross-sectional side view of an illustrative polarizer-free display with a diffusing microlens 74-D formed over an LED with reflective sidewalls. Microlens 74-D in FIG. 46 may also have color filtering functionality, allowing both the dedicated color filter element 114 and top diffuser 78 to be omitted. In another possible arrangement, microlens 74-D may serve as a diffusing element when the microlens does not have color filtering functionality (e.g., as in FIG. 40), allowing the top diffuser 78 to be omitted (whereas the color filter layer 114 remains present). Microlens 74-D may be formed from an inorganic material or an organic material. Microlens 74-D may have an index of refraction that is greater than 1.4, greater than 1.5, greater than 1.7, greater than 1.9, greater than 2.0, less than 2.2, less than 2.0 less than 1.8, less than 1.6, etc.).

The example in FIG. 46 of a diffusive microlens with color filtering properties formed over LED 22 is merely illustrative. In another possible arrangement, a diffusive color filter (with a planar upper surface that does not form a microlens) may be formed over LED 22.

Figure 47:
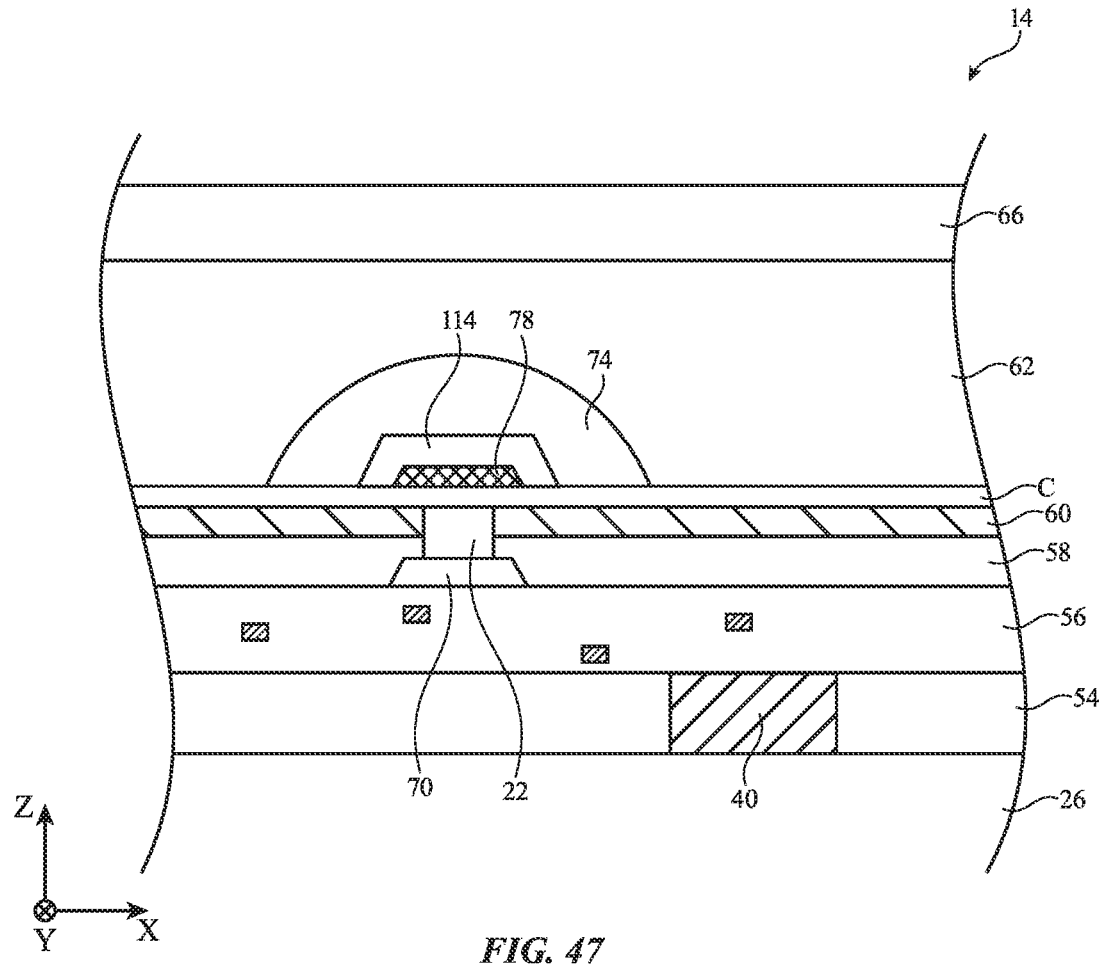
FIG. 47 is a cross-sectional side view of an illustrative polarizer-free display with light-emitting diodes having reflective sidewalls that are overlapped by patterned top diffusers, color filter layers, and microlenses in accordance with various embodiments.
Figure 48:
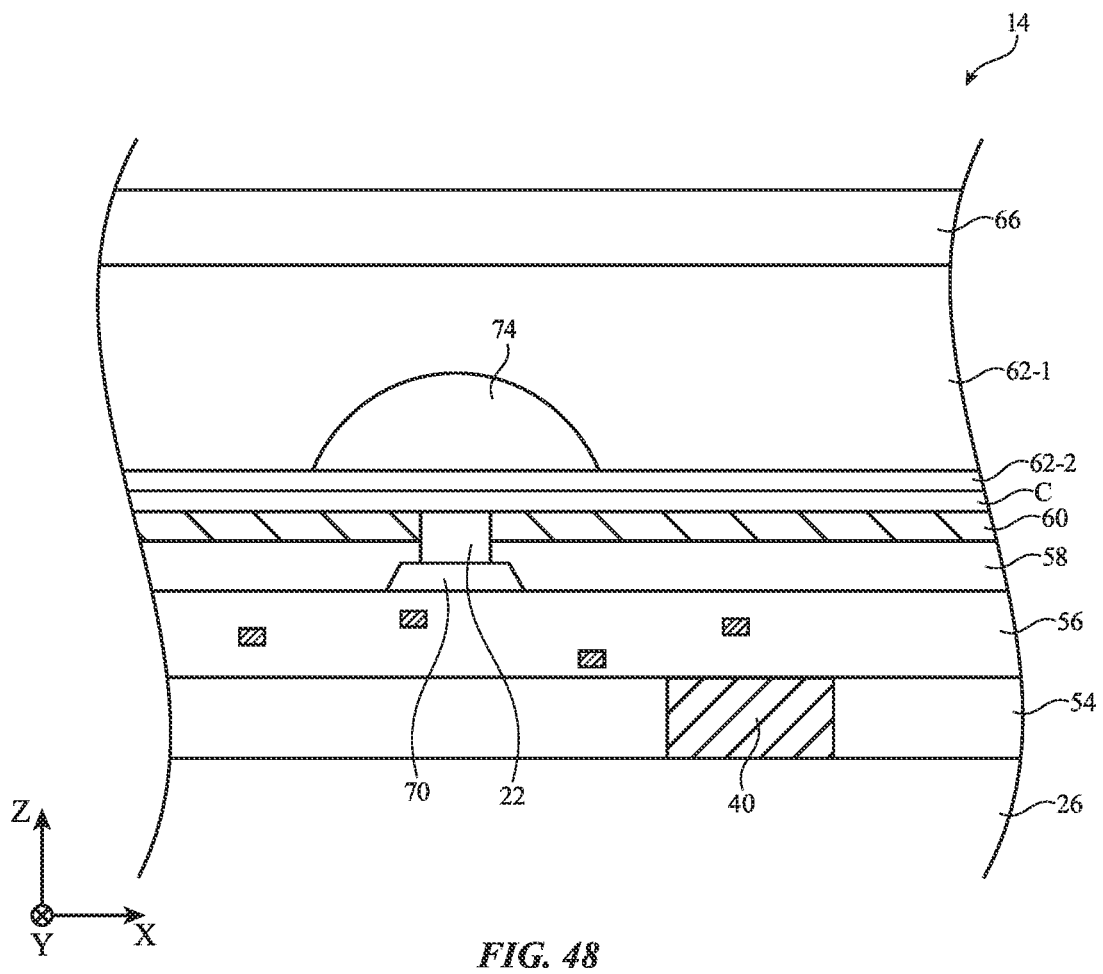
FIG. 48 is a cross-sectional side view of an illustrative polarizer-free display with light-emitting diodes having reflective sidewalls that are overlapped by microlenses in accordance with various embodiments.
Figure 49:
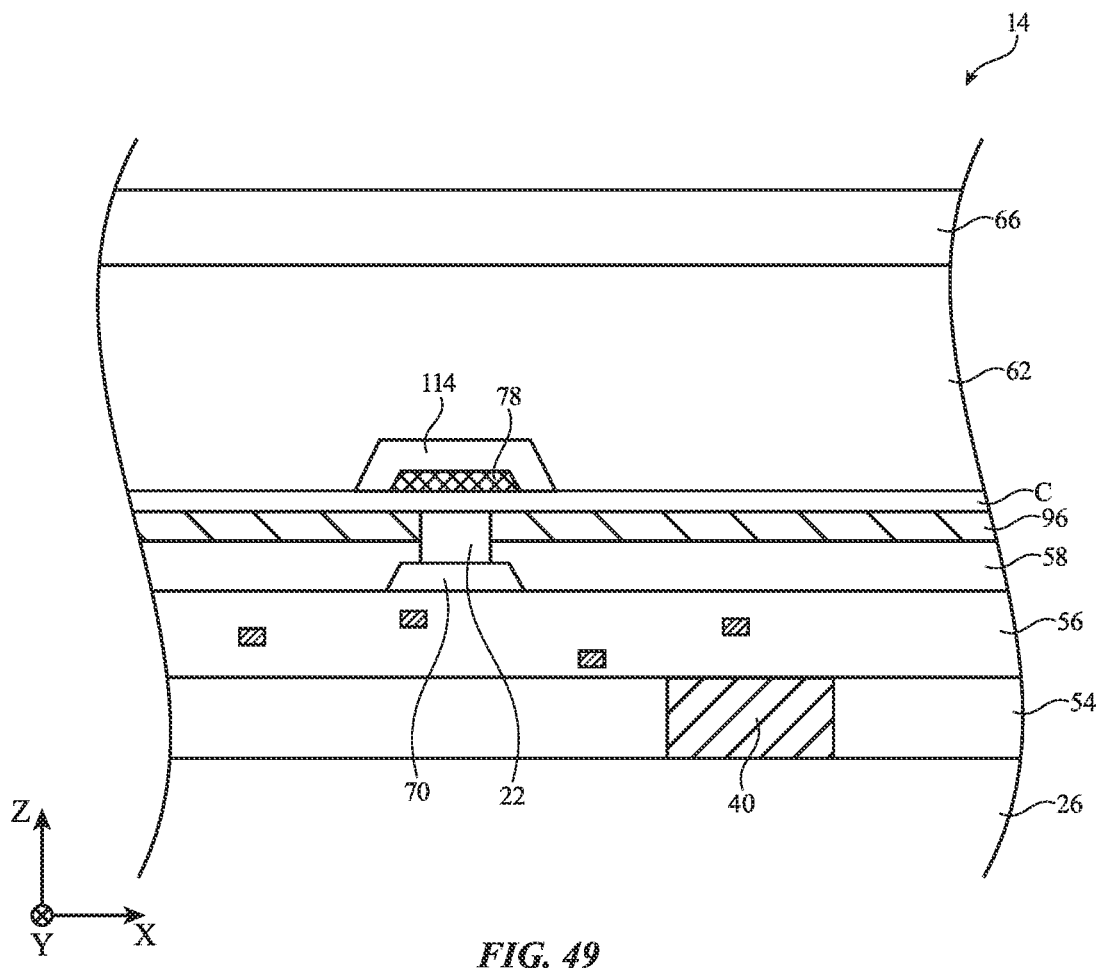
FIG. 49 is a cross-sectional side view of an illustrative polarizer-free display with light-emitting diodes having reflective sidewalls and a phase separated opaque masking layer in accordance with various embodiments.
Figure 50:
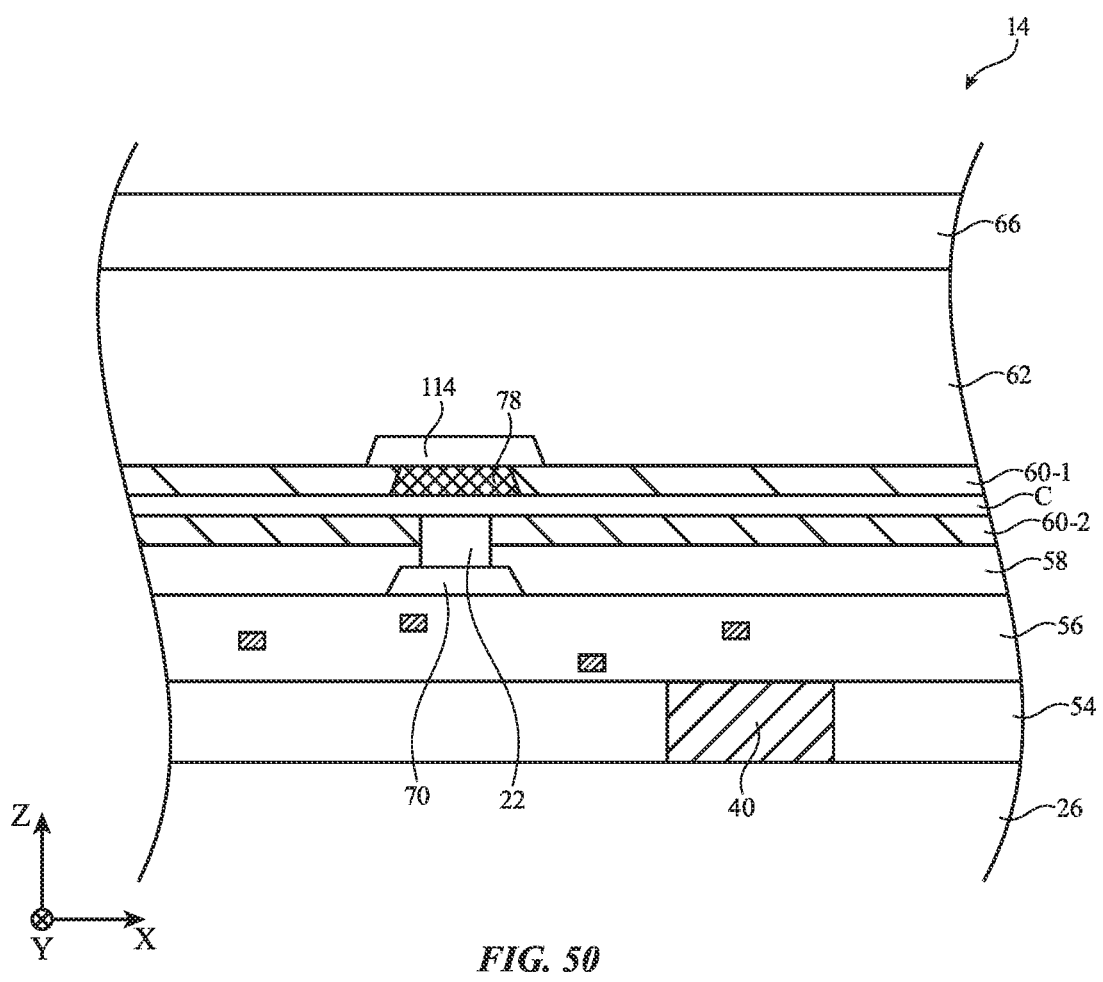
FIG. 50 is a cross-sectional side view of an illustrative polarizer-free display with light-emitting diodes having reflective sidewalls and a first and second opaque masking layers having different properties in accordance with various embodiments.

Other arrangements for overlying components may be used in displays with LEDs 22 having reflective sidewalls. In FIG. 47, diffuser 78, color filter element 114, and microlens 74 overlap LED 22. Microlens 74 may be formed from an inorganic material or an organic material. Microlens 74 may have an index of refraction that is greater than 1.4, greater than 1.5, greater than 1.7, greater than 1.9, greater than 2.0, less than 2.2, less than 2.0 less than 1.8, less than 1.6, etc.). In FIG. 48, planarization layer 62 is split into first and second layers 62-1 and 62-2, with a microlens 74 being formed on an upper surface of layer 62-2 (e.g., similar to as shown in FIG. 39). In FIG. 49, a phase separated opaque masking layer 96 (as shown and discussed in connection with FIG. 23) is used. In FIG. 50, opaque masking layer 60 is split into first and second opaque masking layers 60-1 and 60-2 (as shown and discussed in connection with FIG. 20). In FIG. 50, cathode line C is formed between opaque masking layers 60-1 and 60-2 and diffuser 78 is formed in an opening in opaque masking layer 60-1 (while LED 22 is formed in an opening in opaque masking layer 60-2). This example is merely illustrative. Cathode line C may instead be formed below both opaque masking layers 60-1 and 60-2, as one possible alternative.

In some electronic devices, it may be desirable for an optical sensor such as an ambient light sensor or camera to operate through polarizer-free display 14. In other words, the optical sensor is positioned within the active area of polarizer-free display 14. Ambient light may pass through the display stack (that includes LEDs 22) to reach the sensor. The absence of the polarizer in the polarizer-free display may allow more ambient light to reach the sensor.

Figure 51:
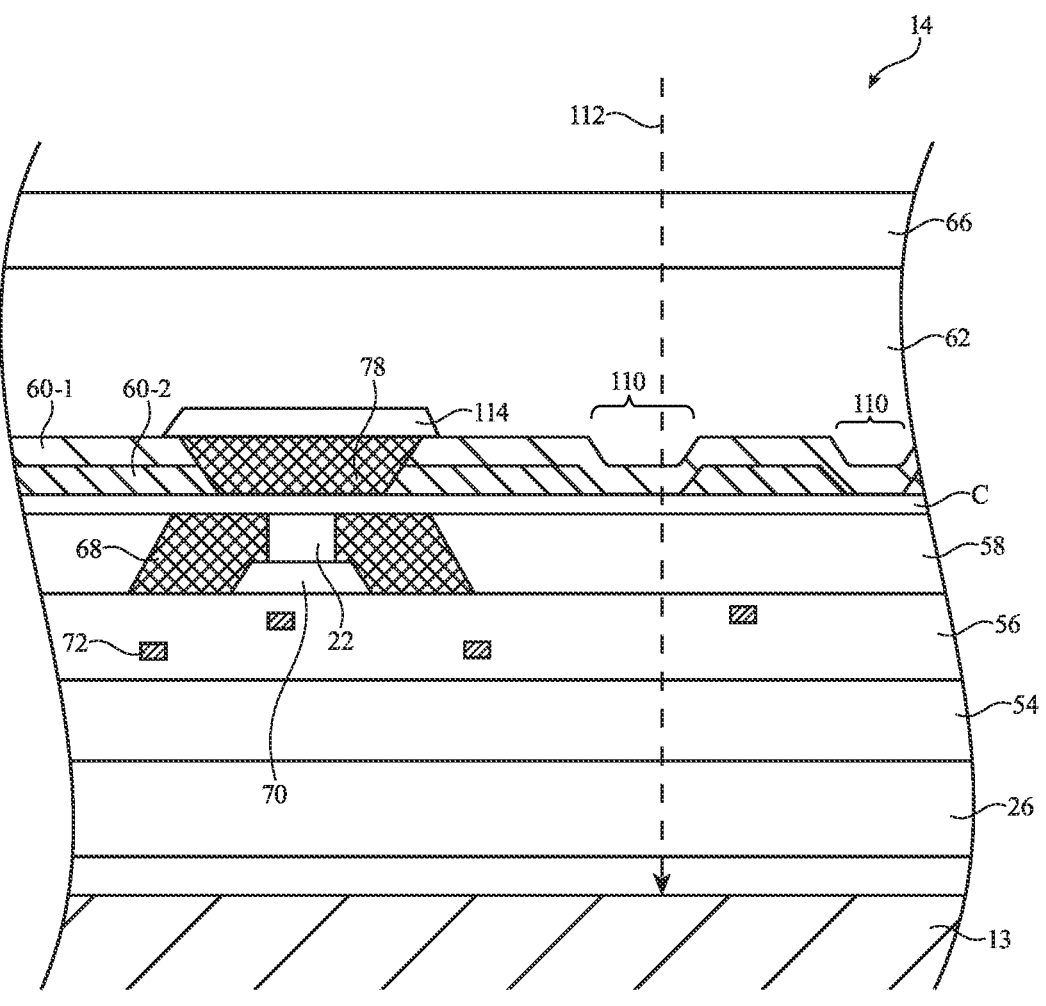
FIG. 51 is a cross-sectional side view of an illustrative polarizer-free display with light-emitting diodes and first and second opaque masking layers formed over a sensor in accordance with various embodiments.

FIG. 51 is a cross-sectional side view of a polarizer-free display that overlaps a sensor. In this example, two opaque masking layers 60-1 and 60-2 are used (as discussed in detail in connection with FIG. 21). When this type of opaque masking layer is formed over sensor 13, openings 110 may be formed in opaque masking layer 60-2 (with the higher opacity) but not in opaque masking layer 60-1 (with the lower opacity). As shown in FIG. 51, opaque masking layer 60-1 is formed in the openings 110 in opaque masking layer 60-2. Selectively removing portions of opaque masking layer 60-2 in openings 110 allows for more ambient light 112 to reach sensor 13.

As shown in FIG. 51, diffuser 78 may be formed in openings in opaque masking layers 60-1 and 60-2 over LED 22. Color filter layer 114 is then formed on the upper surface of top diffuser 78 and opaque masking layer 60-1 over LED 22.

Openings 110 may be positioned to overlap portions of the display stack with the highest transmission (e.g., portions with the least backplane metal 72). Openings 110 may be positioned over portions of insulating layers 56 with the lowest density of backplane metal 72. Without the opaque masking layer blocking the ambient light (e.g., in opening regions 110), the amount of ambient light that reaches sensor 13 is much greater. The LEDs and openings in FIG. 51 may be arranged with footprints as shown in FIG. 29, for example.

Figure 30:
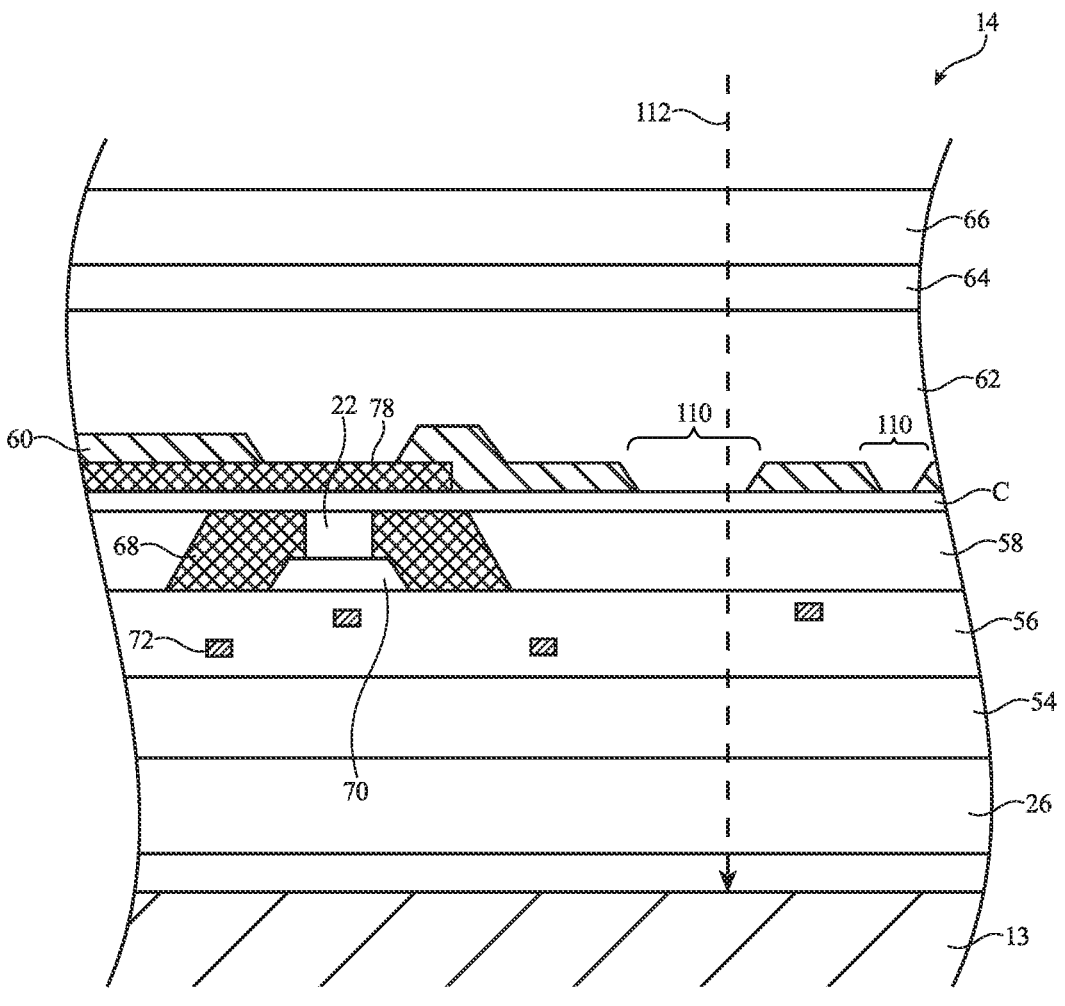
FIG. 30 is a cross-sectional side view of an illustrative display with a polarizer, light-emitting diodes, an opaque masking layer with openings that overlap a sensor, and a top diffuser with portions removed between the sensor and openings in accordance with various embodiments.

In the arrangement of FIG. 51, top diffuser 78 is patterned to form a patch over LED 22. This example is merely illustrative. In an alternate arrangement (e.g., similar to as shown in FIG. 30), the diffuser is formed as a blanket layer across the display with selectively removed portions between light sensor 13 and openings 110. In general, for any of the arrangements discussed herein, a blanket diffuser layer (with optional removal over a sensor) may be used instead of the patterned top diffuser(s) shown in FIG. 51.

Figure 52:
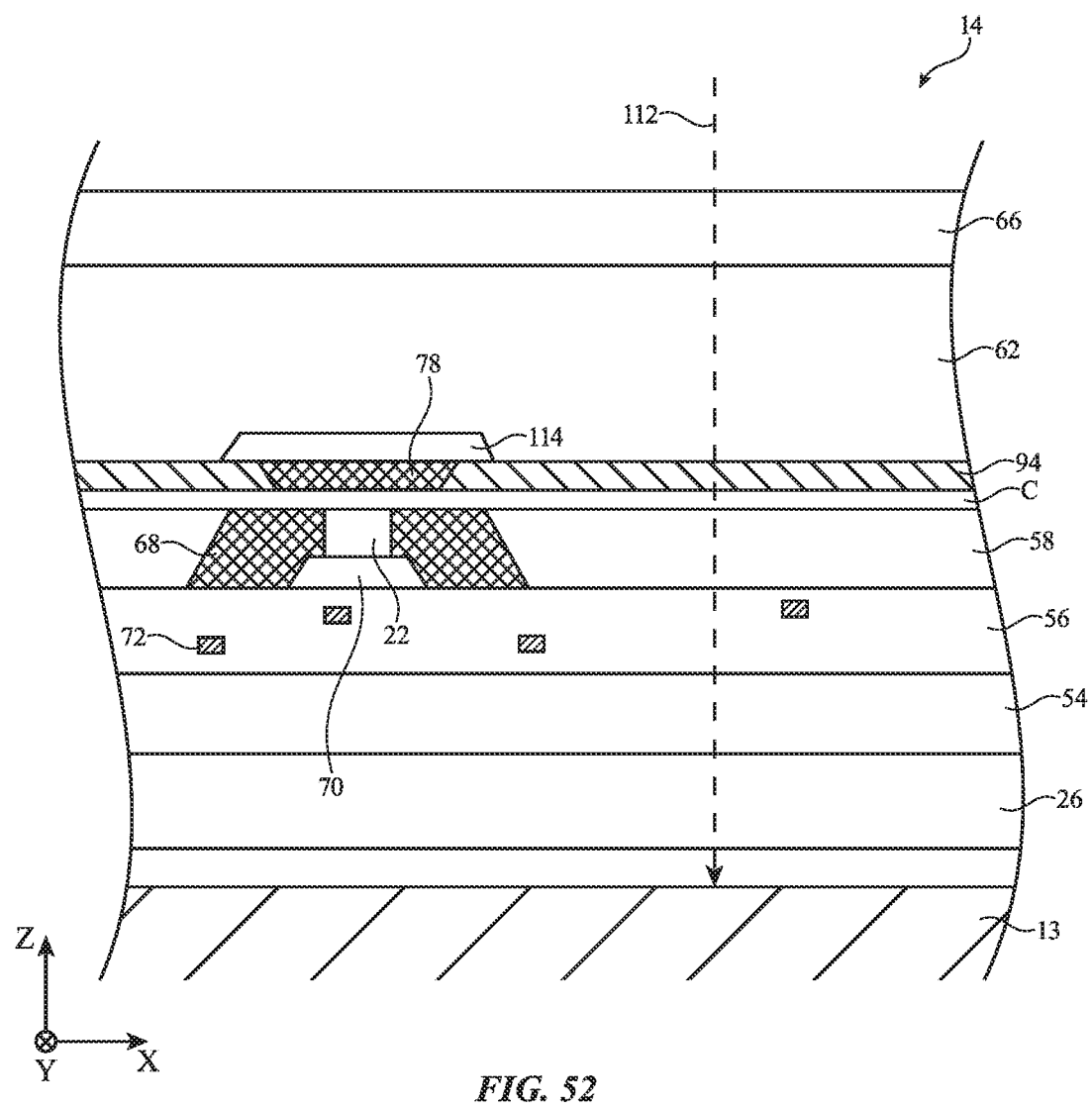
FIG. 52 is a cross-sectional side view of an illustrative polarizer-free display with light-emitting diodes and a low-optical-density opaque masking layer formed over a sensor in accordance with various embodiments.

FIG. 52 is a cross-sectional side view of another arrangement for a polarizer-free display that overlaps a sensor. In this example, a low-optical-density opaque masking layer 94 (e.g., of the type shown and discussed in connection with FIG. 22) is formed between planarization layers 62 and 58. Opaque masking layer 94 may have an index of refraction that is similar to the index of refraction of planarization layer 62. For example, the difference between the indices of refraction of opaque masking layer 94 and layer 62 may be less than 0.3, less than 0.2, less than 0.1, less than 0.05, less than 0.03, less than 0.01, etc. The total transmission of opaque masking layer 94 may be more than 5%, more than 15%, more than 25%, more than 40%, more than 50%, more than 70%, etc. The total thickness of layer 94 may be greater than 1 micron, greater than 2 microns, greater than 3 microns, greater than 4 microns, etc. The opacity of low-optical-density opaque masking layer 94 in FIG. 52 may be sufficiently low to allow ambient light 112 to pass through the display stack to sensor 13. Therefore, openings 110 (from FIG. 51) are not required in low-optical-density opaque masking layer 94. Color filter layer 114 in FIG. 52 is formed on an upper surface of top diffuser 78 and low-optical-density opaque masking layer 94.

Figure 53:
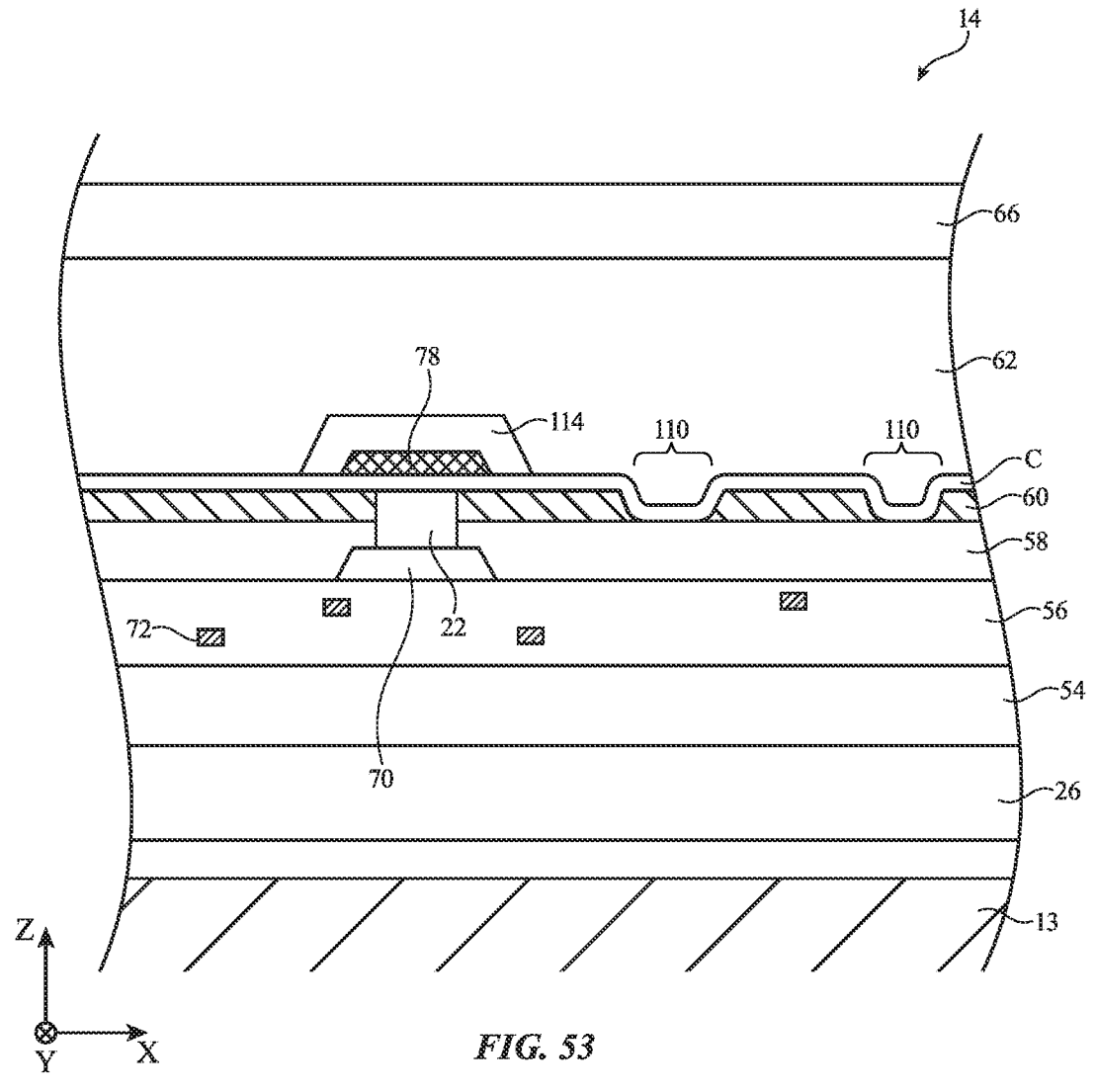
FIG. 53 is a cross-sectional side view of an illustrative polarizer-free display with light-emitting diodes having reflective sidewalls and an opaque masking layer with openings formed over a sensor in accordance with various embodiments.

FIGS. 53-56 show additional illustrative arrangements for polarizer-free displays that overlap an optical sensor. In each one of FIGS. 53-56, LEDs 22 may have reflective sidewalls (in a cup on wafer arrangement). In the example of FIG. 53, openings 110 are formed in opaque masking layer 60 over sensor 13. Openings 110 may be positioned over portions of insulating layers 56 with the lowest density of backplane metal 72. Without the opaque masking layer blocking the ambient light (e.g., in opening regions 110), the amount of ambient light that reaches sensor 13 is much greater. In the example of FIG. 53, cathode line C is formed over opaque masking layer 60 and is formed in openings 110. Diffuser 78 is formed on cathode line C over LED 22. Color filter layer 114 conforms to diffuser 78 and overlaps diffuser 78 and LED 22.

Figure 54:
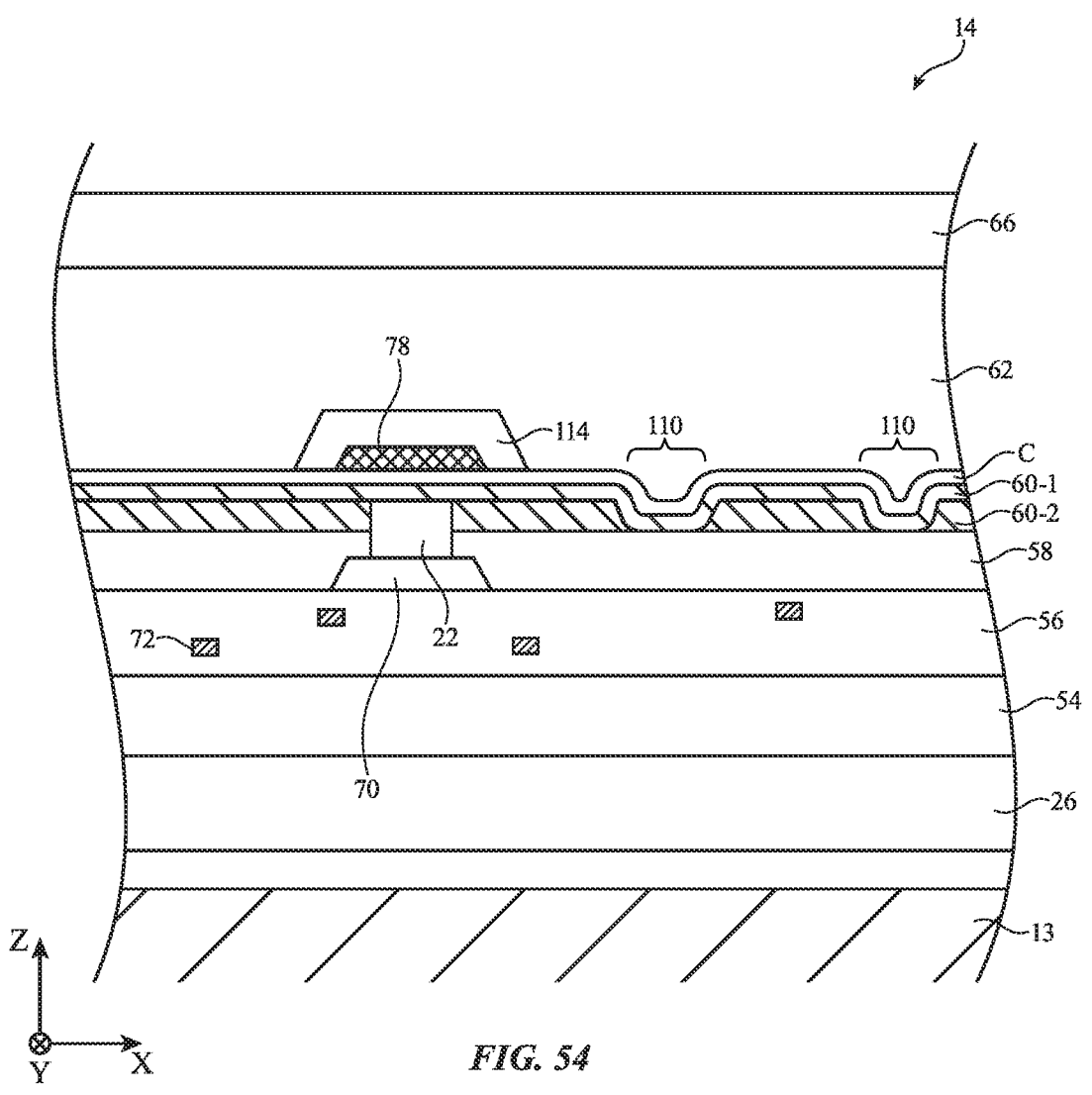
FIG. 54 is a cross-sectional side view of an illustrative polarizer-free display with light-emitting diodes having reflective sidewalls and first and second opaque masking layers formed over a sensor in accordance with various embodiments.
Figure 55:
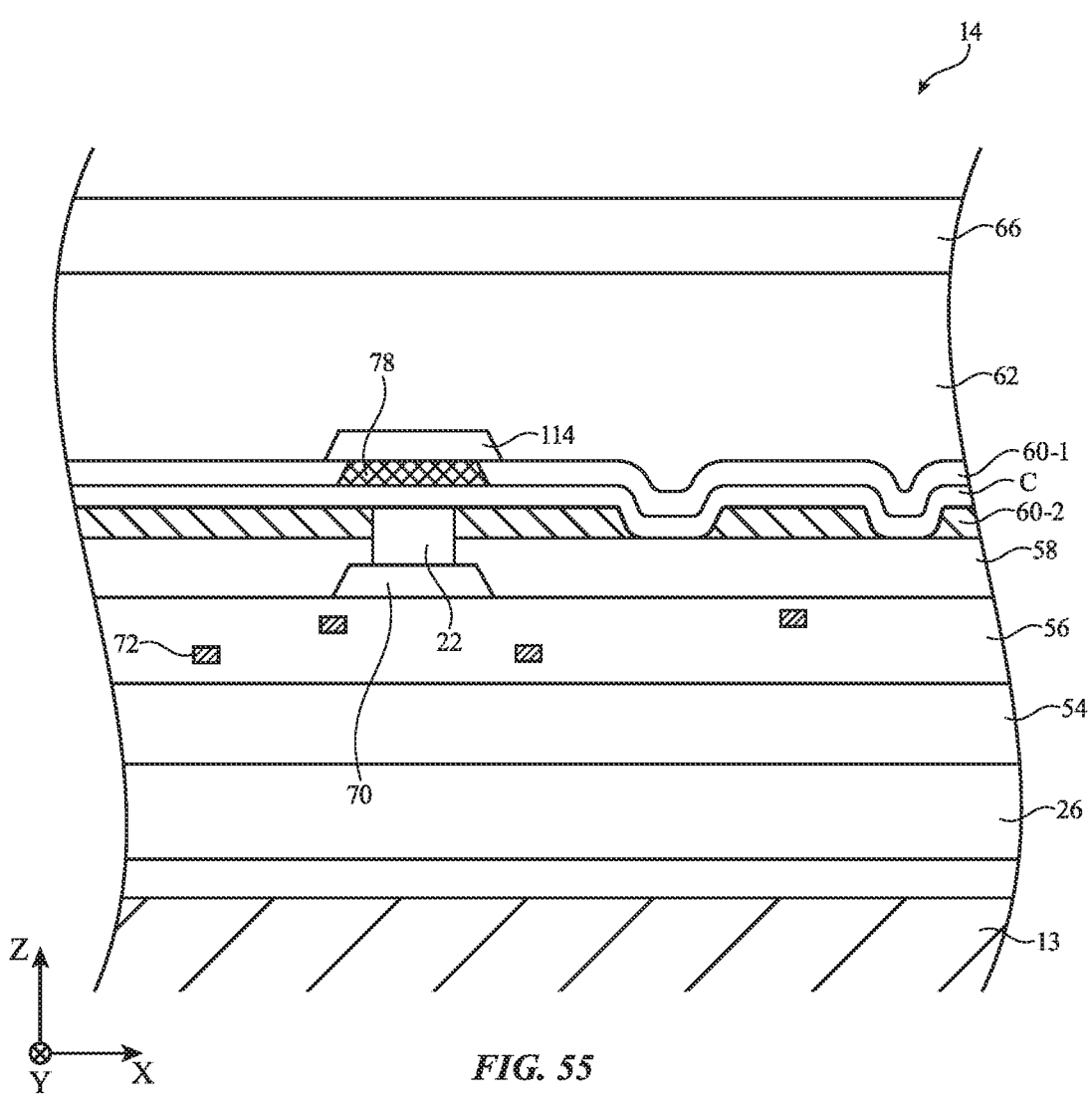
FIG. 55 is a cross-sectional side view of an illustrative polarizer-free display with light-emitting diodes having reflective sidewalls, first and second opaque masking layers formed over a sensor, and a cathode line formed between the first and second opaque masking layers in accordance with various embodiments.

In FIGS. 54 and 55, the opaque masking layer is split into first and second layers 60-1 and 60-2 (as discussed in detail in connection with FIG. 21). When this type of opaque masking layer is formed over sensor 13, openings 110 may be formed in opaque masking layer 60-2 (with the higher opacity) but not in opaque masking layer 60-1 (with the lower opacity). As shown in FIG. 54, opaque masking layer 60-1 is formed in the openings 110 in opaque masking layer 60-2. Selectively removing portions of opaque masking layer 60-2 in openings 110 allows for more ambient light 112 to reach sensor 13.

In FIG. 54, cathode line C is formed over both opaque masking layers 60-1 and 60-2. Accordingly, cathode line C is interposed between LED 22 and top diffuser 78. Cathode line C overlaps opaque masking layer 60-1 over openings 110. In another possible arrangement, shown in FIG. 55, cathode line C is formed between opaque masking layers 60-1 and 60-2. With this arrangement, LED 22 is laterally surrounded by opaque masking layer 60-2 but not opaque masking layer 60-1. Cathode line C is interposed between LED 22 and diffuser 78. Top diffuser 78 is formed in an opening in opaque masking layer 60-1 over LED 22. Top diffuser 78 is laterally surrounded by opaque masking layer 60-1 but not opaque masking layer 60-2 (within a common plane). Color filter layer 114 is formed on the upper surface of top diffuser 78 and opaque masking layer 60-1.

Figure 56:
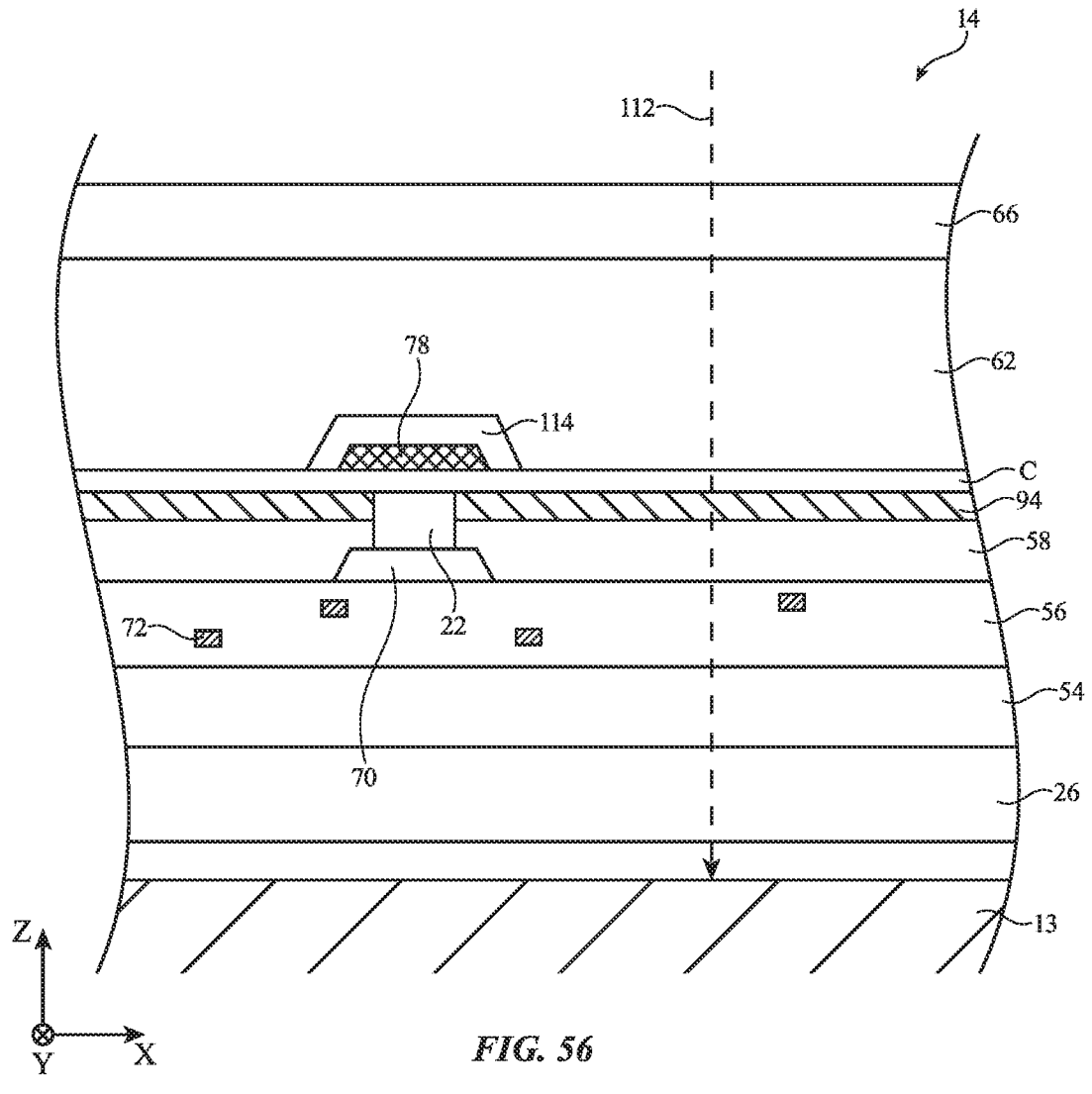
FIG. 56 is a cross-sectional side view of an illustrative polarizer-free display with light-emitting diodes having reflective sidewalls and a low-optical-density opaque masking layer formed over a sensor in accordance with various embodiments.

FIG. 56 is a cross-sectional side view of another arrangement for a polarizer-free display with LEDs having reflective sidewalls. In this example, a low-optical-density opaque masking layer 94 (e.g., of the type shown and discussed in connection with FIG. 22) is formed between planarization layers 62 and 58. Opaque masking layer 94 may have an index of refraction that is similar to the index of refraction of planarization layer 62. For example, the difference between the indices of refraction of opaque masking layer 94 and layer 62 may be less than 0.3, less than 0.2, less than 0.1, less than 0.05, less than 0.03, less than 0.01, etc. The total transmission of opaque masking layer 94 may be more than 5%, more than 15%, more than 25%, more than 40%, more than 50%, more than 70%, etc. The total thickness of layer 94 may be greater than 1 micron, greater than 2 microns, greater than 3 microns, greater than 4 microns, etc. The opacity of low-optical-density opaque masking layer 94 in FIG. 56 may be sufficiently low to allow ambient light 112 to pass through the display stack to sensor 13. Therefore, openings 110 (e.g., from FIG. 53) are not required in low-optical-density opaque masking layer 94. Cathode line C in FIG. 56 is formed on an upper surface of LED 22 and low-optical-density opaque masking layer 94. Top diffuser

78 is formed over LED 22 on cathode line C. Color filter layer 114 conforms to top diffuser 78 and overlaps LED 22.

It is reiterated that each one of the structures/arrangements described herein may be used in a single display in any desired combination.

In some displays, each color LED may have the same arrangement (e.g., the arrangement of opaque masking layer, top diffuser, microlens, color filter layer, etc.). In another possible embodiment, different color LEDs may have different arrangements. For example, green LEDs in a display may be overlapped by respective microlenses whereas red and blue LEDs are not overlapped by microlenses. In general, LEDs of each color may have any of the arrangements described herein.

The foregoing is merely illustrative and various modifications can be made by those skilled in the art without departing from the scope and spirit of the described embodiments. The foregoing embodiments may be implemented individually or in any combination.

The invention claimed is:

1. An electronic device, comprising:
   an array of inorganic light-emitting diodes;
   a display cover layer that overlaps the array of inorganic light-emitting diodes, wherein no polarizer layer overlaps the array of inorganic light-emitting diodes;
   a plurality of first diffusers, wherein each first diffuser laterally surrounds at least one respective inorganic light-emitting diode;
   a plurality of second diffusers, wherein each second diffuser overlaps at least one respective inorganic light-emitting diode; and
   a conductive layer interposed between at least one first diffuser of the plurality of first diffusers and at least one second diffuser of the plurality of second diffusers.

2. The electronic device defined in claim 1, further comprising:
   an opaque masking layer with openings that overlap the inorganic light-emitting diodes, wherein the array of inorganic light-emitting diodes includes pairs of inorganic light-emitting diodes of a same color.

3. The electronic device defined in claim 2, wherein each opening in the opaque masking layer overlaps a respective pair of inorganic light-emitting diodes.

4. The electronic device defined in claim 3, further comprising:
   a plurality of color filter layers, wherein each color filter layer overlaps a respective pair of inorganic light-emitting diodes and wherein each second diffuser overlaps a respective pair of inorganic light-emitting diodes.

5. The electronic device defined in claim 2, wherein each opening in the opaque masking layer overlaps one but not both of the inorganic light-emitting diodes in a respective pair of inorganic light-emitting diodes.

6. The electronic device defined in claim 5, wherein each second diffuser overlaps one but not both of the inorganic light-emitting diodes in a respective pair of inorganic light-emitting diodes.

7. The electronic device defined in claim 6, further comprising:
   a plurality of color filter layers, wherein each color filter layer overlaps one but not both of the inorganic light-emitting diodes in a respective pair of inorganic light-emitting diodes.

8. The electronic device defined in claim 6, further comprising:

a plurality of color filter layers, wherein each color filter layer overlaps both of the inorganic light-emitting diodes in a respective pair of inorganic light-emitting diodes.

9. The electronic device defined in claim 2, wherein each first diffuser laterally surrounds a periphery of a respective pair of inorganic light-emitting diodes and wherein each first diffuser includes a portion that is interposed between the respective pair of inorganic light-emitting diodes.

10. The electronic device defined in claim 1, further comprising:

a first opaque masking layer; and a second opaque masking layer that is formed on the first opaque masking layer and that has at least one differing property from the first opaque masking layer.

11. The electronic device defined in claim 10, wherein the second opaque masking layer has a different refractive index than the first opaque masking layer and a different transmission than the first opaque masking layer.

12. The electronic device defined in claim 1, further comprising:

a plurality of color filter elements, wherein each color filter element overlaps at least one respective inorganic light-emitting diode and at least one second diffuser.

13. The electronic device defined in claim 1, further comprising:

a plurality of color filtering microlenses, wherein each color filtering microlens overlaps a respective inorganic light-emitting diode.

14. The electronic device defined in claim 1, wherein the conductive layer comprises a cathode line and wherein at least one inorganic light-emitting diode of the array of inorganic light-emitting diodes is coupled to the cathode line.

15. The electronic device defined in claim 1, wherein the second diffusers comprise diffusive microlenses.

16. The electronic device defined in claim 1, further comprising:

an optical sensor that is overlapped by at least a portion of the array of inorganic light-emitting diodes.

17. An electronic device, comprising:

an array of inorganic light-emitting diodes, wherein each inorganic light-emitting diode has reflective sidewalls;

a display cover layer that overlaps the array of inorganic light-emitting diodes, wherein no polarizer layer overlaps the array of inorganic light-emitting diodes;

a plurality of diffusers, wherein each diffuser overlaps at least one respective inorganic light-emitting diode;

a plurality of color filter elements, wherein each color filter element overlaps at least one respective inorganic light-emitting diode and at least one diffuser; and an opaque masking layer with openings that overlap the inorganic light-emitting diodes, wherein the opaque masking layer is in direct contact with the reflective sidewalls of at least one inorganic light-emitting diode of the array of inorganic light-emitting diodes.

18. The electronic device defined in claim 17, further comprising a plurality of microlenses, wherein each microlens overlaps at least one respective inorganic light-emitting diode.

19. The electronic device defined in claim 17, further comprising:

a planarization layer overlapping the array of inorganic light-emitting diodes, wherein the opaque masking layer is interposed between the planarization layer and at least one diffuser of the plurality of diffusers.

20. The electronic device defined in claim 17, further comprising:

an optical sensor that is overlapped by at least a portion of the array of inorganic light-emitting diodes.

* * * * *